(12) United States Patent  
Shionoiri et al.

(10) Patent No.: US 11,424,246 B2  
(45) Date of Patent: Aug. 23, 2022

(54) MEMORY DEVICE AND SEMICONDUCTOR DEVICE

(71) Applicant: Semiconductor Energy Laboratory Co., Ltd., Atsugi (JP)

(72) Inventors: Yutaka Shionoiri, Isehara (JP); Hiroyuki Miyake, Atsugi (JP); Kiyoshi Kato, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 106 days.

(21) Appl. No.: 17/061,920

(22) Filed: Oct. 2, 2020

(65) Prior Publication Data

US 2021/0167067 A1  Jun. 3, 2021

Related U.S. Application Data

(63) Continuation of application No. 15/292,362, filed on Oct. 13, 2016, now Pat. No. 10,797,054, which is a continuation of application No. 12/976,340, filed on Dec. 22, 2010, now Pat. No. 9,472,559.

(30) Foreign Application Priority Data

Dec. 28, 2009  (JP) .................................. 2009-297140

(51) Int. Cl.
*H01L 21/00* (2006.01)
*H01L 21/84* (2006.01)
(Continued)

(52) U.S. Cl.
CPC ........ *H01L 27/1052* (2013.01); *H01L 27/115* (2013.01); *H01L 27/1156* (2013.01);
(Continued)

(58) Field of Classification Search
CPC ............... H01L 27/1052; H01L 27/115; H01L 27/1156; H01L 27/1225; H01L 27/124;
(Continued)

(56) References Cited

U.S. PATENT DOCUMENTS 4,466,081 A  8/1984  Masuoka
5,220,530 A  6/1993  Itoh
(Continued)

FOREIGN PATENT DOCUMENTS

CN  001897284 A  1/2007
CN  101252134 A  8/2008
(Continued)

OTHER PUBLICATIONS

International Search Report (Application No. PCT/JP2010/072068) dated Mar. 22, 2011.
(Continued)

*Primary Examiner* — Meiya Li
(74) *Attorney, Agent, or Firm* — Robinson Intellectual Property Law Office; Eric J. Robinson

(57) ABSTRACT

It is an object to provide a memory device whose power consumption can be suppressed and a semiconductor device including the memory device. As a switching element for holding electric charge accumulated in a transistor which functions as a memory element, a transistor including an oxide semiconductor film as an active layer is provided for each memory cell in the memory device. The transistor which is used as a memory element has a first gate electrode, a second gate electrode, a semiconductor film located between the first gate electrode and the second gate electrode, a first insulating film located between the first gate electrode and the semiconductor film, a second insulating film located between the second gate electrode and the semiconductor film, and a source electrode and a drain electrode in contact with the semiconductor film.

4 Claims, 21 Drawing Sheets

(51) Int. Cl.
  *H01L 27/105* (2006.01)
  *H01L 27/1156* (2017.01)
  *H01L 27/12* (2006.01)
  *H01L 27/13* (2006.01)
  *H01L 27/115* (2017.01)
  *H01L 29/786* (2006.01)
  *G11C 16/04* (2006.01)

(52) U.S. Cl.
  CPC ........ *H01L 27/124* (2013.01); *H01L 27/1225* (2013.01); *H01L 27/1251* (2013.01); *H01L 27/1255* (2013.01); *H01L 27/13* (2013.01); *H01L 29/7869* (2013.01); *H01L 29/78648* (2013.01); *G11C 16/0433* (2013.01)

(58) Field of Classification Search
  CPC . H01L 27/1251; H01L 27/1255; H01L 27/13; H01L 29/78648; H01L 29/7869
  See application file for complete search history.

(56) References Cited

U.S. PATENT DOCUMENTS

| | | |
|---|---|---|
| 5,349,366 A | 9/1994 | Yamazaki et al. |
| 5,428,238 A | 6/1995 | Hayashi et al. |
| 5,506,436 A | 4/1996 | Hayashi et al. |
| 5,576,571 A | 11/1996 | Hayashi et al. |
| 5,578,852 A | 11/1996 | Hayashi et al. |
| 5,578,853 A | 11/1996 | Hayashi et al. |
| 5,581,106 A | 12/1996 | Hayashi et al. |
| 5,731,856 A | 3/1998 | Kim et al. |
| 5,744,864 A | 4/1998 | Cillessen et al. |
| 6,127,702 A | 10/2000 | Yamazaki et al. |
| 6,169,286 B1 | 1/2001 | Singh |
| 6,294,274 B1 | 9/2001 | Kawazoe et al. |
| 6,314,017 B1 | 11/2001 | Emori et al. |
| 6,563,174 B2 | 5/2003 | Kawasaki et al. |
| 6,727,522 B1 | 4/2004 | Kawasaki et al. |
| 6,740,938 B2 | 5/2004 | Tsunoda et al. |
| 6,778,424 B2 | 8/2004 | Iwata et al. |
| 6,962,003 B2 | 11/2005 | Takemori et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,200,050 B2 | 4/2007 | Kato |
| 7,211,825 B2 | 5/2007 | Shih et al. |
| 7,211,867 B2 | 5/2007 | Hayashi et al. |
| 7,230,601 B2 | 6/2007 | Yamazaki et al. |
| 7,282,782 B2 | 10/2007 | Hoffman et al. |
| 7,297,977 B2 | 11/2007 | Hoffman et al. |
| 7,317,205 B2 | 1/2008 | Yamazaki et al. |
| 7,323,356 B2 | 1/2008 | Hosono et al. |
| 7,385,224 B2 | 6/2008 | Ishii et al. |
| 7,385,436 B2 | 6/2008 | Itoh et al. |
| 7,402,506 B2 | 7/2008 | Levy et al. |
| 7,403,435 B2 | 7/2008 | Kato |
| 7,411,209 B2 | 8/2008 | Endo et al. |
| 7,453,065 B2 | 11/2008 | Saito et al. |
| 7,453,087 B2 | 11/2008 | Iwasaki |
| 7,459,743 B2 | 12/2008 | Mandelman et al. |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,511,558 B2 | 3/2009 | Itoh et al. |
| 7,524,713 B2 | 4/2009 | Miyairi et al. |
| 7,642,573 B2 | 1/2010 | Hoffman et al. |
| 7,674,650 B2 | 3/2010 | Akimoto et al. |
| 7,687,807 B2 | 3/2010 | Koo et al. |
| 7,714,633 B2 | 5/2010 | Kato |
| 7,732,819 B2 | 6/2010 | Akimoto et al. |
| 7,755,126 B2 | 7/2010 | Kondo |
| 7,790,530 B2 | 9/2010 | Mandelman et al. |
| 7,791,074 B2 | 9/2010 | Iwasaki |
| 7,791,075 B2 | 9/2010 | Kobayashi et al. |
| 7,791,082 B2 | 9/2010 | Iwasaki |
| 7,838,348 B2 | 11/2010 | Hoffman et al. |
| 7,838,402 B2 | 11/2010 | Nagasawa et al. |
| 7,884,360 B2 | 2/2011 | Takechi et al. |
| 7,910,490 B2 | 3/2011 | Akimoto et al. |
| 7,932,521 B2 | 4/2011 | Akimoto et al. |
| 7,935,582 B2 | 5/2011 | Iwasaki |
| 7,940,085 B2 | 5/2011 | Kim et al. |
| 7,956,361 B2 | 6/2011 | Iwasaki |
| 8,058,645 B2 | 11/2011 | Jeong et al. |
| 8,084,331 B2 | 12/2011 | Ofuji et al. |
| 8,110,436 B2 | 2/2012 | Hayashi et al. |
| 8,134,156 B2 | 3/2012 | Akimoto |
| 8,143,115 B2 | 3/2012 | Omura et al. |
| 8,144,102 B2 | 3/2012 | Takatoku |
| 8,148,721 B2 | 4/2012 | Hayashi et al. |
| 8,154,024 B2 | 4/2012 | Iwasaki |
| 8,158,464 B2 | 4/2012 | Akimoto |
| 8,202,365 B2 | 6/2012 | Umeda et al. |
| 8,207,756 B2 | 6/2012 | Shionoiri et al. |
| 8,217,680 B2 | 7/2012 | Kim et al. |
| 8,274,077 B2 | 9/2012 | Akimoto et al. |
| 8,278,136 B2 | 10/2012 | Tanaka et al. |
| 8,289,052 B2 | 10/2012 | Kawae |
| 8,368,079 B2 | 2/2013 | Akimoto |
| 8,384,076 B2 | 2/2013 | Park et al. |
| 8,420,442 B2 | 4/2013 | Takechi et al. |
| 8,420,462 B2 | 4/2013 | Kobayashi et al. |
| 8,441,085 B2 | 5/2013 | Nagasawa et al. |
| 8,466,463 B2 | 6/2013 | Akimoto et al. |
| 8,502,217 B2 | 8/2013 | Sato et al. |
| 8,525,165 B2 | 9/2013 | Akimoto |
| 8,530,246 B2 | 9/2013 | Ofuji et al. |
| 8,546,164 B2 | 10/2013 | Jeong et al. |
| 8,563,977 B2 | 10/2013 | Shimada et al. |
| 8,581,260 B2 | 11/2013 | Yamazaki et al. |
| 8,610,652 B2 | 12/2013 | Lee et al. |
| 8,629,069 B2 | 1/2014 | Akimoto et al. |
| 8,669,550 B2 | 3/2014 | Akimoto et al. |
| 8,742,412 B2 | 6/2014 | Goyal et al. |
| 8,785,240 B2 | 7/2014 | Watanabe |
| 8,790,959 B2 | 7/2014 | Akimoto et al. |
| 8,796,069 B2 | 8/2014 | Akimoto et al. |
| 8,860,108 B2 | 10/2014 | Yamazaki et al. |
| 8,889,480 B2 | 11/2014 | Takechi et al. |
| 8,962,457 B2 | 2/2015 | Watanabe |
| 9,041,202 B2 | 5/2015 | Kimura |
| 9,099,562 B2 | 8/2015 | Akimoto et al. |
| 9,209,026 B2 | 12/2015 | Takechi et al. |
| 9,240,487 B2 | 1/2016 | Lee et al. |
| 9,397,255 B2 | 7/2016 | Kimura |
| 10,304,962 B2 | 5/2019 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0213994 A1 | 11/2003 | Hayashi et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2004/0240305 A1 | 12/2004 | Kato |
| 2005/0017302 A1 | 1/2005 | Hoffman |
| 2005/0199881 A1 | 9/2005 | Hoffman et al. |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |

(56) References Cited

U.S. PATENT DOCUMENTS

| | | | |
|---|---|---|---|
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0147165 A1 | 6/2007 | Kato |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272759 A1 | 11/2007 | Kato |
| 2007/0272922 A1 | 11/2007 | Kim et al. |
| 2007/0272948 A1 | 11/2007 | Koo et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0291350 A1 | 11/2008 | Hayashi et al. |
| 2008/0296568 A1 | 12/2008 | Ryu et al. |
| 2008/0299702 A1* | 12/2008 | Son ............... H01L 29/7869 438/149 |
| 2008/0308805 A1 | 12/2008 | Akimoto et al. |
| 2009/0002590 A1 | 1/2009 | Kimura |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0098709 A1 | 4/2009 | Ohnuma et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0152607 A1 | 6/2009 | Tanaka et al. |
| 2009/0155940 A1 | 6/2009 | Lee et al. |
| 2009/0186445 A1 | 7/2009 | Akimoto |
| 2009/0189155 A1 | 7/2009 | Akimoto |
| 2009/0206332 A1 | 8/2009 | Son et al. |
| 2009/0250693 A1 | 10/2009 | Jeong et al. |
| 2009/0278122 A1 | 11/2009 | Hosono et al. |
| 2009/0280600 A1 | 11/2009 | Hosono et al. |
| 2009/0283762 A1 | 11/2009 | Kimura |
| 2009/0283763 A1 | 11/2009 | Park et al. |
| 2010/0003783 A1 | 1/2010 | Akimoto |
| 2010/0065844 A1 | 3/2010 | Tokunaga |
| 2010/0078634 A1 | 4/2010 | Hoffman et al. |
| 2010/0079169 A1 | 4/2010 | Kim et al. |
| 2010/0084648 A1 | 4/2010 | Watanabe |
| 2010/0092800 A1 | 4/2010 | Itagaki et al. |
| 2010/0097838 A1 | 4/2010 | Tanaka et al. |
| 2010/0109002 A1 | 5/2010 | Itagaki et al. |
| 2010/0148171 A1 | 6/2010 | Hayashi et al. |
| 2010/0148845 A1 | 6/2010 | Kato |
| 2010/0149138 A1 | 6/2010 | Lee et al. |
| 2010/0193785 A1 | 8/2010 | Kimura |
| 2011/0104851 A1 | 5/2011 | Akimoto et al. |
| 2011/0121290 A1 | 5/2011 | Akimoto et al. |
| 2012/0052609 A1 | 3/2012 | Jeong et al. |
| 2012/0132911 A1 | 5/2012 | Shimada et al. |
| 2012/0168750 A1 | 7/2012 | Hayashi et al. |
| 2013/0157393 A1 | 6/2013 | Kimura |
| 2013/0292671 A1 | 11/2013 | Yamazaki et al. |
| 2015/0084048 A1 | 3/2015 | Hayashi et al. |
| 2015/0115261 A1 | 4/2015 | Kimura |
| 2015/0340513 A1 | 11/2015 | Akimoto et al. |
| 2016/0300862 A1 | 10/2016 | Kimura |
| 2017/0330902 A1 | 11/2017 | Kimura |
| 2019/0051759 A1 | 2/2019 | Akimoto et al. |

FOREIGN PATENT DOCUMENTS

| | | |
|---|---|---|
| CN | 101714870 A | 5/2010 |
| EP | 0601590 A | 6/1994 |
| EP | 0971360 A | 1/2000 |
| EP | 1233454 A | 8/2002 |
| EP | 1355358 A | 10/2003 |
| EP | 1737044 A | 12/2006 |
| EP | 1744364 A | 1/2007 |
| EP | 1770788 A | 4/2007 |
| EP | 1995787 A | 11/2008 |
| EP | 1998373 A | 12/2008 |
| EP | 1998374 A | 12/2008 |
| EP | 1998375 A | 12/2008 |
| EP | 2053657 A | 4/2009 |
| EP | 2113943 A | 11/2009 |
| EP | 2120267 A | 11/2009 |
| EP | 2172972 A | 4/2010 |
| EP | 2207202 A | 7/2010 |
| EP | 2207203 A | 7/2010 |
| EP | 2226847 A | 9/2010 |
| EP | 2339639 A | 6/2011 |
| EP | 2408011 A | 1/2012 |
| EP | 2816607 A | 12/2014 |
| EP | 2927965 A | 10/2015 |
| JP | 60-198861 A | 10/1985 |
| JP | 61-264762 A | 11/1986 |
| JP | 62-254462 A | 11/1987 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 04-099060 A | 3/1992 |
| JP | 05-119298 A | 5/1993 |
| JP | 05-251705 A | 9/1993 |
| JP | 06-021478 A | 1/1994 |
| JP | 07-099251 A | 4/1995 |
| JP | 07-176184 A | 7/1995 |
| JP | 08-264794 A | 10/1996 |
| JP | 10-084047 A | 3/1998 |
| JP | 11-505377 | 5/1999 |
| JP | 2000-026119 A | 1/2000 |
| JP | 2000-044236 A | 2/2000 |
| JP | 2000-150900 A | 5/2000 |
| JP | 2001-093988 A | 4/2001 |
| JP | 2001-508167 | 6/2001 |
| JP | 2001-230329 A | 8/2001 |
| JP | 2002-076356 A | 3/2002 |
| JP | 2002-289859 A | 10/2002 |
| JP | 2002-368226 A | 12/2002 |
| JP | 2003-086000 A | 3/2003 |
| JP | 2003-086712 A | 3/2003 |
| JP | 2003-086808 A | 3/2003 |
| JP | 2003-240435 A | 8/2003 |
| JP | 2004-103957 A | 4/2004 |
| JP | 2004-128446 A | 4/2004 |
| JP | 2004-273614 A | 9/2004 |
| JP | 2004-273732 A | 9/2004 |
| JP | 2005-011492 A | 1/2005 |
| JP | 2005-322899 A | 11/2005 |
| JP | 2006-120382 A | 5/2006 |
| JP | 2006-165532 A | 6/2006 |

(56) References Cited

FOREIGN PATENT DOCUMENTS

| | | |
|---|---|---|
| JP | 2007-073558 A | 3/2007 |
| JP | 2007-073705 A | 3/2007 |
| JP | 2007-103918 A | 4/2007 |
| JP | 2007-123861 A | 5/2007 |
| JP | 2007-158311 A | 6/2007 |
| JP | 2007-529118 | 10/2007 |
| JP | 2008-042088 A | 2/2008 |
| JP | 2008-060419 A | 3/2008 |
| JP | 2008-085048 A | 4/2008 |
| JP | 2008-091896 A | 4/2008 |
| JP | 2008-108985 A | 5/2008 |
| JP | 2008-166716 A | 7/2008 |
| JP | 2008-263136 A | 10/2008 |
| JP | 2008-281988 A | 11/2008 |
| JP | 2008-283046 A | 11/2008 |
| JP | 2009-016368 A | 1/2009 |
| JP | 2009-033145 A | 2/2009 |
| JP | 2009-506526 | 2/2009 |
| JP | 2009-076707 A | 4/2009 |
| JP | 2009-081425 A | 4/2009 |
| JP | 2009-099778 A | 5/2009 |
| JP | 2009-099944 A | 5/2009 |
| JP | 2009-099953 A | 5/2009 |
| JP | 2009-130180 A | 6/2009 |
| JP | 2009-152235 A | 7/2009 |
| JP | 2009-167087 A | 7/2009 |
| JP | 2009-182194 A | 8/2009 |
| JP | 2009-212443 A | 9/2009 |
| JP | 2009-260378 A | 11/2009 |
| JP | 2009-277702 A | 11/2009 |
| JP | 2009-278115 A | 11/2009 |
| JP | 2009-290113 A | 12/2009 |
| JP | 2009-302520 A | 12/2009 |
| KR | 2004-0089071 A | 10/2004 |
| KR | 2007-0003930 A | 1/2007 |
| KR | 10-0746890 | 8/2007 |
| KR | 10-0801961 | 2/2008 |
| KR | 2008-0036202 A | 4/2008 |
| KR | 2009-0065951 A | 6/2009 |
| KR | 2009-0105558 A | 10/2009 |
| KR | 2009-0119705 A | 11/2009 |
| TW | 200723537 | 6/2007 |
| TW | 200941724 | 10/2009 |
| WO | WO-1997/005657 | 2/1997 |
| WO | WO-2004/114391 | 12/2004 |
| WO | WO-2005/093849 | 10/2005 |
| WO | WO-2007/023011 | 3/2007 |
| WO | WO-2007/029844 | 3/2007 |
| WO | WO-2007/058329 | 5/2007 |
| WO | WO-2008/069056 | 6/2008 |
| WO | WO-2008/069255 | 6/2008 |
| WO | WO-2008/126879 | 10/2008 |
| WO | WO-2008/143021 | 11/2008 |
| WO | WO-2009/041544 | 4/2009 |
| WO | WO-2009/041713 | 4/2009 |
| WO | WO-2009/072532 | 6/2009 |
| WO | WO-2009/096608 | 8/2009 |
| WO | WO-2009/110623 | 9/2009 |
| WO | WO-2009/139482 | 11/2009 |

OTHER PUBLICATIONS

Written Opinion (Application No. PCT/JP2010/072068) dated Mar. 22, 2011.

Kim.W et al., "An Experimental High-Density DRAM Cell with a Built-in Gain Stage", IEEE Journal of Solid-State Circuits, Aug. 1, 1994, vol. 29, No. 8, pp. 978-981.

Shukuri.S et al., "A Complementary Gain Cell Technology for sub-1 V Supply DRAMs", IEDM 92: Technical Digest of International Electron Devices Meeting, Dec. 13, 1992, pp. 1006-1008.

Ishii.T et al., "A Poly-Silicon TFT With a Sub-5-nm Thick Channel for Low-Power Gain Cell Memory in Mobile Applications", IEEE Transactions on Electron Devices, Nov. 1, 2004, vol. 51, No. 11, pp. 1805-1810.

Shukuri.S et al., "A Semi-Static Complementary Gain Cell Technology for Sub-1 V Supply DRAM's", IEEE Transactions on Electron Devices, Jun. 1, 1994, vol. 41, No. 6, pp. 926-931.

Fortunato.E et al., "Wide-Bandgap High-Mobility ZNO Thin-Film Transistors Produced at Room Temperature", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn— Oxide TFT", SID Digest '09 : SID International Symposium Digest of Technical Papers, May 31, 2009, vol. 40, pp. 184-187.

Nomura.K et al., "Carrier transport in transparent oxide semiconductor with intrinsic structural randomness probed using single-crystalline $InGaO_3(ZnO)_5$ films", Appl. Phys. Lett. (Applied Physics Letters), Sep. 13, 2004, vol. 85, No. 11, pp. 1993-1995.

Li.C et al., "Modulated Structures of Homologous Compounds $InMO_3(ZnO)_m$ (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

(56) References Cited

OTHER PUBLICATIONS

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Tsuda.K et al., "Ultra Low Power Consumption Technologies for Mobile TFT-LCDs", IDW'02 : Proceedings of the 9th International Display Workshops, Dec. 4, 2002, pp. 295-298.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems", Journal of Solid-State Circuits , 2008, vol. 43, No. 1, pp. 292-299.
Ohara.H et al., "Amorphous In—Ga—Zn— Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Cho.D et al., "21.2:AL and SN-Doped Zinc Indium Oxide Thin Film Transistors for AMOLED Back-Plane", SID Digest '09 : SID International Symposium Digest of Technical Papers, May 31, 2009, pp. 280-283.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn— Oxide TFTS", IDW'09 : Proceedings of the 16th International Display Workshops, 2009, pp. 689-692.
Park.J et al., "Amorphous Indium-Gallium-Zinc Oxide TFTS and Their Application for Large Size AMOLED", AM-FPD '08 Digest of Technical Papers, Jul. 2, 2008, pp. 275-278.
Park.S et al., "Challenge to Future Displays: Transparent AM-OLED Driven by PEALD Grown ZNO TFT", IMID '07 Digest, 2007, pp. 1249-1252.
Godo.H et al., "Temperature Dependence of Characteristics and Electronic Structure for Amorphous In—Ga—Zn— Oxide TFT", AM-FPD '09 Digest of Technical Papers, Jul. 1, 2009, pp. 41-44.
Osada.T et al., "Development of Driver-Integrated Panel Using Amorphous In—Ga—Zn— Oxide TFT", AM-FPD '09 Digest of Technical Papers, Jul. 1, 2009, pp. 33-36.
Hirao.T et al., "Novel Top-Gate Zinc Oxide Thin-Film Transistors (ZNO TFTS) for AMLCDS", J. Soc. Inf. Display (Journal of the Society for Information Display), 2007, vol. 15, No. 1, pp. 17-22.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn— Oxide TFT", SID Digest '09 : SID International Symposium Digest of Technical Papers, May 31, 2009, pp. 1110-1112.
Ohara.H et al., "21.3:4.0 In. QVGA AMOLED Display Using In—Ga—Zn— Oxide TFTS With a Novel Passivation Layer", SID Digest '09 : SID International Symposium Digest of Technical Papers, May 31, 2009, pp. 284-287.
Miyasaka.M, "SUFTLA Flexible Microelectronics on Their Way to Business", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Lee.H et al., "Current Status of, Challenges to, and Perspective View of AM-OLED", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Nakamura.M, "Synthesis of Homologous Compound with New Long-Period Structure", NIRIM Newsletter, Mar. 1, 1995, vol. 150, pp. 1-4.
Kikuchi.H et al., "Polymer-Stabilized Liquid Crystal Blue Phases", Nature Materials, Sep. 2, 2002, vol. 1, pp. 64-68.
Kimizuka.N et al., "Spinel,YBFE2O4, and YB2FE3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.
Kitzerow.H et al., "Observation of Blue Phases in Chiral Networks", Liquid Crystals, 1993, vol. 14, No. 3, pp. 911-916.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Janotti.A et al., "Oxygen Vacancies In ZnO", Appl. Phys. Lett. (Applied Physics Letters) , 2005, vol. 87, pp. 122102-1-122102-3.

(56) References Cited

OTHER PUBLICATIONS

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZNO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

European Office Action (Application No. 10840858.4) dated Nov. 27, 2013.

Chinese Office Action (Application No. 201080059846.2) dated Sep. 3, 2014.

Taiwanese Office Action (Application No. 099145814) dated Apr. 2, 2015.

Korean Office Action (Application No. 2012-7019609) dated Jan. 17, 2017.

Chinese Office Action (Application No. 201510354385.6) dated Jul. 3, 2017.

Korean Office Action (Application No. 2017-7023305) dated Nov. 24, 2017.

Godo.H et al., "Temperature Dependence of Transistor Characteristics and Electronic Structure for Amorphous In—Ga—Zn—Oxide Thin Film Transistor", Jpn. J. Appl. Phys. (Japanese Journal of Applied Physics), Mar. 1, 2010, vol. 49, No. 3, pp. 03CB04-1-03CB04-6.

Indian Office Action (Application No. 201818029545) dated May 27, 2021.

* cited by examiner

MEMORY DEVICE AND SEMICONDUCTOR DEVICE

TECHNICAL FIELD

The present invention relates to a non-volatile semiconductor memory device. In particular, the present invention relates to a structure of a memory cell storing data and a driving method thereof.

BACKGROUND ART

Examples of a semiconductor memory device (hereinafter, simply referred to as a memory device) include a DRAM and an SRAM, which are categorized as a volatile memory; a mask ROM, an EPROM, an EEPROM, a flash memory, and a ferroelectric memory, which are categorized as a non-volatile memory; and the like. Most of these memories including single crystal semiconductor substrates are already put into practical use. Among the above semiconductor memories, flash memories are widely marketed, which are mainly used for mobile storage media such as USB memories and memory cards. The reason of this is that flash memories are resistant to physical impact and can be conveniently used because they are non-volatile memories which can repeatedly write and delete data and can store data without being supplied with power.

As types of flash memories, there are NAND flash memories in which a plurality of memory cells is connected in series and NOR flash memories in which a plurality of memory cells is arranged in matrix. Any of these flash memories has a transistor which functions as a memory element in each memory cell. Further, the transistor which functions as a memory element has an electrode for accumulating electric charge, which is called a floating gate, between a gate electrode and a semiconductor film serving as an active layer. The accumulation of electric charge in the floating gate enables storage of data.

Patent Documents 1 and 2 describe a thin film transistor including a floating gate which is formed over a glass substrate.

REFERENCE

Patent Document

[Patent Document 1] Japanese Published Patent Application No. H6-021478

[Patent Document 2] Japanese Published Patent Application No. 2005-322899

DISCLOSURE OF INVENTION

Note that, in general, an absolute value of voltage applied to a memory element of a non-volatile memory in data writing is approximately 20 V, which tends to be higher than an absolute value of voltage applied to a memory element of a volatile memory. In the case of flash memories which can repeatedly rewrite data, high voltage needs to be applied to a transistor used as a memory element in data erasing as well as in data writing. Accordingly, power consumption becomes high when a flash memory operates, for example, in data writing and in data erasing, which is one factor that an electronic device including a flash memory as a memory device consumes high power. In particular, when a flash memory is used for a portable electronic device such as a camera and a mobile phone, high power consumption causes a disadvantage of short continuous use time.

In addition, although a flash memory is a non-volatile memory, data is lost by slight leak of electric charge. Therefore, data storage period is approximately five years to ten years so far, and it is hoped that a flash memory capable of securing much longer storage period is realized.

Further, although a flash memory can repeatedly write and erase data, a gate insulating film easily deteriorates by tunnel current when electric charge is accumulated in a floating gate. Accordingly, the number of times of data rewritings in one memory element is at most approximately ten thousands to hundred thousands, and it is hoped that a flash memory which can rewrite ten thousands to hundred thousands or more times is realized.

In view of the above problems, it is an object of the present invention to provide a memory device whose power consumption can be suppressed and a semiconductor device using the memory device. Further, it is an object of the present invention to provide a memory device which can store data for a further long period and a semiconductor device using the memory device. Furthermore, it is an object of the present invention to provide a memory device which can rewrite data a number of times and a semiconductor device using the memory device.

In an embodiment of the present invention, a non-volatile memory device is formed using a transistor which serves as a memory element and includes a second gate electrode for controlling threshold voltage in addition to a normal gate electrode. In addition, in the above memory device, in order to write data, electric charge is not injected with high voltage to a floating gate surrounded by an insulating film; instead, a potential of the second gate electrode for controlling the threshold voltage of the transistor used as a memory element is controlled with a transistor having extremely low off-state current. In other words, a memory device according to one embodiment of the present invention includes at least a transistor the threshold voltage of which is controlled by the second gate electrode, a capacitor for holding a potential of the second gate electrode, and a transistor used as a switching element for controlling charging and discharging of the capacitor.

The amount of shift of the threshold voltage of the transistor used as a memory element is controlled by the height of a potential of the second gate electrode, more specifically, by potential difference between a source electrode and the second gate electrode. In addition, difference of height of threshold voltages or difference of resistance between the source electrode and a drain electrode caused by difference of height of threshold voltages leads to difference of data stored in a memory element.

The transistor used as a memory element can be anything as long as it is an insulating-gate-type field-effect transistor. Specifically, the transistor includes a first gate electrode, a second gate electrode, a semiconductor film located between the first gate electrode and the second gate electrode, a first insulating film located between the first gate electrode and the semiconductor film, a second insulating film located between the second gate electrode and the semiconductor film, and a source electrode and a drain electrode in contact with the semiconductor film.

Furthermore, a transistor used as a switching element has a channel formation region which includes a semiconductor material with a wide band gap compared to that of silicon and low intrinsic carrier density compared to that of silicon. With a channel formation region including a semiconductor material having the above characteristics, a transistor with an extremely low off-state current can be realized. As such a semiconductor material, for example, an oxide semiconductor, silicon carbide, gallium nitride, or the like which has approximately three times as wide band gap as silicon can be given.

Note that an oxide semiconductor is metal oxide showing semiconductor characteristics including both of high mobility which is a characteristic of microcrystalline silicon or polysilicon and uniform element characteristics which is a characteristic of amorphous silicon. In addition, an oxide semiconductor highly purified by reduction of impurities, which can be an electron donor (donor), such as moisture or hydrogen (purified OS) is i-type (intrinsic semiconductor) or substantially i-type. A transistor including the above oxide semiconductor has a property of extremely low off-state current. Specifically, after impurities such as moisture or hydrogen included in an oxide semiconductor are removed, the value of the hydrogen concentration in an oxide semiconductor measured by secondary ion mass spectrometry (SIMS) is $5\times10^{19}/cm^3$ or less, preferably $5\times10^{18}/cm^3$ or less, more preferably $5\times10^{17}/cm^3$ or less, and further preferably $5\times10^{16}/cm^3$ or less. In addition, the carrier density of the oxide semiconductor film which can be measured by Hall effect measurement is less than $1\times10^{14}/cm^{-3}$, preferably less than $1\times10^{12}/cm^{-3}$, more preferably less than $1\times10^{11}/cm^{-3}$, which is the minimum measurement limit or less. That is, the carrier density in the oxide semiconductor film is extremely close to zero. Furthermore, the band gap of the oxide semiconductor is 2 eV or more, preferably 2.5 eV or more, more preferably 3 eV or more. With the oxide semiconductor film which is highly purified by sufficient reduction of the concentration of impurities such as moisture or hydrogen, the off-state current of the transistor can be reduced.

The analysis of the concentrations of hydrogen in the oxide semiconductor film and the conductive film is described here. The hydrogen concentrations in the oxide semiconductor film and the conductive film are measured by SIMS. It is known that it is difficult to obtain data in the proximity of a surface of a sample or in the proximity of an interface between stacked films formed using different materials by the SIMS in principle. Thus, in the case where distributions of the hydrogen concentrations of the films in thickness directions are analyzed by SIMS, an average value in a region in which the films are provided and from which values that are not greatly changed from each other and are almost the same can be obtained are employed as the hydrogen concentration. Further, in the case where the thickness of the film is small, a region from which the values are almost the same can be obtained cannot be found in some cases due to the influence of the hydrogen concentration of the films adjacent to each other. In this case, the maximum value or the minimum value of the hydrogen concentration of a region where the films are provided is employed as the hydrogen concentration of the film. Furthermore, in the case where a mountain-shaped peak having the maximum value and a valley-shaped peak having the minimum value do not exist in the region where the films are provided, the value of the inflection point is employed as the hydrogen concentration.

Note that it is found that the oxide semiconductor film formed by sputtering or the like includes a large amount of moisture or hydrogen as impurities. Moisture or hydrogen easily forms a donor level and thus serves as impurities in the oxide semiconductor itself. Thus, in one embodiment of the present invention, heat treatment is performed on an oxide semiconductor film in a hydrogen atmosphere, an oxygen atmosphere, an atmosphere of ultra dry air (the gas in which content of water is 20 ppm or less, preferably 1 ppm or less, and more preferably 10 ppb or less), or a rare gas (e.g., argon and helium) atmosphere in order to reduce impurities such as moisture or hydrogen in the oxide semiconductor film. The above heat treatment is preferably performed at 500° C. to 850° C. (alternatively, a strain point of a glass substrate or less) inclusive, more preferably 550° C. to 750° C. inclusive. Note that this heat treatment is performed at a temperature not exceeding the upper temperature limit of the substrate to be used. An effect of elimination of moisture or hydrogen by heat treatment is confirmed by thermal desorption spectroscopy (TDS).

Heat treatment in a furnace or a rapid thermal annealing method (RTA method) is used for the heat treatment. As the RTA method, a method using a lamp light source or a method in which heat treatment is performed for a short time while a substrate is moved in heated gas can be employed. By the use of the RTA method, it is also possible to make the time necessary for heat treatment shorter than 0.1 hours.

Specifically, in a transistor which uses an oxide semiconductor film highly purified by the above heat treatment as an active layer, for example, even in an element with a channel width (W) of $1\times10^6$ μm and a channel length (L) of 10 μm, in a range of from 1 V to 10 V of voltage (drain voltage) between a source electrode and a drain electrode, it is possible to obtain off-state current (which is drain current in the case where voltage between a gate electrode and the source electrode is 0 V or less) which is less than or equal to the measurement limit of a semiconductor parameter analyzer, i.e., less than or equal to $1\times10^{-13}$ A. Therefore, it is found that the off-state current density corresponding to a numerical value which is calculated in such a manner that the value of the off-state current is divided by that of the channel width of the transistor is 100 zA/μm or less. In addition, the off-state current of the transistor is measured by transition in the amount of electric charge in a capacitor per unit time by the use of a transistor in which a 100-nm-thick gate insulating film including a highly-purified oxide semiconductor film is used as a switching element for holding electric charge of a capacitor. Then, it is found that the low off-state current can be as low as 10 zA/μm to 100 zA/μm when the voltage between the source electrode and the drain electrode of the transistor is 3 V. Therefore, in the memory device relating to an embodiment of the present invention, the off-state-current density of the transistor including the highly-purified oxide semiconductor film as an active layer can be less than or equal to 100 zA/μm, preferably less than or equal to 10 zA/μm, or more preferably less than or equal to 1 zA/μm. Accordingly, when the voltage between the gate electrode and the source electrode is 0 V or less, the off-state current of the transistor in which the highly-purified oxide semiconductor film is used as an active layer is considerably lower than a transistor in which silicon having crystallinity is used.

In addition, a transistor including a highly-purified oxide semiconductor shows almost no temperature dependence of off-state current. It can be said that this is because an oxide semiconductor is highly purified by removing impurities which is an electron donor (donor) in the oxide semiconductor and the conductivity type approaches to be intrinsic, so that the Fermi level is located in the center of a forbidden band. This also results from the fact that the oxide semiconductor has an energy gap of 3 eV or more and includes very few thermally excited carriers. In addition, the source electrode and the drain electrode are in a degenerated state, which is also a factor for showing no temperature dependence. The transistor is operated mainly with carriers which are injected from the degenerated source electrode into the oxide semiconductor, and the above independence of off-state current in temperature can be explained by independence of the carrier density in temperature.

As the oxide semiconductor, an oxide of four metal elements such as an In—Sn—Ga—Zn—O-based oxide semiconductor; an oxide of three metal elements such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, and a Sn—Al—Zn—O-based oxide semiconductor; an oxide of two metal elements such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, and an In—Ga—O-based oxide semiconductor; an In—O-based oxide semiconductor; a Sn—O-based oxide semiconductor; a Zn—O-based oxide semiconductor; and the like can be used. Note that in this specification, for example, an In—Sn—Ga—Zn—O-based oxide semiconductor means a metal oxide including indium (In), tin (Sn), gallium (Ga), and zinc (Zn), and there is no particular limitation on the stoichiometric composition proportion. The above an oxide semiconductor may include silicon.

Alternatively, an oxide semiconductors can be represented by the chemical formula, $InMO_3(ZnO)_m$ (m>0). Here, M represents one or more metal elements selected from Ga, Al, Mn, and Co.

The transistor with low off-state current is used as a switching element for holding electric charge accumulated in a memory element, whereby leakage of electric charge from the memory element can be prevented. Therefore, a memory device capable of storing data for a long time and a semiconductor device using the memory device can be provided.

Further, voltage needed for writing data and reading data to/from a memory element is almost determined by operation voltage of the transistor which functions as a switching element. Therefore, a memory device in which operation voltage can greatly be lowered compared to that of a conventional flash memory and whose power consumption can be suppressed, and a semiconductor device using the memory device can be provided.

Furthermore, a memory device in which the number of rewriting times can be increased, and a semiconductor device using the memory device can be provided since deterioration of a gate insulating film by tunnel current can be suppressed in comparison with a conventional flash memory.

BEST MODE FOR CARRYING OUT THE INVENTION

Hereinafter, embodiments of the present invention will be described in detail with reference to the accompanying drawings. Note that the present invention is not limited to the following description and it is easily understood by those skilled in the art that the mode and details can be variously changed without departing from the scope and spirit of the present invention. Accordingly, the invention should not be construed as being limited to the description of the embodiments below.

Note that the present invention includes, in its category, all the semiconductor devices in which memory devices can be used: for example, integrated circuits such as microprocessors and image processing circuits, RF tags, memory media, and semiconductor display devices. Further, the semiconductor display devices include semiconductor display devices in which circuit elements using semiconductor films are included in pixel portions or driver circuits, such as liquid crystal display devices, light-emitting devices in which a light-emitting element typified by an organic light-emitting element (OLED) is provided for each pixel, electronic paper, digital micromirror devices (DMD), plasma display panels (PDP), field emission displays (FED), and the like, in its category.

Embodiment 1

Figure 1A:
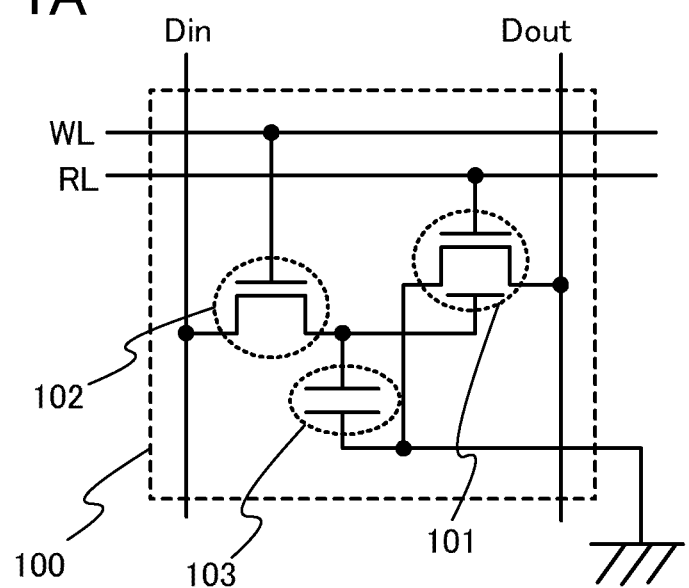
FIGS. 1A and 1B illustrate a structure of a memory cell.

FIG. 1A illustrates one example of a circuit diagram of a memory cell which is the minimum unit of a memory device of the present invention. A memory cell 100 in FIG. 1A includes a transistor 101 which functions as a memory element and a transistor 102 which can control the supply of a potential to a second gate electrode of the transistor 101 and functions as a switching element. Further, a memory cell may be include a capacitor 103 for holding the potential of the second gate electrode of the transistor 101.

Note that the memory cell 100 may further have another circuit element such as a diode, a resistor, or an inductor as needed.

The transistor 101 which functions as a memory element has a first gate electrode, the second gate electrode, a semiconductor film located between the first gate electrode and the second gate electrode, a first insulating film located between the first gate electrode and the semiconductor film, a second insulating film located between the second gate electrode and the semiconductor film, and a source electrode and a drain electrode provided in contact with the semiconductor film. With the potentials of the first gate electrode, the second gate electrode, the source electrode, and the drain electrode of the transistor 101, a various kinds of operation of the memory device can be controlled.

The transistor 102 which functions as a switching element has a channel formation region which includes a semiconductor material with a wide band gap and low intrinsic carrier density compared to those of silicon. Off-state current can be sufficiently reduced by using such a semiconductor material for the channel formation region of the transistor 102.

As one example of a semiconductor material whose band gap is wider than that of a silicon semiconductor and whose intrinsic carrier density is lower than that of silicon, a compound semiconductor such as silicon carbide (SiC) or gallium nitride (GaN), an oxide semiconductor formed of metal oxide such as zinc oxide (ZnO), or the like can be employed. Among the above, an oxide semiconductor has an advantage of high mass productivity because an oxide semiconductor can be formed by sputtering, a wet process (e.g., a printing method), or the like. In addition, the deposition temperature of an oxide semiconductor is 300° C. to 500° C. (a glass transition temperature or less, and approximately 700° C. at a maximum) whereas the process temperature of silicon carbide and process temperature of gallium nitride are approximately 1500° C. and approximately 1100° C., respectively. Therefore, an oxide semiconductor can be formed over a glass substrate which is inexpensively available and it is possible to stack a semiconductor element formed by an oxide semiconductor over an integrated circuit using a semiconductor material which does not have heat resistance high enough to withstand heat treatment at 1500° C. to 2000° C. Further, a larger substrate can be used. Accordingly, among the semiconductors with wide band gaps, the oxide semiconductor particularly has an advantage of high mass productivity. Further, in the case where an oxide semiconductor with high crystallinity is to be obtained in order to improve the property of a transistor (e.g., field-effect mobility), the oxide semiconductor with crystallinity can be easily obtained by heat treatment at 450° C. to 800° C.

In the following description, the case where an oxide semiconductor with the above advantages is used as the semiconductor film of the second transistor 102 is given as an example.

Note that although in FIG. 1A, the memory cell 100 includes one transistor 102 which functions as a switching element, the present invention is not limited to this structure. In one embodiment of the present invention, it is acceptable as long as one transistor which functions as a switching element is provided in each memory cell, and the number of such transistors may be plural. In the case where the memory cell 100 includes a plurality of transistors which function as switching elements, the plurality of transistors may be connected to each other in parallel, in series, or in combination of parallel connection and series connection.

Note that the state in which the transistors are connected to each other in series refers to the state in which only one of a source electrode and a drain electrode of a first transistor is connected to only one of a source electrode and a drain electrode of a second transistor. Further, the state in which the transistors are connected to each other in parallel refers to the state in which the source electrode of the first transistor is connected to the source electrode of the second transistor and the drain electrode of the first transistor is connected to the drain electrode of the second transistor.

In addition, the transistor 102 which functions as a switching element is different from the transistor 101 which functions as a memory element in that it is acceptable as long as a gate electrode which is provided on one side of an active layer is included. Note that the present invention is not limited to this structure, and a transistor which functions as a switching element may include a pair of gate electrodes having an active layer therebetween like a transistor which functions as a memory element.

Further, in one embodiment of the present invention, it is acceptable as long as at least the transistor 102 which functions as a switching element has the above semiconductor material with a wide band gap in the active layer. Therefore, an oxide semiconductor film may be used for the active layer of the transistor 101 which functions as a memory element. Alternatively, for the active layer of the transistor 101 which functions as a memory element, the following semiconductor other than the oxide semiconductor may be used: amorphous silicon, microcrystalline silicon, polycrystalline silicon, single crystalline silicon, amorphous germanium, microcrystalline germanium, polycrystalline germanium, single crystalline germanium, or the like. Note that when oxide semiconductor films are used for all of the transistors of the memory cell 100, a process can be simplified.

Then, a connection relation of the transistor 101, the transistor 102, and the capacitor 103 in the memory cell 100 in FIG. 1A will be described.

A gate electrode of the transistor 102 is connected to a writing word line WL. One of a source electrode and a drain electrode of the transistor 102 is connected to an inputting data line Din, and the other of the source electrode and the drain electrode of the transistor 102 is connected to the second gate electrode of the transistor 101. The first gate electrode of the transistor 101 is connected to a reading word line RL. One of the source electrode and the drain electrode of the transistor 101 is connected to an outputting data line Dout, and the other of the source electrode and the drain electrode of the transistor 101 is connected to a power supply line supplied with a fixed potential such as a ground potential.

Further, one of a pair of electrodes of the capacitor 103 is connected to the second gate electrode of the transistor 101 and the other of the pair of electrodes of the capacitor 103 is connected to the power supply line supplied with a fixed potential such as a ground potential.

Note that the term "connection" in this specification refers to electrical connection and corresponds to the state in which current, a potential, or voltage can be supplied or transmitted. Accordingly, a connection state means not only a state of a direct connection but also a state of indirect connection through a circuit element such as a wiring, a resistor, a diode, or a transistor so that current, a potential, or voltage can be supplied or transmitted.

In addition, even when different components are connected to each other in a circuit diagram, there is actually a case where one conductive film has functions of a plurality of components such as a case where part of a wiring serves as an electrode. The term "connection" also means such a case where one conductive film has functions of a plurality of components.

The names of the "source electrode" and the "drain electrode" included in the transistor interchange with each other depending on the polarity of the transistor or difference between the levels of potentials applied to the respective electrodes. In general, in an n-channel transistor, an electrode to which a lower potential is applied is called a source electrode, and an electrode to which a higher potential is applied is called a drain electrode. Further, in a p-channel transistor, an electrode to which a lower potential is applied is called a drain electrode, and an electrode to which a higher potential is applied is called a source electrode. In this specification, for convenience, although connection relation of the transistor is described assuming that the source electrode and the drain electrode are fixed in some cases; however, actually, the names of the source electrode and the drain electrode interchange with each other depending on relation between the above potentials.

Note that in FIG. 1A, the transistor 102 has the gate electrode on one side of the active layer. When the transistor 102 has a pair of gate electrodes having the active layer therebetween, one of the gate electrodes is connected to the writing word line WL, and the other of the gate electrodes may be in a floating state (i.e., electrically insulated) or may be supplied with a potential. In the latter case, potentials with the same level may be applied to the pair of electrodes, or a fixed potential such as a ground potential may be applied only to the other of the gate electrodes. When the level of a potential supplied to the other of the gate electrodes is controlled, the threshold voltage of the transistor 102 can be controlled.

Figure 1B:
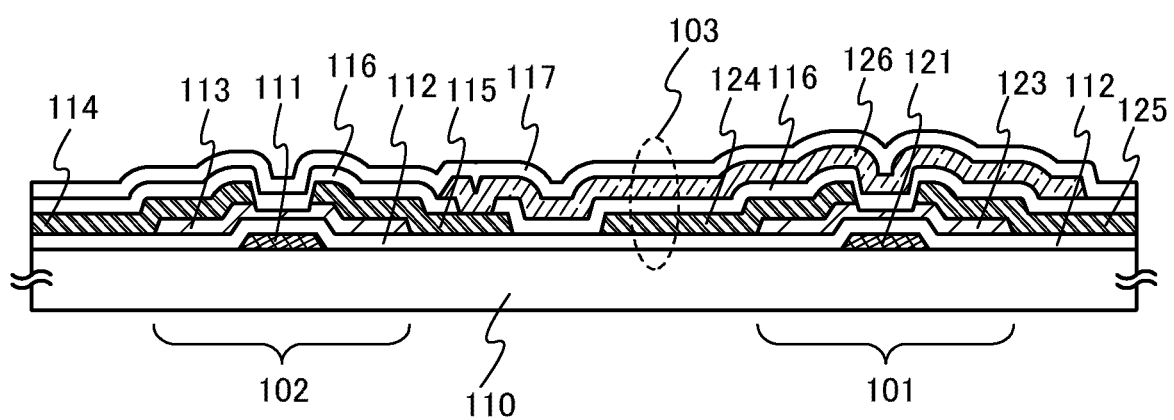

Then, FIG. 1B illustrates one example of a cross-sectional view of the memory cell 100 having the circuit structure in FIG. 1A. The memory cell in FIG. 1B includes the transistor 101 which functions as a memory element and the transistor 102 which functions as a switching element over a substrate 110 having an insulating surface.

Specifically, the transistor 101 includes, over the substrate 110 having an insulating surface, a first gate electrode 121; an insulating film 112 over the first gate electrode 121; an oxide semiconductor film 123 which serves as an active layer and overlaps with the first gate electrode 121 with the insulating film 112 provided therebetween; a source electrode 124 and a drain electrode 125 over the oxide semiconductor film 123; an insulating film 116 over the oxide semiconductor film 123, the source electrode 124, and the drain electrode 125; and a second gate electrode 126 which overlaps with the oxide semiconductor film 123 over the insulating film 116. Further, an insulating film 117 is formed over the second gate electrode 126 and may be included as a component of the transistor 101.

In addition, the transistor 102 includes, over the substrate 110 having an insulating surface, a gate electrode 111; the insulating film 112 over the gate electrode 111; an oxide semiconductor film 113 which serves as an active layer and overlaps with the gate electrode 111 with the insulating film 112 provided therebetween; and a source electrode 114 and a drain electrode 115 over the oxide semiconductor film 113. The insulating film 116 is formed over the oxide semiconductor film 113, the source electrode 114, and the drain electrode 115 and may be included as a component of the transistor 102.

In addition, the capacitor 103 is formed in a region where the source electrode 124 and the second gate electrode 126 of the transistor 101 overlap with each other with the insulating film 116 provided therebetween.

Figure 2A:
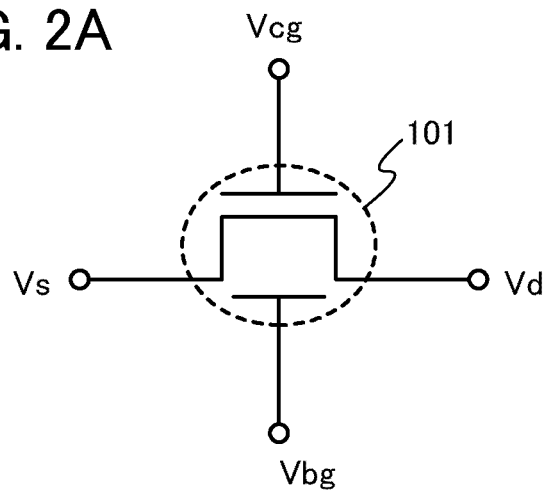
FIG. 2A illustrates a structure of a memory element and FIG. 2B illustrates operation thereof.
Figure 2B:
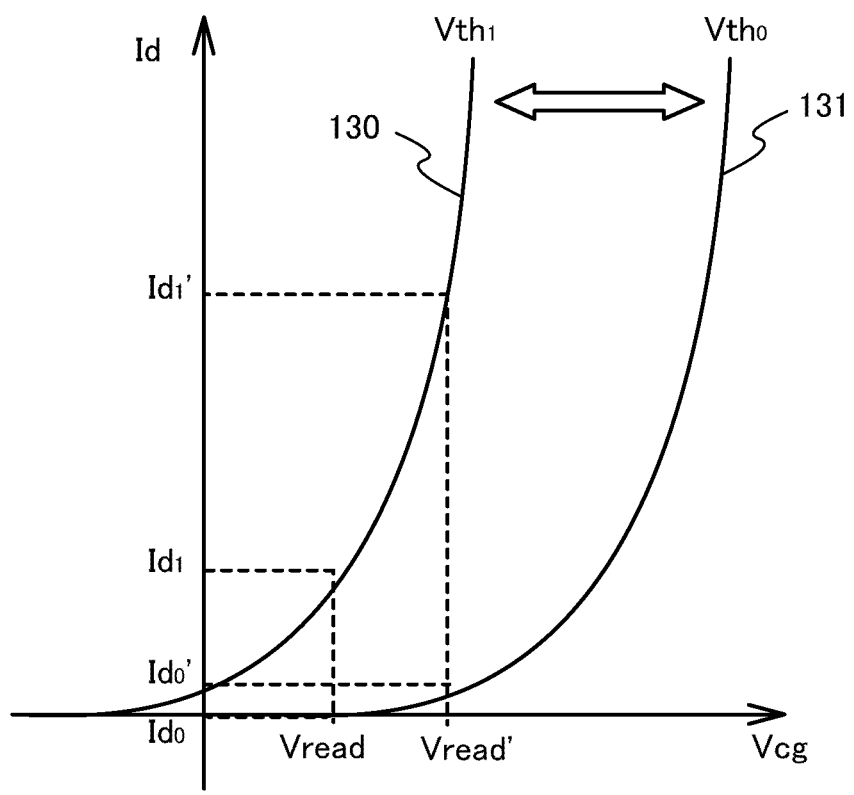

Next, as one example of the operation of a transistor which functions as a memory element, operation when the transistor 101 is an n-channel transistor and binary data is used will be described with reference to FIGS. 2A and 2B. Note that FIG. 2A illustrates a circuit diagram of the transistor 101. A potential of each electrode included in the transistor 101 is represented as follows: the potential of the first gate electrode is represented as Vcg, the potential of the second gate electrode is represented as Vbg, the potential of the source electrode is represented as Vs, and the potential of the drain electrode is represented as Vd.

First, the operation of the transistor 101 in data writing will be described. In data writing, a voltage which is equal to or lower than the threshold voltage $Vth_0$ is applied between the first gate electrode and the source electrode of the transistor 101. Note that the threshold voltage $Vth_0$ corresponds to the threshold voltage of the transistor 101 when the potential Vbg of the second gate electrode is equal to the ground potential Vgnd. Specifically, a relation between the potential of the first gate electrode and the potential of the source electrode in data writing is (Vcg−Vs)≤$Vth_0$. Therefore, the transistor 101 is in an off state in data writing and the drain electrode of the transistor 101 has high impedance.

Then, in data writing, the level of the potential Vbg of the second gate electrode is controlled in accordance with a value of data which is written. When binary data is used, a high potential Vdd or a low potential Vss is applied to the second gate electrode. A relation among potentials can be expressed as Vdd>Vss≥Vgnd. For example, when the potential Vbg of the second gate electrode is the low potential Vss which is equal to Vgnd, the threshold voltage of the transistor 101 is kept at $Vth_0$. On the other hand, when the potential Vbg of the second gate electrode is the high potential Vdd, the threshold voltage of the transistor 101 shifts to a negative side and becomes $Vth_1$.

Note that although in Embodiment 1, the case where the low potential Vss is equal to Vgnd in data writing is described as an example, the low potential Vss need not be equal to the ground potential Vgnd. For example, Vdd>Vss>Vgnd is also acceptable. Note that in that case the amount of a shift of threshold voltage is smaller than that of threshold voltage when the potential Vbg of the second gate electrode is the high potential Vdd.

Next, the operation of the transistor 101 in data storing will be described. In data storing, the transistor 102 which functions as a switching element is in an off state. Since the off-state current of the transistor 102 is extremely low as described above, the level of the potential Vbg set in data writing is held.

Then, the operation of the transistor 101 in data reading will be described. In data reading, voltage higher than the threshold voltage $Vth_1$ and lower than the threshold voltage $Vth_0$ is applied to the first gate electrode and the source electrode of the transistor 101.

In the case where the threshold voltage of the transistor 101 is made to be $Vth_1$ in latest data writing performed before data reading, the transistor 101 is turned on since the voltage between the first gate electrode and the source electrode of the transistor 101 becomes higher than the threshold voltage $Vth_1$, so that the resistance between the source electrode and the drain electrode is lowered. Therefore, the potential Vs of the source electrode of the transistor 101 is supplied to the drain electrode of the transistor 101. On the other hand, in the case where the threshold voltage of the transistor 101 is made to be $Vth_0$ in latest data writing performed before the data reading, the transistor 101 is kept off when the voltage between the first gate electrode and the source electrode is higher than the threshold voltage $Vth_1$ but lower than the threshold voltage $Vth_0$. Accordingly, the resistance between the source electrode and the drain electrode is high, so that the drain electrode of the transistor 101 keeps high impedance.

Accordingly, the potential Vd of the drain electrode is determined depending on the level of the potential applied to the second gate electrode in latest data writing performed before the data reading. FIG. 2B illustrates a relation between the potential Vcg of the first gate electrode and the drain current Id of the transistor 101 in data reading. A line 130 illustrates a relation between the potential Vcg and the drain current Id when the threshold voltage is $Vth_1$. A line 131 illustrates a relation between the potential Vcg and the drain current Id when the threshold voltage is $Vth_0$. As illustrated in FIG. 2B, when the voltage between the first gate electrode and the source electrode is a voltage Vread which is higher than the threshold voltage $Vth_1$ and lower than the threshold voltage $Vth_0$, it is understood from the line 130 and the line 131 that drain current $Id_1$ obtained in the case where the threshold voltage is $Vth_1$ is higher than drain current $Id_0$ obtained in the case where the threshold voltage is $Vth_0$. Therefore, when the amount of the drain current Id or the potential Vd of the drain electrode is read, the value of written data can be understood.

Note that in Embodiment 1, although the case where in data reading, the voltage between the first gate electrode and the source electrode is higher than the threshold voltage $Vth_1$ and lower than the threshold voltage $Vth_0$ is described, the present invention is not limited to this structure. The voltage between the first gate electrode and the source electrode in data reading need not be lower than or equal to the threshold voltage $Vth_0$. For example, in the case where the threshold voltage of the transistor 101 is made to be $Vth_1$ in latest data writing performed before data reading, the transistor 101 is turned on when the voltage between the first gate electrode and the source electrode is higher than the threshold voltage $Vth_0$ in data reading, so that the resistance between the source electrode and the drain electrode is lowered. The resistance between the source electrode and the drain electrode at that time, is denoted by $Rds_0$. On the other hand, in the case where the threshold voltage of the transistor 101 is made to be $Vth_0$ in latest data writing performed before data reading, the transistor 101 is turned on when the voltage between the first gate electrode and the source electrode is higher than the threshold voltage $Vth_0$ in data reading, so that the resistance between the source electrode and the drain electrode is lowered. The resistance between the source electrode and the drain electrode at that time is denoted by $Rds_1$. The transistor 101 operates in a saturation region at least in the case where the threshold voltage is $Vth_1$; accordingly, the difference in resistance between the source electrode and the drain electrode can be expressed as $Rds_0<Rds_1$ even when the transistor 101 is in an on state in the both cases where the threshold voltage of the transistor 101 is $Vth_1$ and where the threshold voltage of the transistor 101 is $Vth_0$. Specifically, when Vgs represents the voltage between the first gate electrode and the source electrode, and when Vds represents the voltage between the source electrode and the drain electrode, the transistor 101 should operate in the range of $|Vds|>|Vgs-Vth_0|$. When the difference in resistance between the source electrode and the drain electrode is expressed as $Rds_0<Rds_1$, the potential Vd of the drain electrode can be determined depending on the level of the potential applied to the second gate electrode in latest data writing performed before data reading even when the voltage between the first gate electrode and the source electrode in data reading is higher than the threshold voltage $Vth_0$. For example, as illustrated in FIG. 2B, when the voltage between the first gate electrode and the source electrode is a voltage Vread' which is higher than the threshold voltage $Vth_0$, it is understood from the line 130 and the line 131 that drain current $Id_1'$ obtained in the case where the threshold voltage is $Vth_1$ is higher than drain current $Id_0'$ obtained in the case where the threshold voltage is $Vth_0$. Therefore, the amount of the drain current Id or the potential Vd of the drain electrode is read, so that the value of written data can be understood.

Then, operation of the transistor 101 in data erasing will be described. In data erasing, a voltage which is equal to or lower than the threshold voltage $Vth_1$ is applied between the first gate electrode and the source electrode of the transistor 101 as in data writing. Specifically, a relation between the potential of the first gate electrode and the potential of the source electrode in data erasing is $(Vcg-Vs) \leq Vth_1$. Therefore, the transistor 101 is in an off state in data erasing and the drain electrode of the transistor 101 has high impedance. In addition, in data erasing, the potential Vbg of the second gate electrode is set to a fixed potential such as a ground potential and the threshold voltage of the transistor 101 is set to $Vth_0$.

Note that in Embodiment 1, although the driving method of a memory device from which written data is erased is explained, the present invention is not limited to this structure. A memory device according to one embodiment of the present invention is different from a conventional flash memory in that data erasing is not necessary, which is one of advantages. Therefore, for example, another data can be written so that the written data is overwritten.

Note that in the case of a normal flash memory, in data writing, a floating gate in which electric charge is accumulated is covered with an insulating film and in an insulating state. Accordingly, a high voltage of approximately 20 V needs to be applied to a memory element in order that electric charge may be accumulated in the floating gate by the use of a tunnel effect. On the other hand, in one embodiment of the present invention, writing and reading can be performed by the use of a transistor including a highly-purified oxide semiconductor film as an active layer of a transistor. Accordingly, a voltage of several volts needed for operation of the memory device, so that power consumption can be remarkably reduced. Note that since a transistor used for a memory element of a flash memory and a transistor used for a memory element according to one embodiment of the present invention are different in structure and driving method, it is difficult to understand the difference in power consumption accurately by a potential applied to each electrode of the memory element. However, for example, when power consumptions only in data writing are compared, data can be adequately written to a memory device according to one embodiment of the present invention in the case where voltage applied between the second gate electrode and the source electrode is 5 V. In contrast, in a normal flash memory, at least a voltage of approximately 16 V is needed to be applied between the gate electrode and the source electrode so that data is written by accumulation of electric charge in a floating gate. The power consumption of the transistor corresponds to the value obtained by dividing the square of the gate voltage of the transistor by the load resistance of the transistor. Thus, it is found that the power consumption of the memory device according to one embodiment of the present invention is approximately 10% of that of the normal flash memory. Accordingly, it is understood from the comparison of power consumption in data writing that the power consumption in operation can be drastically reduced.

Note that in a semiconductor device using a normal flash memory, since voltage needed for operation (operation voltage) of the flash memory is high, voltage applied to the flash memory is usually boosted by the use of a step-up dc-dc converter or the like. However, since the operation voltage of the memory device can be lowered in a memory device according to one embodiment of the present invention, it is possible to reduce power consumption. Accordingly, a load of an external circuit used for operation of the memory device, such as a step-up dc-dc converter, in a semiconductor device can be decreased, so that the functions of the external circuit are expanded, and the higher performance of the semiconductor device can be realized. Further, the operation voltage of the memory device can be lowered, so that redundant circuit design which is needed to cover a failure caused by high operation voltage is unnecessary; therefore, the integration density of an integrated circuit used for the semiconductor device can be increased, and a higher-performance semiconductor device can be formed.

Further, in Embodiment 1, although the driving method when binary digital data is used is described, the memory device of the present invention can also use multivalued data, that has three or more values. In the case where multivalued data which has three or more values is used, three or more levels of the potential Vbg of the second gate electrode is allowed to be selected in data writing. Since the value of the threshold voltage is controlled by the potential Vbg of the second gate electrode, by employing the above structure, three or more levels of the threshold voltage can be set in accordance with the levels of the potential Vbg of the second gate electrode. Multivalued data can be read using the difference in drain current caused by the difference in the level of the threshold voltage or the difference in resistance between the source electrode and the drain electrode caused by the difference in the level of the threshold voltage. Further, as another method, voltages whose levels are slightly higher than the level of the threshold voltage are prepared in advance, and the voltages are applied to the first gate electrode so that data is read in accordance with the level of the threshold voltage. For example, in the case where four-valued data is read, four voltages (Vread0, Vread1, Vread2, Vread3) which are slightly higher than four-level threshold voltages ($Vth_0$, $Vth_1$, $Vth_2$, $Vth_3$) are prepared in advance, and data is read four times by the use of the four voltages; therefore, the four-valued data can be read. By the above structure, the memory capacity of the memory device can be increased while preventing an enlargement of the area of the memory device.

Note that in the case of multivalued data which has three or more values in the data, since the difference between the levels of the threshold voltages becomes smaller as the number of values is increased to four, five, and six, for example. Thus, the potential of the second gate electrode is changed if a slight amount of off-state current exists; in such a state, it is difficult to maintain the accuracy of data, and a holding period tends to be further short. However, in one embodiment of the present invention, since a transistor whose off-state current is drastically reduced by the use of a highly-purified oxide semiconductor film is used as a switching element, generation of off-state current can be prevented more effectively as compared to a transistor including silicon. Accordingly, decrease in a holding period due to value multiplexing can be suppressed.

In addition, FIG. 1B illustrates the case where the transistor 102 which functions as a switching element is a bottom-gate transistor including the oxide semiconductor film 113 over the gate electrode 111. However, the transistor 102 is not limited to a bottom-gate transistor. It is acceptable as long as the transistor 102 includes an oxide semiconductor film as an active layer. For example, the transistor 102 may be a top-gate transistor including a gate electrode over an oxide semiconductor film. Further, the transistor 102 is not limited to a top-contact transistor in which the source electrode 114 and the drain electrode 115 are formed over the oxide semiconductor film 113. The transistor 102 may be a bottom-contact transistor in which the oxide semiconductor film 113 is formed over the source electrode 114 and the drain electrode 115. Furthermore, although the transistor 102 is a channel-etched transistor in which the thickness of part of the oxide semiconductor film 113 which overlaps with the insulating film 116 between the source electrode 114 and the drain electrode 115 is smaller than other portions, the present invention is not limited to this structure. The transistor 102 may be a channel-protective transistor in which a channel protective film is provided between the source electrode 114 and the drain electrode 115 and over the oxide semiconductor film 113 in order to prevent damage caused by plasma in etching for forming the source electrode 114 and the drain electrode 115, reduction in film thickness by etching, or the like.

Figure 3A:
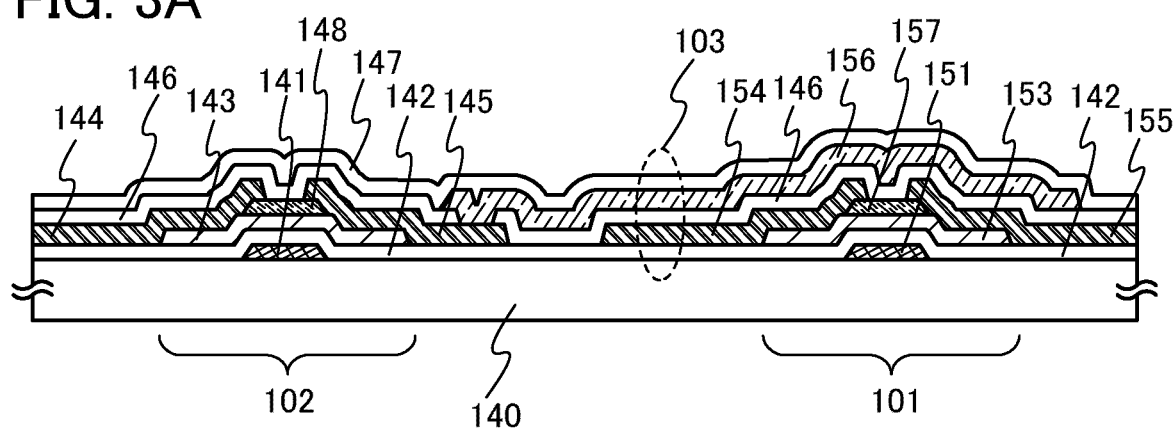
FIGS. 3A and 3B each illustrate a structure of a memory cell.

FIG. 3A illustrates one example of a cross-sectional view of the memory cell 100 with the circuit structure in FIG. 1A. In the memory cell in FIG. 3A, the transistor 101 which is a channel-protective transistor and functions as a memory element and the transistor 102 which is a channel-protective transistor and functions as a switching element are formed over a substrate 140 having an insulating surface.

Specifically, the transistor 101 includes, over the substrate 140 having an insulating surface, a first gate electrode 151; an insulating film 142 over the first gate electrode 151; an oxide semiconductor film 153 which overlaps with the first gate electrode 151 with the insulating film 142 provided therebetween and functions as an active layer; a channel protective film 157 which overlaps with the gate electrode 151 over the oxide semiconductor film 153; a source electrode 154 and a drain electrode 155 over the oxide semiconductor film 153; an insulating film 146 over the oxide semiconductor film 153, the channel protective film 157, the source electrode 154 and the drain electrode 155; and a second gate electrode 156 which overlaps with the oxide semiconductor film 153 over the insulating film 146. In addition, an insulating film 147 is formed over the second gate electrode 156 and may be included as a component of the transistor 101.

In addition, the transistor 102 includes, over the substrate 140 having an insulating surface, a gate electrode 141; the insulating film 142 over the gate electrode 141; the oxide semiconductor film 143 which overlaps with the gate electrode 141 with the insulating film 142 provided therebetween and functions as an active layer; a channel protective film 148 over the oxide semiconductor film 143; and a source electrode 144 and a drain electrode 145 over the oxide semiconductor film 143. The insulating film 146 is formed over the oxide semiconductor film 143, the channel protective film 148, the source electrode 144, and the drain electrode 145, and may be included as a component of the transistor 102.

Further, the capacitor 103 is formed in a region where the source electrode 154 and the second gate electrode 156 of the transistor 101 overlap with each other with the insulating film 146 provided therebetween.

The channel protective film 157 and the channel protective film 148 can be formed by chemical vapor deposition such as plasma CVD or thermal CVD method, or sputtering. In addition, the channel protective film 157 and the channel protective film 148 are preferably formed using an inorganic material including oxygen (such as silicon oxide, silicon oxynitride, or silicon nitride oxide). By the use of an inorganic material including oxygen for the channel protective film 157 and the channel protective film 148, it is possible to satisfy the stoichiometric composition ratio by the following method: oxygen is supplied to at least regions of the oxide semiconductor film 153 and the oxide semiconductor film 143 that are in contact with the channel protective film 157 and the channel protective film 148, respectively, and oxygen deficiency serving as a donor is reduced even if oxygen deficiency is caused by heat treatment for reduction of moisture or hydrogen in the oxide semiconductor film 153 and the oxide semiconductor film 143. Therefore, the channel formation region can be intrinsic or substantially intrinsic, and variation in electrical characteristics of a transistor caused by oxygen deficiency is reduced; accordingly, the electrical characteristics can be improved.

Note that a channel formation region corresponds to a region of a semiconductor film, which overlaps with a gate electrode with a gate insulating film provided between the semiconductor film and the gate electrode. In the case of a transistor used as a memory element, a channel formation region corresponds to a region of a semiconductor film, which is between a source electrode and a drain electrode and which overlaps with a first gate electrode or a second gate electrode with a gate insulating film provided between the semiconductor film and the first gate electrode or a second gate electrode.

Figure 3B:
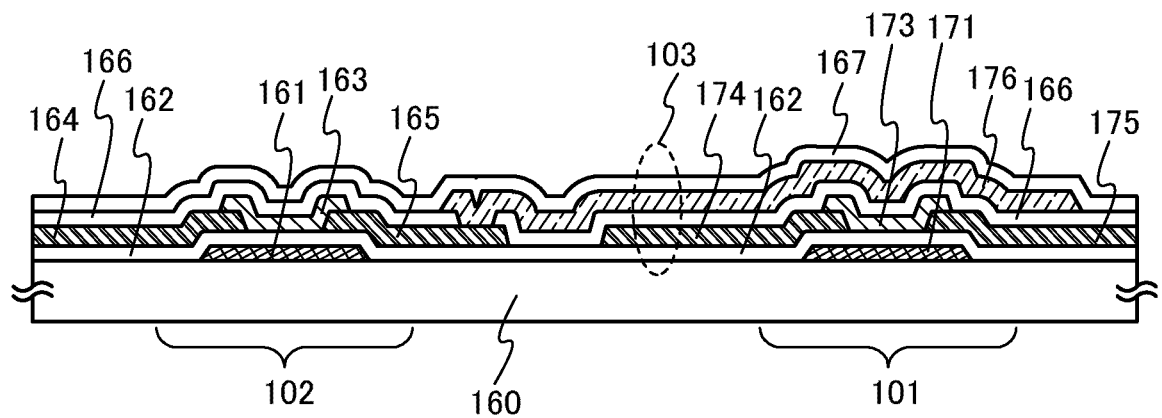

Then, FIG. 3B illustrates one example of a cross-sectional view of the memory cell 100 with the circuit structure in FIG. 1A. The memory cell in FIG. 3B includes the transistor 101 which is a bottom-contact transistor and which functions as a memory element and the transistor 102 which is a bottom-contact transistor and functions as a switching element over a substrate 160 having an insulating surface.

Specifically, the transistor 101 includes, over the substrate 160 having an insulating surface, a first gate electrode 171; an insulating film 162 over the first gate electrode 171; a source electrode 174 and a drain electrode 175 over the insulating film 162; an oxide semiconductor film 173 which overlaps with the first gate electrode 171 with the insulating film 162 provided therebetween, is in contact with the source electrode 174 and the drain electrode 175, and functions as an active layer; an insulating film 166 over the oxide semiconductor film 173, the source electrode 174, and the drain electrode 175; and a second gate electrode 176 which overlaps with the oxide semiconductor film 173 over the insulating film 166. In addition, the insulating film 167 is formed over the second gate electrode 176 and may be included as a component of the transistor 101.

Further, the transistor 102 includes, over the substrate 160 having an insulating surface, the insulating film 162 over the gate electrode 161; a source electrode 164 and a drain electrode 165 over the insulating film 162; and an oxide semiconductor film 163 which overlaps with the gate electrode 161 with the insulating film 162 therebetween, is in contact with the source electrode 164 and the drain electrode 165, and functions as an active layer. The insulating film 166 is formed over the oxide semiconductor film 163, the source electrode 164, and the drain electrode 165 and may be included as a component of the transistor 102.

Further, the capacitor 103 is formed in a region where the source electrode 174 and the second gate electrode 176 of the transistor 101 overlap with each other with the insulating film 166 provided therebetween.

In addition, in FIG. 1A, FIG. 3A, and FIG. 3B illustrate the case where an oxide semiconductor film is used for the active layer of the transistor 101 which functions as a memory element. However, as described above, for the active layer of the transistor 101, the following semiconductor other than the oxide semiconductor may also be used: amorphous silicon, microcrystalline silicon, polycrystalline silicon, single crystalline silicon, amorphous germanium, microcrystalline germanium, polycrystalline germanium, single crystalline germanium, or the like.

Figure 4A:
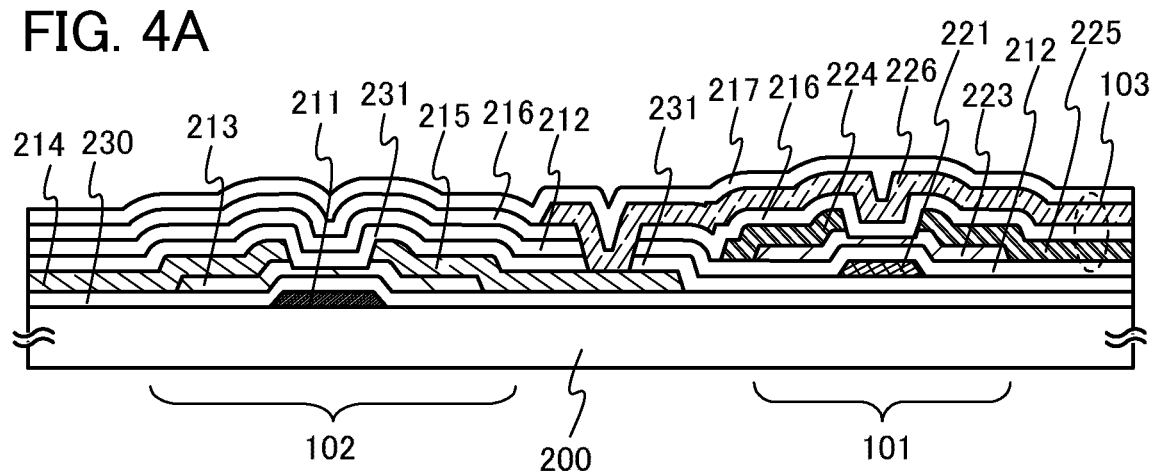
FIGS. 4A and 4B each illustrate a structure of a memory cell.

FIG. 4A illustrates one example of a cross-sectional view of the memory cell 100 when a semiconductor film including silicon is used for the active layer of the transistor 101 which functions as a memory element. In the memory cell in FIG. 4A, the transistor 101 which functions as a memory element and the transistor 102 which functions as a switching element are formed over a substrate 200 having an insulating surface.

Specifically, the transistor 102 includes, over the substrate 200 having an insulating surface, a gate electrode 211; an insulating film 230 over the gate electrode 211; an oxide semiconductor film 213 which overlaps with the gate electrode 211 with the insulating film 230 provided therebetween and functions as an active layer; and a source electrode 214 and a drain electrode 215 over the oxide semiconductor film 213. An insulating film 231 is formed over the oxide semiconductor film 213, the source electrode 214, and the drain electrode 215 and may be included as a component of the transistor 102.

Further, the transistor 101 includes, over the insulating film 231 formed over the substrate 200 having an insulating surface, a first gate electrode 221; an insulating film 212 over the first gate electrode 221; a semiconductor film 223 which overlaps with the first gate electrode 221 with the insulating film 212 provided therebetween and functions as an active layer including silicon; a source electrode 224 and a drain electrode 225 over the semiconductor film 223; an insulating film 216 over the semiconductor film 223, the source electrode 224, and the drain electrode 225; and a second gate electrode 226 which overlaps with the semiconductor film 223 over the insulating film 216. In addition, an insulating film 217 is formed over the second gate electrode 226 and may be included as a component of the transistor 101.

Further, the capacitor 103 is formed in a region where the drain electrode 225 and the second gate electrode 226 of the transistor 101 overlap with each other with the insulating film 216 provided therebetween.

Figure 4B:
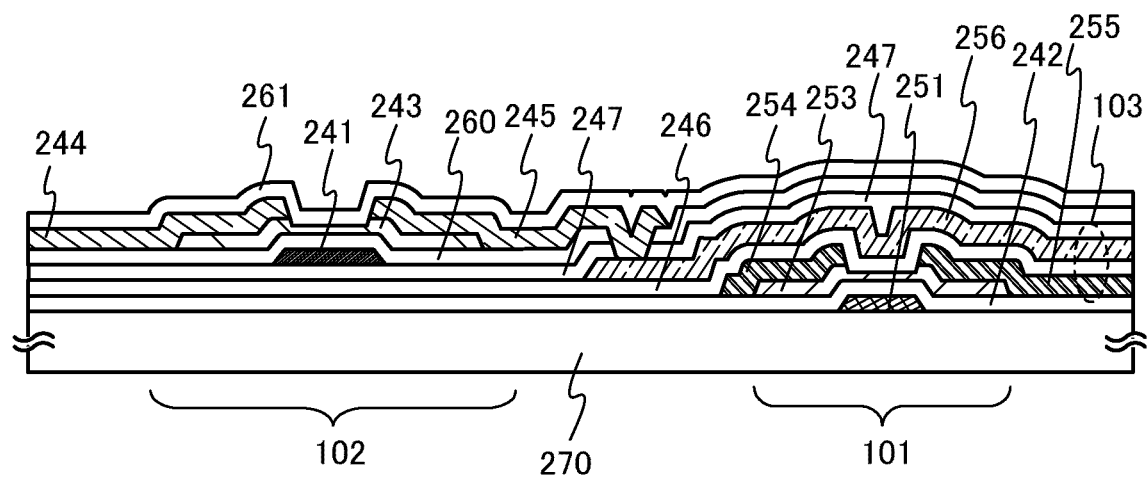

Then, FIG. 4B illustrates one example of a cross-sectional view of the memory cell 100 when a semiconductor film including silicon is used for the active layer of the transistor 101 which functions as a memory element. In the memory cell in FIG. 4B, the transistor 101 which functions as a memory element and the transistor 102 which functions as a switching element are formed over a substrate 270 having an insulating surface.

Specifically, the transistor 102 includes, over an insulating film 247 formed over the substrate 270, a gate electrode 241; an insulating film 260 over the gate electrode 241; an oxide semiconductor film 243 which overlaps with the gate electrode 241 with the insulating film 260 provided therebetween and functions as an active layer; and a source electrode 244 and a drain electrode 245 over the oxide semiconductor film 243. An insulating film 261 is formed over the oxide semiconductor film 243, the source electrode 244, and the drain electrode 245 and may be included as a component of the transistor 102.

In addition, the transistor 101 includes, over the substrate 270, a first gate electrode 251; an insulating film 242 over the first gate electrode 251; a semiconductor film 253 which overlaps with the first gate electrode 251 with the insulating film 242 provided therebetween and functions as an active layer including silicon; a source electrode 254 and a drain electrode 255 over the semiconductor film 253; an insulating film 246 over the semiconductor film 253, the source electrode 254, and the drain electrode 255; and a second gate electrode 256 which overlaps with the semiconductor film 253 over the insulating film 246. In addition, the insulating film 247 is formed over the second gate electrode 256 and may be included as a component of the transistor 101.

Further, the capacitor 103 is formed in a region where the drain electrode 255 and the second gate electrode 256 of the transistor 101 overlap with each other with the insulating film 246 provided therebetween.

Note that although FIG. 4A and FIG. 4B illustrate the case where the transistor 101 is a bottom-gate transistor, the transistor 101 may be either a top-gate transistor or a bottom-contact transistor. In addition, although the transistor 101 is a channel-etched transistor, the transistor 101 may be a channel-protective transistor. Further, although FIG. 4A and FIG. 4B illustrate the case where the transistor 102 is a bottom-gate transistor, the transistor 102 may be a top-gate transistor or a bottom-contact transistor. In addition, although the transistor 102 is a channel-etched transistor, the transistor 102 may be a channel-protective transistor.

Embodiment 2

In Embodiment 2, an example of a structure of a memory device including a plurality of memory cells and a driving method thereof will be described.

Figure 5:
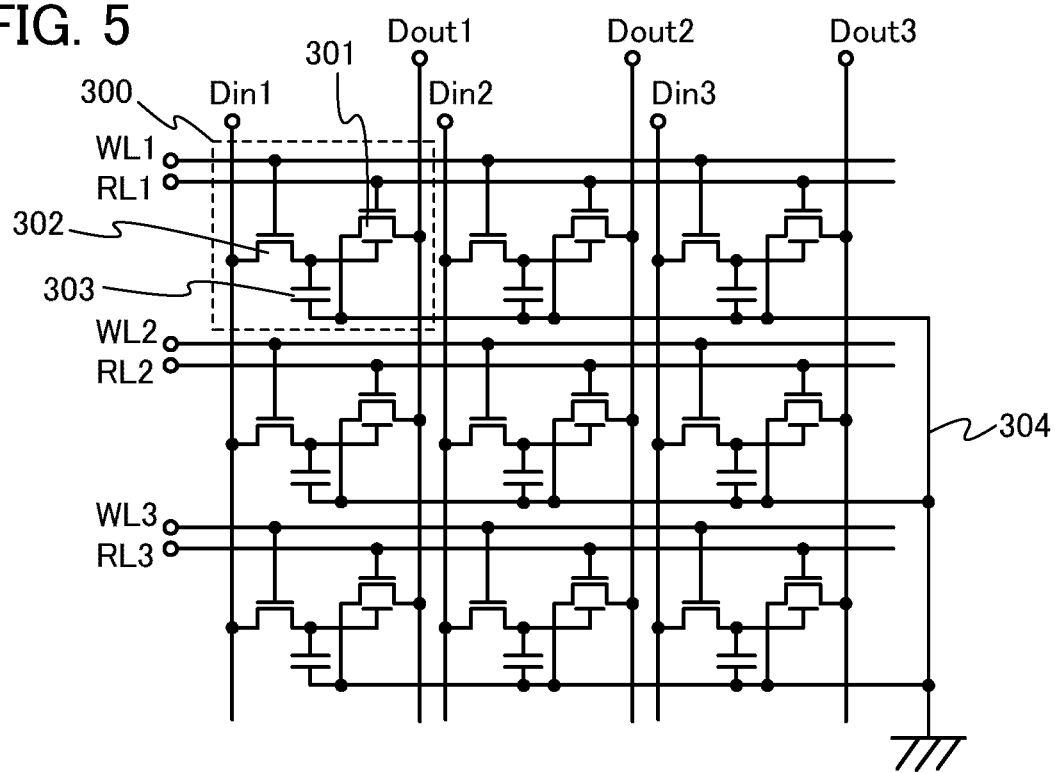
FIG. 5 illustrates a structure of a cell array.

As an example, FIG. 5 illustrates a circuit diagram of a cell array in a NOR-type memory device in which a plurality of memory cells 300 is arranged in matrix. The description of a structure of the memory cell 100 in Embodiment 1 can be referred to for a structure of each memory cell 300 included in the memory device in FIG. 5.

Specifically, the memory cell 300 includes a transistor 301 which functions as a memory element and a transistor 302 which functions as a switching element, and which can control the supply of a potential to a second gate electrode of the transistor 301. In addition, the memory cell 300 may include a capacitor 303 for holding the potential of the second gate electrode of the transistor 301. The memory cell 300 may further include another circuit element such as a diode, a resistor, or an inductor, as necessary.

The cell array in FIG. 5 includes a various kinds of wirings such as a plurality of inputting data lines Din, a plurality of outputting data lines Dout, a plurality of writing word lines WL, and a plurality of reading word lines RL. A power supply potential or a signal from a driver circuit of the cell array is supplied to each of the memory cells 300 through these wirings. Therefore, the number of the wirings can be determined by the number of the memory cells 300 and arrangement of the memory cells 300.

Specifically, the cell array in FIG. 5 includes the memory cells provided in three rows and three columns are arranged in matrix to each other, and at least the inputting data lines Din1 to Din3, the outputting data lines Dout1 to Dout3, the writing word lines WL1 to WL3, and the reading word lines RL1 to RL3 are provided.

Then, one of the memory cells 300 which is connected to the inputting data line Din1, the outputting data line Dout1, the writing word line WL1, and the reading word line RL1 is given as an example of the connection structure of the wirings and circuit elements in the memory cell 300 will be described. A gate electrode of the transistor 302 is connected to the writing word line WL1. One of a source electrode and a drain electrode of the transistor 302 is connected to the inputting data line Din1 and the other of the source electrode and the drain electrode of the transistor 302 is connected to the second gate electrode of the transistor 301. A first gate electrode of the transistor 301 is connected to the reading word line RL1. One of a source electrode and a drain electrode of the transistor 301 is connected to the outputting data line Dout1 and the other of the source electrode and the drain electrode of the transistor 301 is connected to a power supply line 304 supplied with a fixed potential such as a ground potential.

Further, one of a pair of electrodes of the capacitor 303 is connected to the second gate electrode of the transistor 301 and the other of the pair of electrodes of the capacitor 303 is connected to the power supply line 304 supplied with a fixed potential such as a ground potential.

Figure 6:
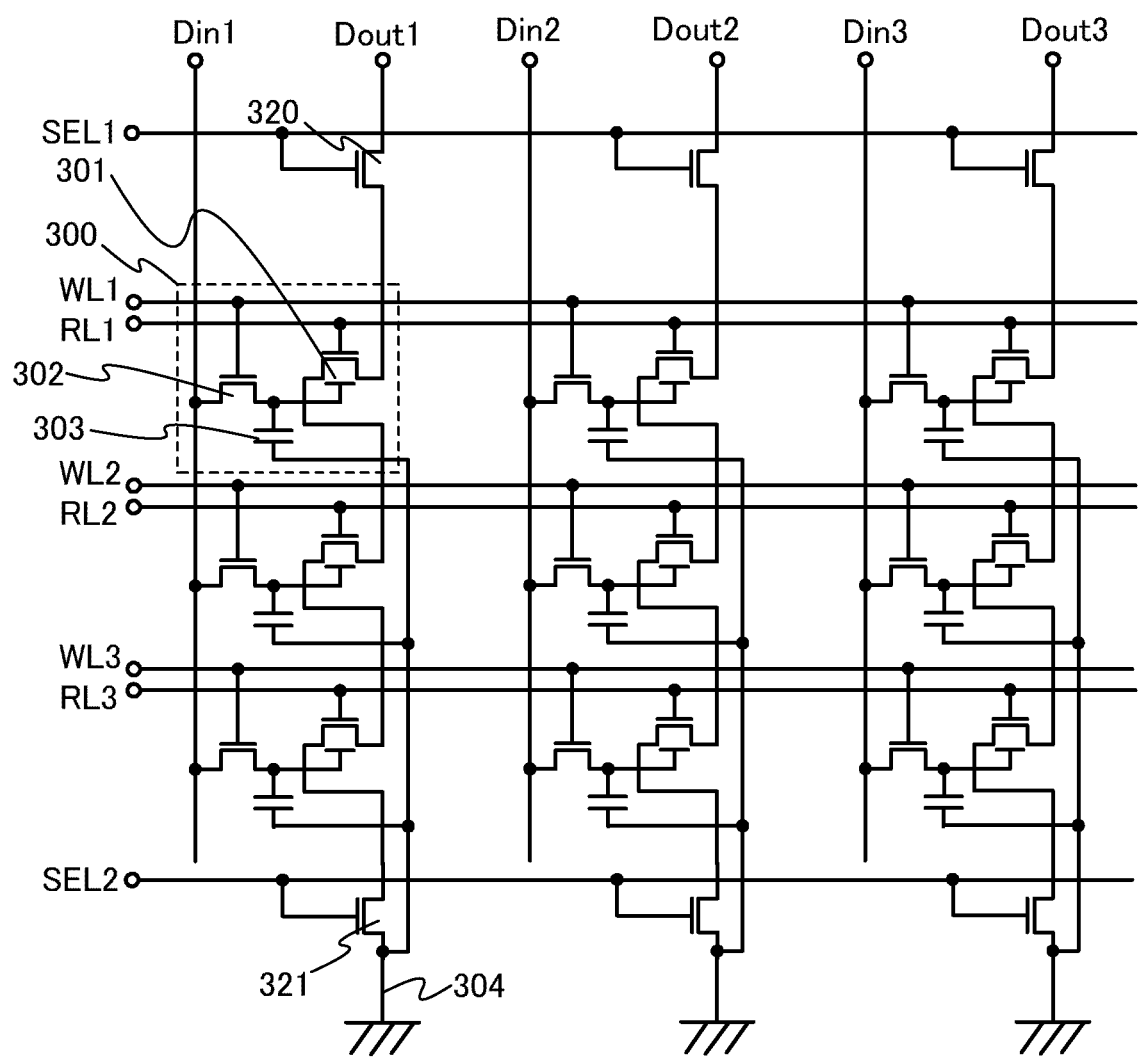
FIG. 6 illustrates a structure of a cell array.

As an example, FIG. 6 illustrates the circuit diagram of a cell array in a NAND-type memory device in which the plurality of memory cells 300 is connected in series. The structure in FIG. 6 is the same as that in FIG. 5, and description of the structure of the memory cell 100 in Embodiment 1 can be referred to for the structure of each memory cell included in the memory device in FIG. 6.

The cell array in FIG. 6 includes three columns of cell arrays in which three memory cells are connected in series. Specifically, the cell array includes the memory cells provided in three rows and three columns, and the inputting data lines Din1 to Din3, the outputting data lines Dout1 to Dout3, the writing word lines WL1 to WL3, the reading word lines RL1 to RL3, selecting signal lines SEL1 and SEL2, and the power supply line 304. A power supply potential or a signal from a driver circuit of the cell array is supplied to each of the memory cells through these wirings. Accordingly, the number of the wirings can be determined by the number of the memory cells 300.

Then, the connection structure of the wirings and circuit elements in the memory cell 300 will be described. For example, the memory cell 300 which is connected to the inputting data line Din1, the outputting data line Dout1, the writing word line WL1, and the reading word line RL1 is focused. The gate electrode of the transistor 302 is connected to the writing word line WL1. One of the source electrode and the drain electrode of the transistor 302 is connected to the inputting data line Din1 and the other of the source electrode and the drain electrode of the transistor 302 is connected to the second gate electrode of the transistor 301. The first gate electrode of the transistor 301 is connected to the reading word line RL1. In addition, the transistors 301 are connected in series among memory cells adjacent to each other between the outputting data line Dout1 and the power supply line 304 supplied with a fixed potential such as a ground potential.

Further, one of the pair of electrodes of the capacitor 303 is connected to the second gate electrode of the transistor 301, and the other of the electrodes of the capacitor 303 is connected to the power supply line 304 supplied with a fixed potential such as a ground potential.

Figure 21:
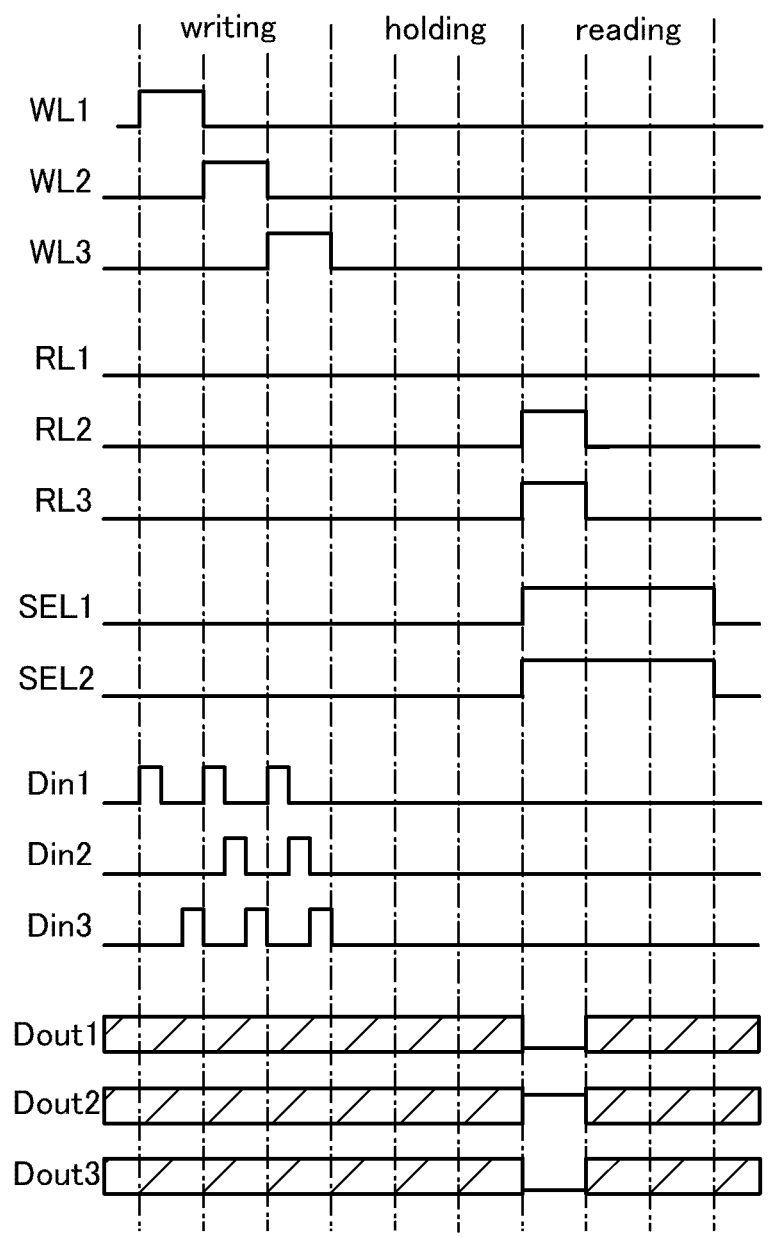
FIG. 21 is a timing diagram illustrating a driving method of a memory device.

Then, the operation of a memory device according to one embodiment of the present invention will be described with reference to FIG. 21 giving the cell array in FIG. 6 as an example. FIG. 21 is a timing diagram illustrating a change in the potential of signals input to wirings over time. FIG. 21 illustrates the case where the transistor 301 and the transistor 302 are n-channel transistors and binary data is used.

First, the operation of the memory device in data writing will be described. In data writing, when a signal with a pulse is input to the writing word line WL1, the potential of the pulse, specifically, a high-level potential, is supplied to the gate electrode of the transistor 302. Each transistor 302 whose gate electrode is connected to the writing word line WL1 is in an on state. Meanwhile, when a low-level potential is input to the reading word line RL1, a low-level potential is supplied to the first gate electrode of the transistor 301. Each transistor 301 whose first gate electrode is connected to the reading word line RL1 is in an off state.

Then, signals with data are sequentially input to the inputting data lines Din1 to Din3. FIG. 21 illustrates the case where signals with high-level potentials are input to the inputting data line Din1 and the inputting data line Din3, and a signal with a low-level potential is input to the inputting data line Din2. Needless to say, the levels of the potentials of signals input to the inputting data lines Din1 to Din3 are varied depending on data.

The potentials input to the inputting data lines Din1 to Din3 are supplied to the second gate electrode of the transistor 301 through the transistors 302 which are in an on state. The amount of shift in the threshold voltage of the transistor 301 is determined in accordance with the potential of the second gate electrode. Specifically, since signals with high-level potentials are input to the inputting data line Din1 and the inputting data line Din3, the potential of the second gate electrode of the transistor 301 is at a high level in each of the memory cell 300 which is connected to the inputting data line Din1 and the memory cell 300 which is connected to the inputting data line Din3. That is, in such a memory cell 300, the transistor 301 which functions as a memory element operates on the basis of the line 130 in FIG. 2B. On the other hand, since a signal with a low-level potential is input to the inputting data line Din2, the potential of the second gate electrode of the transistor 301 is at a low level in each of the memory cells 300 which are connected to the inputting data line Din2. That is, in such a memory cell 300, the transistor 301 which functions as a memory element operates on the basis of the line 131 in FIG. 2B.

When the input of a signal with a pulse to the writing word line WL1 is finished, each transistor 302 whose gate electrode is connected to the writing word line WL1 is turned off. Then, signals with pulses are sequentially input to the writing word line WL2 and the writing word line WL3, and the above operation is similarly repeated in a memory cell including the writing word line WL2 and each memory cell including the writing word line WL3.

Then, the operation of the memory device in data storing will be described. In data storing, all of the writing word lines WL1 to WL3 are supplied with potentials with levels at which the transistor 302 is turned off, specifically, low-level potentials. Since, the off-state current of the transistor 302 is extremely low as described above, the level of the potential of the second gate electrode set in data writing is held. Low-level potentials are supplied to all of the reading word lines RL1 to RL3.

In the timing diagram of FIG. 21, a holding period is provided in order to describe the operation of data storing. However, a holding period is not necessarily provided for actual operation of a memory.

Then, the operation of the memory device in data reading will be described. In data reading, as in data storing, all of the writing word lines WL1 to WL3 are supplied with potentials with levels at which the transistor 302 is turned off, specifically, low-level potentials.

In a NAND-type memory device, adjacent memory cells are connected to each other in series between an outputting data line and a power supply line which is supplied with a fixed potential such as a ground potential. In the case where data in a memory cell is to be read, stored binary data can be distinguished by whether the outputting data line to which the memory cell is connected is in conductive state with the power supply line supplied with a fixed potential such as a ground potential by control of memory cells connected to the same outputting data line as the memory cell.

Specifically, the memory cell 300 which is connected to the inputting data line Din1, the outputting data line Dout1, the writing word line WL1, and the reading word line RL1 is focused, and the case where high-level data stored in the memory cell 300 is read is considered. In order to select the outputting data line Dout1 to which the memory cell 300 is connected, SEL1 and SEL2 are made to have high-level potentials so that a transistor 320 connected to SEL1 and a transistor 321 connected to SEL2 are made to be in an on state. Then, the reading word line RL1 connected to the first gate electrode of the transistor 301 in the memory cell 300 has a low-level potential. Further, the reading word lines RL2 and RL3 are supplied with high-level potentials so that each transistor 301 connected to the reading word lines RL2 and RL3 may be turned on. High-level data is written to the second gate electrode of the transistor 301 of the memory cell 300. That is, the threshold voltage is shifted to the negative side in accordance with operation of the transistor 301 which functions as a memory element which is illustrated in FIG. 2B and becomes $Vth_1$. Therefore, the transistor 301 is in an on state. Accordingly, each transistor connected to the outputting data line Dout1 is in an on state, and the outputting data line Dout1 and the power supply line supplied with ground are brought into conduction, so that the outputting data line Dout1 is made to have substantially the same potential as a ground.

Sequentially, the memory cell 300 which is connected to the inputting data line Din2, the outputting data line Dout2, the writing word line WL1, and the reading word line RL1 is focused, and the case where low-level data stored in the memory cell 300 is read is considered. In order to select the outputting data line Dout2, SEL1 and SEL2 are made to have low-level potentials so that a transistor 320 connected to SEL1 and a transistor 321 connected to SEL2 are turned on. Then, the reading word line RL1 connected to the first gate electrode of the transistor 301 in the memory cell 300 has a low-level potential. Further, the reading word lines RL2 and RL3 are supplied with high-level potentials so that each transistor 301 connected to the reading word lines RL2 and RL3 may be turned on. Low-level data is written to the second gate electrode of the transistor 301 of the memory cell 300. That is, the threshold voltage is not shifted in accordance with operation of the transistor 301 which functions as a memory element which is illustrated in FIG. 2B and becomes $Vth_0$. Therefore, the transistor 301 is in an off state. Accordingly, the outputting data line Dout2 and the power supply line supplied with ground are out of conduction, and the outputting data line Dout2 is made to have high impedance.

Note that each of the outputting data lines Dout is connected to a reading circuit, and an output signal of the reading circuit is the actual output of a memory.

Note that in Embodiment 2, when an outputting data line is selected in data reading, the case where two selecting signal lines SEL1 and SEL2 and transistors whose gate electrodes are connected to the signal lines are used is illustrated. Since it is acceptable as long as whether the outputting data line and a reading circuit connected thereto are brought into or out of conduction can be selected when the outputting data line is selected in data reading, At least one selecting signal line and a transistor connected to the selecting signal line may be provided.

Although in Embodiment 2, a driving method in which writing, storing, and reading of data are sequentially performed in a plurality of memory cells is described, the present invention is not limited to this structure. Only a memory cell with the specified address may be subjected to the above operation.

In addition, in the cell array in FIG. 6, four wirings (the inputting data line Din, the outputting data line Dout, the writing word line WL, and the reading word line RL) are connected to each memory cell. However, in a memory device of the present invention, the number of wirings connected to each memory cell is not limited to four. The number of wirings and a connection structure may be determined as appropriate so that the memory cell 300 can be supplied with a signal controlling on/off of the transistor 301, a signal for controlling switching of the transistor 302, and a signal for supplying a potential to the second gate electrode of the transistor 301, and a potential which has the amount of the drain current of the transistor 301 or resistance between the source electrode and the drain electrode as data can be transmitted to a driver circuit.

Note that in the timing diagram in FIG. 21, shaded portions in the outputting data lines Dout1, Dout2, and Dout3 indicate a state in which data is not determined. Further, although each signal rises and falls vertically, it is easily understood by those skilled in the art that the waveforms of actual signals are dulled due to the influence of a load of a signal line, noise, or the like.

Figure 7:
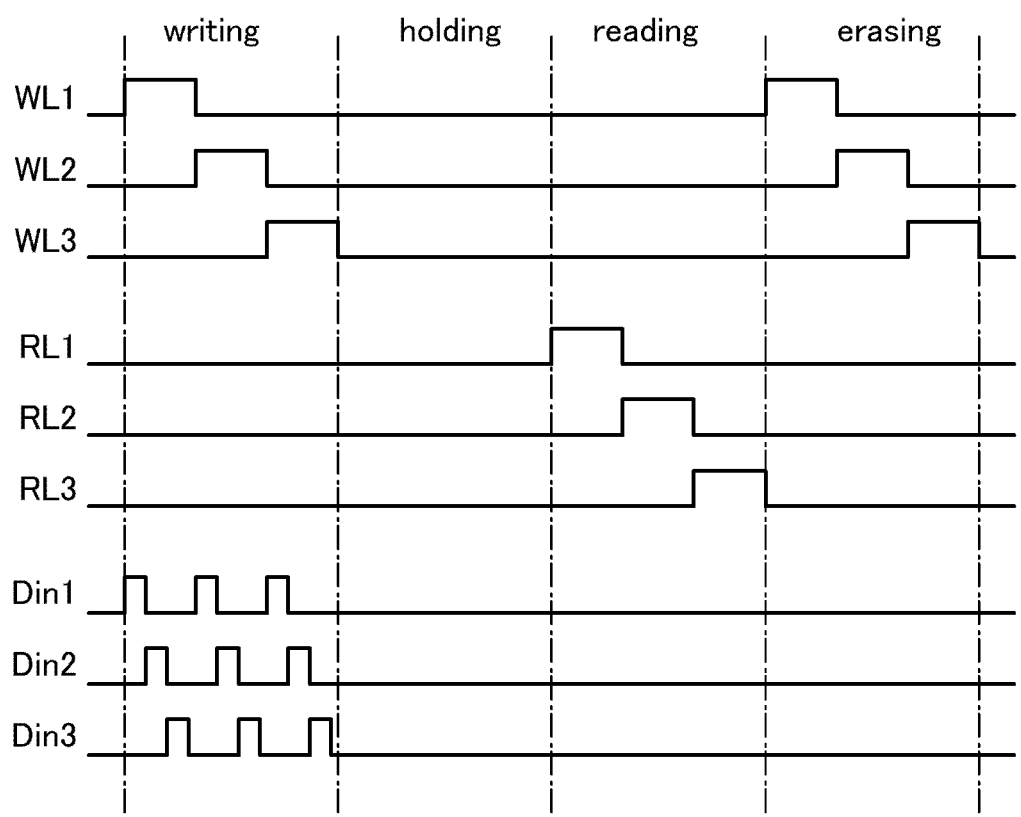
FIG. 7 is a timing diagram illustrating a driving method of a memory device.

Then, the operation of a memory device according to one embodiment of the present invention will be described with reference to FIG. 7 giving the cell array in FIG. 5 as an example. FIG. 7 is a timing diagram illustrating a change in the potential of signals input to wirings over time. FIG. 7 illustrates the case where the transistor 301 and the transistor 302 are n-channel transistors and binary data is used.

First, the operation of the memory device in data writing will be described. In data writing, when a signal with a pulse is input to the writing word line WL1, the potential of the pulse, specifically, a high-level potential, is supplied to the gate electrode of the transistor 302. Each transistor 302 whose gate electrode is connected to the writing word line WL1 is in an on state. On the other hand, a signal having a potential lower than $Vth_1$ in FIG. 2B illustrating the operation of a transistor which functions as a memory element is input to the reading word line RL1; thus, each transistor 301 whose first gate electrode is connected to the reading word line RL1 is kept off.

Then, signals with data are sequentially input to the inputting data lines Din1 to Din3. Although FIG. 7 illustrates the case where a signal with a high-level potential is input to each of the inputting data lines Din1 to Din3. Needless to say, the levels of the potentials of signals input to the inputting data lines Din1 to Din3 are varied depending on the content of data. Further, in the case where binary data is used, it is acceptable as long as the potentials of signals input to the inputting data lines Din1 to Din3 correspond to two kinds of power supply voltages (e.g., Vdd and Vss). In the case where multivalued data with three or more values is used, the kinds of levels of potentials may be determined on the basis of a cardinal number used in the data.

The potentials input to the inputting data lines Din1 to Din3 are supplied to the second gate electrode of the transistor 301 through the transistors 302 which are in an on state. The amount of shift in the threshold voltage of the transistor 301 is determined in accordance with the potential of the second gate electrode.

When the input of a signal with a pulse to the writing word line WL1 is finished, each transistor 302 whose gate electrode is connected to the writing word line WL1 is turned off. Then, signals with pulses are sequentially input to the writing word line WL2 and the writing word line WL3, and the above operation is similarly repeated in a memory cell with the writing word line WL2 and each memory cell with the writing word line WL3.

Then, the operation of the memory device in data storing will be described. In data storing, all of the writing word lines WL1 to WL3 are supplied with potentials with levels at which the transistor 302 is turned off, specifically, low-level potentials. Since, the off-state current of the transistor 302 is extremely low as described above, the level of the potential of the second gate electrode set in data writing is held. Further, all of the reading word lines RL1 to RL3 are supplied with potentials with levels in which the transistor 301 is turned off, specifically, a potential lower than $Vth_1$ in FIG. 2B illustrating the operation of a transistor which functions as a memory element.

In the timing diagram of FIG. 7, a holding period is provided in order to describe the operation of data storing. However, a holding period is not necessarily provided for actual operation of a memory.

Then, the operation of the memory device in data reading will be described. In data reading, as in data storing, all of the writing word lines WL1 to WL3 are supplied with a potential with a level in which the transistor 302 is turned off, specifically, a low-level potential.

On the other hand, in data reading, signals with pulses are sequentially input to the reading word lines RL1 to RL3. Specifically, first, when a signal with a pulse is input to the reading word line RL1, the potential of the pulse, specifically, a potential higher than $Vth_1$ in FIG. 2B illustrating the operation of a transistor which functions as a memory element and lower than $Vth_0$ or a potential higher than $Vth_0$ is applied to the first gate electrode of the transistor 301. When the first gate electrode of the transistor 301 is supplied with the potential higher than $Vth_1$ in FIG. 2B illustrating the operation of a transistor which functions as a memory element and lower than $Vth_0$ or the potential higher than $Vth_0$, the drain current or the resistance between the source electrode and the drain electrode of the transistor 301 is determined in accordance with the threshold voltage set in latest data writing before data reading.

A potential having the amount of the drain current of the transistor 301 or a value of the resistance between the source electrode and the drain electrode of the transistor 301 as data, that is, the potential of one of the source electrode and the drain electrode of the transistor 301 which is connected to the outputting data lines Dout1 to Dout3 is supplied to the driver circuit through the outputting data lines Dout1 to Dout3.

Note that the levels of potentials supplied to the outputting data lines Dout1 to Dout3 are determined in accordance with data written to the memory cells. Accordingly, in an ideal view, potentials having the same level should be supplied to all of the outputting data lines connected to the memory cells when data with the same value is stored in the plurality of memory cells. However, actually, there is a case where the characteristics of the transistor 301 or the transistor 302 are varied among the memory cells; thus, the potentials supplied to the outputting data lines are varied even if all of data to be read has the same value, so that values of potentials can be widely distributed sometimes. Accordingly, a reading circuit in which a signal including data read from the above potentials and having amplitude and waveforms processed in accordance with the desired specification can be generated even when a little variation occurs in the potentials supplied to the outputting data lines Dout1 to Dout3, is provided in the memory device as the driver circuit.

Figure 9:
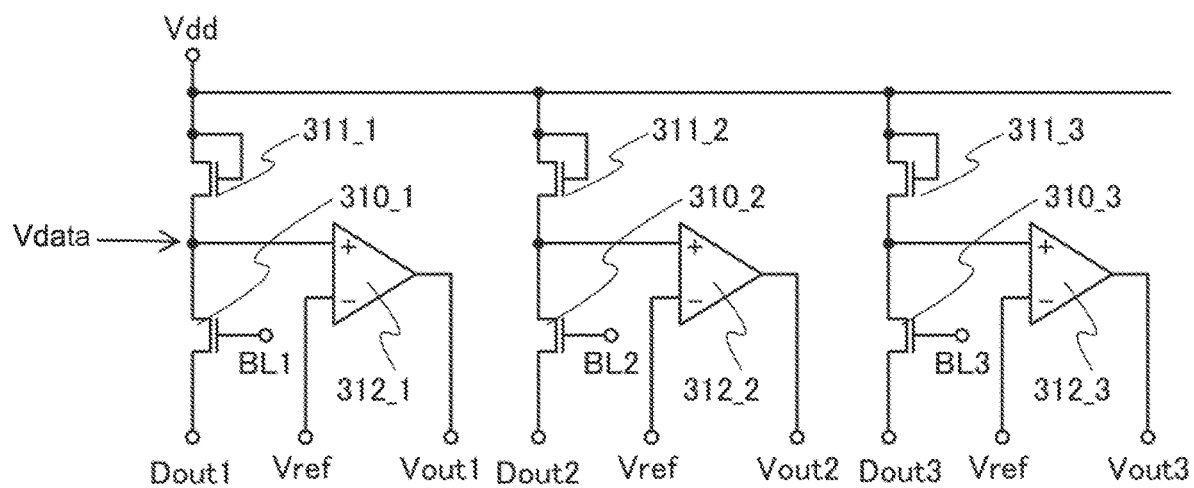
FIG. 9 illustrates a structure of a reading circuit.

FIG. 9 illustrates an example of a circuit diagram of a reading circuit. The reading circuit in FIG. 9 includes transistors 310_1 to 310_3 which function as switching elements for controlling the input of the potentials of the outputting data lines Dout1 to Dout3 to the reading circuit, and transistors 311_1 to 311_3 which function as resistors. In addition, the reading circuit in FIG. 9 includes operational amplifiers 312_1 to 312_3.

Specifically, gate electrodes of the transistors 311_1 to 311_3 are connected to drain electrodes of the transistors 311_1 to 311_3, respectively. In addition, the high-level power supply potential Vdd is supplied to the gate electrodes and the drain electrodes. Further, source electrodes of the transistors 311_1 to 311_3 are connected to non-inverting input terminals (+) of the operational amplifiers 312_1 to 312_3, respectively. Accordingly, the transistors 311_1 to 311_3 function as resistors connected between nodes supplied with the power supply potential Vdd and the non-inverting input terminals (+) of the operational amplifiers 312_1 to 312_3. Note that although in FIG. 9, the transistor whose gate electrode is connected to the drain electrode is used as a resistor, the present invention is not limited to this. Alternatively, an element functioning as a resistor can be used.

Further, gate electrodes of the transistors 310_1 to 310_3 which function as switching elements are connected to bit lines BL1 to BL3, respectively. Then, connections between the outputting data lines Dout1 to Dout3 and the source electrodes of the transistors 311_1 to 311_3 are controlled in accordance with potentials of the bit lines BL1 to BL3

For example, when the transistor 310_1 is turned on, the transistor 301 in the memory cell 300 and the transistor 311_1 in the reading circuit are connected in series. Then, a potential Vdata at a node of the connection is supplied to the non-inverting input terminals (+) of the operational amplifiers 312_1 to 312_3. The level of the potential Vdata is determined in accordance with the ratio of the resistance between the source electrode and the drain electrode of the transistor 301 to the resistance between the source electrode and the drain electrode of the transistor 311_1; thus, the level of the potential Vdata reflects the value of read data.

In contrast, inverting input terminals (−) of the operational amplifiers 312_1 to 312_3 are supplied with a reference potential Vref. The levels of the potentials of output terminals Vout can be varied depending on the level of the potential Vdata with respect to the reference potential Vref. Thus, a signal which indirectly includes data can be obtained.

Note that even if data with the same value is stored in memory cells, fluctuation in levels of the read potential Vdata occurs due to variation in characteristics of the memory cells, so that values of potentials can be widely distributed sometimes. The level of the reference potential Vref is determined in consideration of fluctuation in the potential Vdata of node in order to read the value of data accurately.

In addition, although in FIG. 9, one operational amplifier used for reading data is used for each outputting data line, the number of operational amplifiers is not limited to this. When n-valued data (n is a natural number of 2 or more) is used, the number of operational amplifiers used for each outputting data line is (n−1).

Then, the operation of the memory device in data erasing will be described. In data erasing, as in data writing, when a signal with a pulse is input to the writing word line WL1, the potential of the pulse, specifically, a high-level potential, is supplied to the gate electrode of the transistor 302. Each transistor 302 whose gate electrode is connected to the writing word line WL1 is in an on state. On the other hand, a signal having a potential lower than $Vth_1$ in FIG. 2B illustrating the operation of a transistor which functions as a memory element is input to the reading word line RL1; thus, each transistor 301 whose first gate electrode is connected to the reading word line RL1 is kept off.

Fixed potentials such as ground potentials are supplied to the inputting data lines Din1 to Din3. FIG. 7 illustrates the case where signals with low-level potentials are input to all of the inputting data lines Din1 to Din3. The low-level fixed potentials at a low level input to the inputting data lines Din1 to Din3 is supplied to the second gate electrode of the transistor 301 through the transistor 302 in an on state. The level of the threshold voltage of the transistor 301 is reset in accordance with the potential of the second gate electrode.

When the input of a signal with a pulse to the writing word line WL1 is finished, each transistor 302 whose gate electrode is connected to the writing word line WL1 is turned off. Then, signals with pulses are sequentially input to the writing word line WL2 and the writing word line WL3, and the above operation is similarly repeated in a memory cell with the writing word line WL2 and each memory cell with the writing word line WL3.

In a timing diagram of FIG. 7, an erasing period is provided to describe operation of erasing. However, in actual operation of the memory, the erasing period is not necessarily. In this case, another data may be written so as to overwrite the written data. A memory device according to one embodiment of the present invention has an advantage in that an erasing period is not necessarily provided.

Although in Embodiment 2, a driving method in which writing, storing, reading, and erasing of data are sequentially performed in a plurality of memory cells is described, the present invention is not limited to this structure. Only a memory cell with the specified address may be subjected to the above operation.

In addition, in the cell array in FIG. 5, four wirings (the inputting data line Din, the outputting data line Dout, the writing word line WL, and the reading word line RL) are connected to each memory cell. However, in a memory device of the present invention, the number of wirings connected to each memory cell is not limited to four. The number of wirings and a connection structure may be determined as appropriate so that the memory cell 300 can be supplied with a signal controlling on/off of the transistor 301, a signal for controlling switching of the transistor 302, and a signal for supplying a potential to the second gate electrode of the transistor 301, and a potential which has the amount of the drain current of the transistor 301 or resistance between the source electrode and the drain electrode as data can be transmitted to a driver circuit.

Then, a memory device using the cell array in FIG. 5 is given as an example, and the structure of a driver circuit in a memory device according to one embodiment of the present invention is described.

Figure 8:
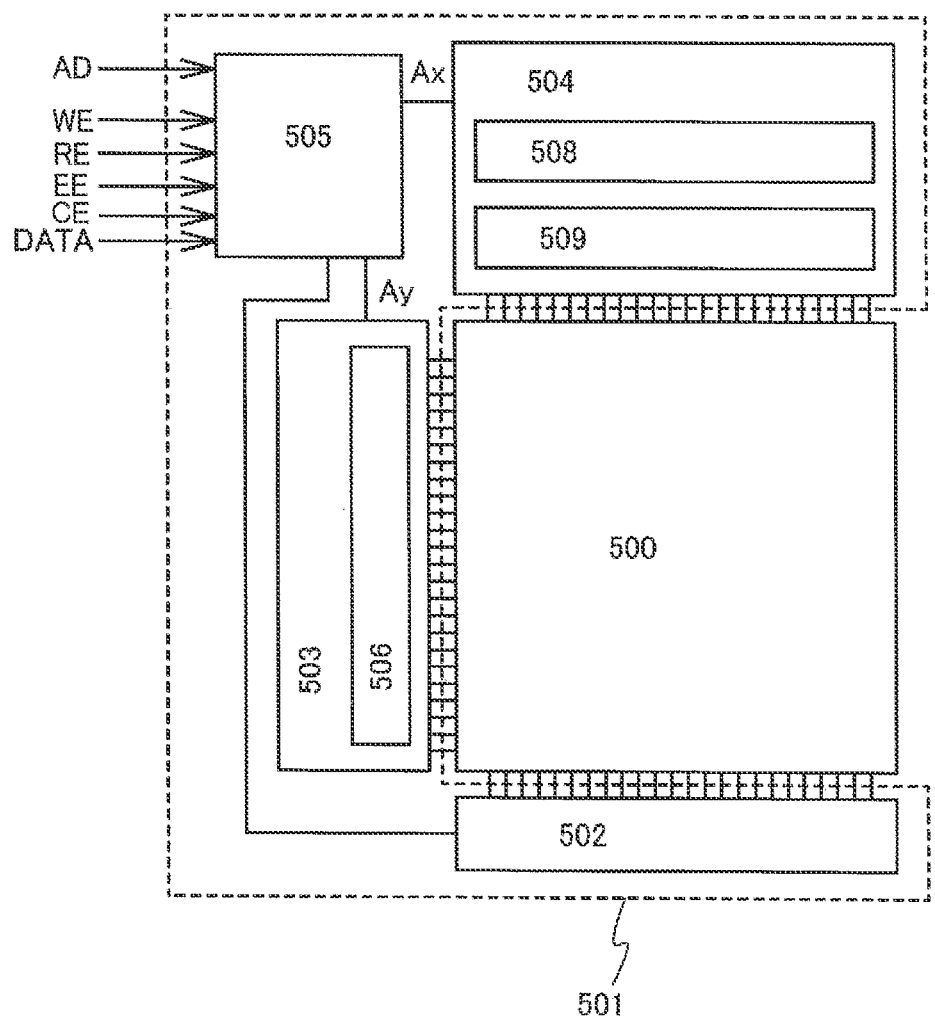
FIG. 8 illustrates a structure of a memory device.

FIG. 8 illustrates a block diagram of a structure of a memory device according to one embodiment of the present invention, as an example. Note that in the block diagram in FIG. 8, circuits in the memory device are classified in accordance with their functions and separated blocks are illustrated. However, it is difficult to classify actual circuits according to their functions completely and it is possible for one circuit to have a plurality of functions.

The memory device in FIG. 8 includes a cell array 500 in which a plurality of memory cells arranged in matrix and a driver circuit 501 for controlling driving of the cell array 500. The driver circuit 501 includes a reading circuit 502 which generates a signal with data read from the cell array 500, a word line driver circuit 503 which selects the memory cell included in the cell array 500 every row, a data line driver circuit 504 which controls writing and erasing of data in a selected memory cell, and a control circuit 505 which controls the operation of the reading circuit 502, the word line driver circuit 503, and the data line driver circuit 504. Further, the word line driver circuit 503 includes a word line decoder 506. In addition, the data line driver circuit 504 includes a data line decoder 508 and a data line selector 509.

Note that it is acceptable as long as a memory device according to one embodiment of the present invention includes at least the cell array 500. A cell array and a memory module in which part of or all of a driver circuit is connected to a cell array are also categorized into a memory device according to one embodiment of the present invention. The memory module may be provided with a connection terminal which can be mounted on a printed wiring board or the like and may be protected with resin or the like, that is, may be packaged.

Further, all of or part of the above driver circuit 501 may be formed over the same substrate as or a different substrate from the cell array 500. In the case where all of or part of the driver circuit 501 are provided over a different substrate from the cell array 500, all of or part of the driver circuit 501 can be connected to the cell array 500 through an FPC (flexible printed circuit) or the like. In that case, part of the driver circuit 501 may be connected to an FPC by a COF (chip on film) method. Further, all of or part of the driver circuit 501 may be connected to the cell array 500 by COG (chip on glass).

When the cell array 500 and the driver circuit 501 are formed over one substrate, the number of components of an external circuit connected to the memory device is reduced; therefore, cost reduction can be realized by reduction in the number of assembly steps and inspection steps. Further, the number of contact points can be reduced in the connection portion where the memory device and the external circuit are connected to each other; thus, decrease in yield can be prevented and reduction in reliability due to mechanical weakness of the connection portion can be prevented. Alternatively, only circuits whose drive frequencies are lower than those of the other circuits relatively low, such as the word line driver circuit 503, the data line selector 509, can be formed over the same substrate as the cell array 500. Thus, when part of the driver circuit 501 is provided over the same substrate as provided with the cell array 500, the following advantages can be enjoyed to some extent: reduction in yield caused by a connection defect can be avoided, mechanical weakness in a connection portion can be avoided, and cost can be lowered by reduction in the number of assembly steps and inspection steps, for example. Further, the performance property of circuits with high drive frequencies can be enhanced in comparison with the case where the cell array 500 and all of the driver circuit 501 are formed over one substrate.

When a signal AD having an address (Ax, Ay) as data is input to the memory device, the control circuit 505 transmits the address Ax which is data related to a column direction in the address and the address Ay which is data related to a row direction in the address to the data line driver circuit 504 and the word line driver circuit 503, respectively. In addition, the control circuit 505 transmits a signal DATA including data input to the memory device to the data line driver circuit 504.

Whether data is written, read, or erased is determined by a signal RE (read enable), WE (write enable), EE (erase enable), or the like supplied to the control circuit 505. Note that when the plurality of cell arrays 500 are provided in the memory device, a signal CE (chip enable) for selecting the cell array may be input to the control circuit 505.

When the operation of data writing is selected by the signal WE, a signal with a pulse is input to the writing word line WL corresponding to the address Ay by the word line decoder 506 included in the word line driver circuit 503 in response to an instruction from the control circuit 505. On the other hand, when the operation of data writing is selected by the signal WE, the data line decoder 508 supplies a signal for controlling the operation of the data line selector 509 to the data line selector 509 in the data line driver circuit 504 in response to an instruction from the control circuit 505. In the data line selector 509, the signal DATA with data is sampled in accordance with the signal from the data line decoder 508 and the sampled signal is input to the inputting data line Din corresponding to the address Ax.

When the operation of data reading is selected by the signal RE, a signal with a pulse is input to the reading word line RL corresponding to the address Ay from the word line decoder 506 included in the word line driver circuit 503 in response to an instruction from the control circuit 505. On the other hand, when the operation of data reading is selected by the signal RE, in the reading circuit 502, the potential of a bit line BL corresponding to the address Ax is controlled in response to an instruction from the control circuit 505 so that a transistor out of the transistors 310_1 to 310_3 that corresponds to the address Ax is turned on. Then, data stored in a memory cell with the corresponding address is read using the potential of the outputting data line Dout corresponding to the address Ax, and a signal with the data is generated.

When the operation of data erasing is selected by a signal EE, a signal with a pulse is input to the writing word line WL corresponding to the address Ay from the word line decoder 506 included in the word line driver circuit 503 in response to an instruction from the control circuit 505. On the other hand, when the operation of data erasing is selected by the signal EE, the data line decoder 508 supplies a signal for controlling the operation of the data line selector 509 to the data line selector 509 in the data line driver circuit 504 in response to an instruction from the control circuit 505. In the data line selector 509, a signal for erasing data is input to the inputting data line Din corresponding to the address Ax in accordance with the signal from the data line decoder 508.

Note that, although in the memory device in FIG. 8, the word line driver circuit 503 controls the input of a signal to the writing word line WL and the input of a signal to the reading word line RL, the present invention is not limited to this structure. A driver circuit which controls the input of a signal to the writing word line WL and a driver circuit which controls the input of a signal to the reading word line RL may be provided in the memory device.

This embodiment can be implemented by being combined as appropriate with any of the above-described embodiments.

Embodiment 3

A channel-etched bottom-gate transistor is given as an example, and a manufacturing method of a memory device according to one embodiment of the present invention will be described. Note that in Embodiment 3, the case where an oxide semiconductor film is used as an active layer in both of a transistor which functions as a memory element and a transistor which functions as a switching element is given as an example for description.

Figure 10A:
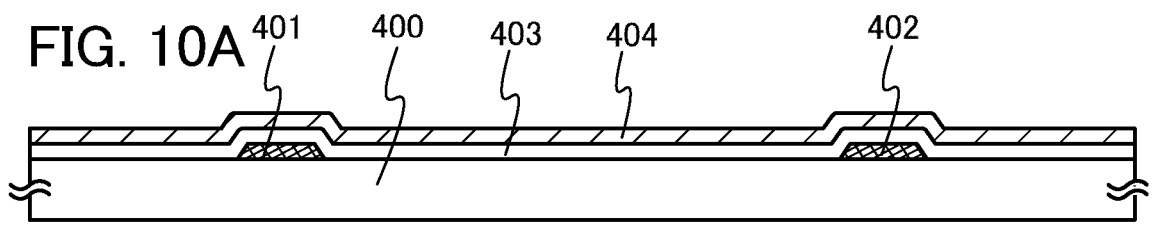
FIGS. 10A to 10E are cross-sectional views of a memory cell illustrating a manufacturing method of a memory device.

As illustrated in FIG. 10A, a gate electrode 401 and a gate electrode 402 are formed over a substrate 400 having an insulating surface.

Although there is no particular limitation on a substrate that can be used as the substrate 400 having an insulating surface, the substrate needs to have heat resistance high enough to withstand at least heat treatment to be performed in a later step. For example, a glass substrate formed by a glass fusion process or a float process can be used. In the case where a glass substrate is used and the temperature at which the heat treatment is to be performed in a later step is high, a glass substrate whose strain point is 730° C. or more is preferably used. As a glass substrate, a glass material such as aluminosilicate glass, aluminoborosilicate glass, or barium borosilicate glass is used, for example. Note that in general, by containing a larger amount of barium oxide (BaO) than boron oxide, a glass substrate which is heat-resistant and more practical can be obtained. Therefore, a glass substrate containing BaO and $B_2O_3$ so that the amount of BaO is larger than that of $B_2O_3$ is preferably used.

Note that as the above glass substrate, a substrate formed of an insulator such as a ceramic substrate, a quartz substrate, or a sapphire substrate may be used. Alternatively, crystallized glass or the like may be used. A metal substrate of a stainless alloy or the like with its surface provided with an insulating layer may be used.

Further, a substrate formed from a flexible synthetic resin, such as plastic or the like, generally tends to have a low upper temperature limit, but can be used as the substrate 400 as long as the substrate can withstand processing temperatures in a later manufacturing step. Examples of a plastic substrate include polyester typified by polyethylene terephthalate (PET), polyethersulfone (PES), polyethylene naphthalate (PEN), polycarbonate (PC), polyetheretherketone (PEEK), polysulfone (PSF), polyetherimide (PEI), polyarylate (PAR), polybutylene terephthalate (PBT), polyimide, acrylonitrile-butadiene-styrene resin, polyvinyl chloride, polypropylene, polyvinyl acetate, acrylic resin, and the like.

An insulating film which serves as a base film may be formed between the substrate 400, and the gate electrode 401 and the gate electrode 402. As the base film, for example, a single layer of a silicon oxide film, a silicon oxynitride film, a silicon nitride film, a silicon nitride oxide film, an aluminum nitride film, or an aluminum nitride oxide film or a stacked layer of a plurality of these films can be used. In particular, an insulating film having a high barrier property, for example, a silicon nitride film, a silicon nitride oxide film, an aluminum nitride film, or an aluminum nitride oxide film is used for the base film, so that impurities in an atmosphere, such as moisture or hydrogen, or impurities included in the substrate 400, such as an alkali metal or a heavy metal, can be prevented from entering the oxide semiconductor film, the gate insulating film or at the interface between the oxide semiconductor film and another insulating film and the vicinity thereof.

In this specification, oxynitride is referred to as a substance which includes more oxygen than nitrogen, and nitride oxide is referred to as a substance which includes more nitrogen than oxygen.

The gate electrodes 401 and 402 can be formed with a single layer or a stacked layer using one or more of conductive films using a metal material such as molybdenum, titanium, chromium, tantalum, tungsten, neodymium, or scandium, or an alloy material which includes any of these metal materials as a main component, or nitride of these metals. Note that aluminum or copper can also be used as such metal materials if aluminum or copper can withstand a temperature of heat treatment performed in a later step. Aluminum or copper is preferably combined with a refractory metal material so as to prevent a problem of low heat resistance and a problem of corrosion. As the refractory metal material, molybdenum, titanium, chromium, tantalum, tungsten, neodymium, scandium, or the like can be used.

For example, as a two-layer structure of the gate electrodes 401 and 402, the following structures are preferable: a two-layer structure in which a molybdenum film is stacked over an aluminum film, a two-layer structure in which a molybdenum film is stacked over a copper film, a two-layer structure in which a titanium nitride film or a tantalum nitride film is stacked over a copper film, and a two-layer structure in which a titanium nitride film and a molybdenum film are stacked. As a three-layer structure of the gate electrodes 401 and 402, the following structure is preferable: a stacked structure in which an aluminum film, an alloy film of aluminum and silicon, an alloy film of aluminum and titanium, or an alloy film of aluminum and neodymium is used as a middle layer and sandwiched between two films selected from a tungsten film, a tungsten nitride film, a titanium nitride film, or a titanium film is used as a top layer and a bottom layer.

Further, when a light-transmitting oxide conductive film such as an indium oxide film, a film of an alloy of indium oxide and tin oxide, a film of an alloy of indium oxide and zinc oxide, a zinc oxide film, a zinc aluminum oxide film, a zinc aluminum oxynitride film, a zinc gallium oxide film, or the like is used for the gate electrodes 401 and 402, the aperture ratio of a pixel portion can be improved.

The thicknesses of the gate electrodes 401 and 402 are each 10 nm to 400 nm, preferably 100 nm to 200 nm. In Embodiment 3, after the conductive film for the gate electrode is formed to have a thickness of 150 nm by sputtering using a tungsten target, the conductive film is processed (patterned) into a desired shape by etching, whereby the gate electrodes 401 and 402 are formed. Note that it is preferable that an end portion of the formed gate electrode be tapered because coverage with a gate insulating layer formed thereover is improved. Note that a resist mask may be formed by an inkjet method. Formation of the resist mask by an inkjet method needs no photomask; thus, manufacturing cost can be reduced.

Next, a gate insulating film 403 is formed over the gate electrodes 401 and 402. The gate insulating film 403 is formed to have a single-layer structure or a stacked-layer structure of a silicon oxide film, a silicon nitride film, a silicon oxynitride film, a silicon nitride oxide film, an aluminum oxide film, an aluminum nitride film, an aluminum oxynitride film, an aluminum nitride oxide film, a hafnium oxide film, or a tantalum oxide film by plasma CVD, sputtering, or the like. It is preferable that the gate insulating film 403 include impurities such as moisture or hydrogen as little as possible. In the case of forming a silicon oxide film by sputtering, a silicon target or a quartz target is used as a target, and oxygen or a mixed gas of oxygen and argon is used as a sputtering gas.

The oxide semiconductor which is made to be an intrinsic oxide semiconductor or a substantially intrinsic oxide semiconductor (the oxide semiconductor which is highly purified) by removal of impurities is extremely sensitive to the interface state and the interface electric charge; accordingly, an interface between the highly-purified oxide semiconductor and the gate insulating film 403 is important. Therefore, the gate insulating film (GI) that is in contact with the highly-purified oxide semiconductor needs to have higher quality.

For example, high-density plasma CVD using microwaves (2.45 GHz) is preferable because a dense high-quality insulating film having high withstand voltage can be formed. This is because when the highly-purified oxide semiconductor is closely in contact with the high-quality gate insulating film, the interface state can be reduced and interface properties can be favorable.

Needless to say, other film formation methods, such as sputtering or plasma CVD, can be applied as long as a high-quality insulating film can be formed as the gate insulating film. Moreover, it is possible to form an insulating film whose quality and characteristics of an interface with the oxide semiconductor are improved through heat treatment performed after the formation of the insulating film. In any case, an insulating film that has favorable film quality as the gate insulating film and can reduce interface state density with the oxide semiconductor to form a favorable interface is formed.

The gate insulating film 403 may be formed to have a structure in which an insulating film formed using a material having a high barrier property and an insulating film having lower proportion of nitrogen such as a silicon oxide film or a silicon oxynitride film are stacked. In this case, the insulating film such as a silicon oxide film or a silicon oxynitride film is formed between the insulating film having a high barrier property and the oxide semiconductor film. As the insulating film having a high barrier property, a silicon nitride film, a silicon nitride oxide film, an aluminum nitride film, an aluminum nitride oxide film, or the like can be given, for example. With an insulating film having a high barrier property, impurities in an atmosphere, such as moisture or hydrogen, or impurities included in the substrate 400, such as an alkali metal or a heavy metal, can be prevented from entering the oxide semiconductor film, the gate insulating film 403 or the interface between the oxide semiconductor film and another insulating film and the vicinity thereof. In addition, the insulating film having lower proportion of nitrogen such as a silicon oxide film or a silicon oxynitride film is formed so as to be in contact with the oxide semiconductor film, so that the insulating film having a high barrier property can be prevented from being in contact with the oxide semiconductor film directly.

For example, a silicon nitride film ($SiN_y$ (y>0)) with a thickness of 50 nm to 200 nm inclusive is formed by sputtering as a first gate insulating film, and a silicon oxide film ($SiO_x$ (x>0)) with a thickness of 5 nm to 300 nm inclusive is stacked over the first gate insulating film as a second gate insulating film; thus, these films may be used as the 100-nm-thick gate insulating film 403. The thickness of the gate insulating film 403 may be determined as appropriate depending on characteristics needed for a transistor and may be approximately 350 nm to 400 nm.

In Embodiment 3, the gate insulating film 403 having a structure in which a silicon oxide film having a thickness of 100 nm formed by sputtering is stacked over a silicon nitride film having a thickness of 50 nm formed by sputtering is formed.

In order that hydrogen, hydroxyl, and moisture are contained as little as possible in the gate insulating film 403, it is preferable that the substrate 400 over which the gate electrodes 401 and 402 formed be preheated in a preheating chamber of the sputtering apparatus, so that impurities such as moisture or hydrogen adsorbed on the substrate 400 are eliminated and removed, as pretreatment for film formation. Note that the temperature of preheating is 100° C. to 400° C. inclusive, preferably 150° C. to 300° C. inclusive. As an evacuation unit provided in the preheating chamber, a cryopump is preferable. Note that this preheating treatment can be omitted.

Next, over the gate insulating film 403, an oxide semiconductor film 404 is formed to have a thickness of 2 nm to 200 nm inclusive, preferably 3 nm to 50 nm inclusive, more preferably 3 nm to 20 nm inclusive. The oxide semiconductor film 404 is formed by sputtering by the use of an oxide semiconductor as a target. Moreover, the oxide semiconductor film 404 can be formed by sputtering in a rare gas (e.g., argon) atmosphere, an oxygen atmosphere, or a mixed atmosphere including a rare gas (e.g., argon) and oxygen.

Note that it is preferable that before the oxide semiconductor film 404 is formed by sputtering, dust on a surface of the gate insulating film 403 be removed by reverse sputtering by introducing an argon gas and generating plasma. The reverse sputtering refers to a method in which, without application of voltage to a target side, an RF power source is used for application of voltage to a substrate side in an argon atmosphere to modify a surface. Note that instead of an argon atmosphere, a nitrogen atmosphere, a helium atmosphere, or the like may be used. Alternatively, an argon atmosphere to which oxygen, nitrous oxide, or the like is added may be used. Alternatively, an argon atmosphere to which chlorine, carbon tetrafluoride, or the like is added may be used.

For the oxide semiconductor film 404, such an oxide semiconductor as above described can be used.

In Embodiment 3, as the oxide semiconductor film 404, an In—Ga—Zn—O-based non-single-crystal film with a thickness of 30 nm, which is obtained by a sputtering method using an oxide semiconductor target including indium (In), gallium (Ga), and zinc (Zn), is used. In the case of using sputtering, a target containing $SiO_2$ at 2 wt % to 10 wt % inclusive may be used for film formation. The filling rate of the oxide semiconductor target including In, Ga, and Zn is 90% to 100% inclusive, preferably 95% to 99.9% inclusive. By the use of the oxide semiconductor target with a high filling rate, a dense an oxide semiconductor film is formed.

The oxide semiconductor film 404 is formed over the substrate 400 in such a manner that the substrate is held in the treatment chamber maintained at reduced pressure, a sputtering gas from which hydrogen and moisture have been removed is introduced into the treatment chamber while moisture remaining therein is removed, and metal oxide is used as a target. The substrate temperature may be 100° C. to 600° C. inclusive, preferably 200° C. to 400° C. inclusive in film formation. Film formation is performed while the substrate is heated, whereby the concentration of impurities contained in the formed oxide semiconductor layer can be reduced. In addition, damage by sputtering can be reduced. In order to remove remaining moisture in the treatment chamber, an entrapment vacuum pump is preferably used. For example, a cryopump, an ion pump, or a titanium sublimation pump is preferably used. The evacuation unit may be a turbo pump provided with a cold trap. In the deposition chamber which is evacuated with the cryopump, for example, a hydrogen atom, a compound containing a hydrogen atom such as water ($H_2O$) (more preferably, also a compound containing a carbon atom), and the like are removed, whereby the concentration of impurities in the oxide semiconductor film formed in the deposition chamber can be reduced.

As one example of the deposition condition, the distance between the substrate and the target is 100 mm, the pressure is 0.6 Pa, the direct-current (DC) power source is 0.5 kW, and the atmosphere is an oxygen atmosphere (the proportion of the oxygen flow rate is 100%). Note that a pulse direct current (DC) power source is preferable because dust which is also called particles and which is generated in film formation can be reduced and the film thickness can be uniform. The oxide semiconductor film preferably has a thickness of 5 nm to 30 nm inclusive. Since appropriate thickness depends on an oxide semiconductor material used, the thickness can be determined as appropriate depending on the material.

In order for the oxide semiconductor film 404 not to contain impurities such as hydrogen, a hydroxyl group, or moisture as much as possible, it is preferable to preheat the substrate 400 provided with the gate insulating film 403 in a preheating chamber of the sputtering apparatus before the film formation so that impurities such as moisture or hydrogen adsorbed on the substrate 400 is eliminated and removed. Note that the temperature of preheating is 100° C. to 400° C. inclusive, preferably 150° C. to 300° C. inclusive. As an evacuation unit provided in the preheating chamber, a cryopump is preferable. Note that this preheating treatment can be omitted. In addition, before an insulating film 411 is formed, the preheating may similarly be performed on the substrate 400 over which a source electrode 407, a drain electrode 408, a source electrode 409, and a drain electrode 410 are formed.

Examples of sputtering include an RF sputtering method in which a high-frequency power source is used for a sputtering power supply, a DC sputtering method, and a pulsed DC sputtering method in which a bias is applied in a pulsed manner. An RF sputtering method is mainly used in the case where an insulating film is formed, and a DC sputtering method is mainly used in the case where a metal film is formed.

In addition, there is also a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

Alternatively, a sputtering apparatus provided with a magnet system inside the chamber and used for magnetron sputtering, or a sputtering apparatus used for ECR sputtering in which plasma generated by the use of microwaves is used without using glow discharge can be used.

Further, as a deposition method using sputtering, reactive sputtering by which a target substance and a sputtering gas component are chemically reacted with each other during film formation to form a thin compound film thereof, or bias sputtering in which voltage is also applied to a substrate during film formation can be used.

The gate insulating film 403 and the oxide semiconductor film 404 may be formed successively without exposure to the air. Successive film formation without exposure to the air makes it possible to obtain each interface between stacked layers without contamination by atmospheric components or impurities elements floating in the air, such as water, hydrocarbon, or the like. Therefore, variation in characteristics of the transistor can be reduced.

Figure 10B:
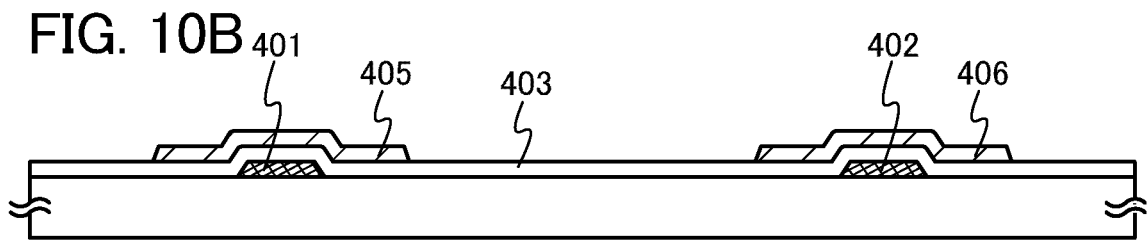

Next, as illustrated in FIG. 10B, the oxide semiconductor film 404 is processed (patterned) into a desired shape by etching or the like, whereby island-shaped oxide semiconductor films 405 and 406 are formed over the gate insulating film 403 in a position where the island-shaped oxide semiconductor films 405 and 406 overlap with the gate electrodes 401 and 402.

A resist mask for forming the island-shaped oxide semiconductor films 405 and 406 may be formed by an inkjet method. Formation of the resist mask by an inkjet method needs no photomask; thus, manufacturing cost can be reduced.

In the case where a contact hole is formed in the gate insulating film 403, a step of forming the contact hole can be performed at the time of formation of the island-shaped oxide semiconductor films 405 and 406.

Note that etching for forming the island-shaped oxide semiconductor films 405 and 406 may be wet etching, dry etching, or both dry etching and wet etching. As the etching gas for dry etching, a gas containing chlorine (a chlorine-based gas such as chlorine ($Cl_2$), boron chloride ($BCl_3$), silicon chloride ($SiCl_4$), or carbon tetrachloride ($CCl_4$)) is preferably used. Alternatively, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As the dry etching, parallel plate RIE (reactive ion etching) or ICP (inductively coupled plasma) etching can be used. In order to etch the films into desired shapes, the etching condition (the amount of electric power applied to a coil-shaped electrode, the amount of electric power applied to an electrode on a substrate side, the temperature of the electrode on the substrate side, or the like) is adjusted as appropriate.

As an etchant used for wet etching, a mixed solution of phosphoric acid, acetic acid, and nitric acid, or the like can be used. Alternatively, ITO-07N (manufactured by Kanto Chemical Co., Inc.) may be used. The etchant after the wet etching is removed together with the etched materials by cleaning. The waste liquid including the etchant and the material etched off may be purified and the material may be reused. When a material such as indium included in the oxide semiconductor film is collected from the waste liquid after the etching and reused, the resources can be efficiently used and the cost can be reduced.

Note that it is preferable that reverse sputtering be performed before the formation of a conductive film in a subsequent step so that a resist residue or the like that attaches to surfaces of the island-shaped oxide semiconductor film 405, the island-shaped oxide semiconductor film 406, and the gate insulating film 403 is removed.

Then, heat treatment is performed on the oxide semiconductor films 405 and 406 in a nitrogen atmosphere, an oxygen atmosphere, an atmosphere of ultra-dry air (air in which the water content is less than or equal to 20 ppm, preferably less than or equal to 1 ppm, and more preferably less than or equal to 10 ppb), or a rare gas (e.g., argon and helium) atmosphere. Heat treatment performed on the oxide semiconductor films 405 and 406 can eliminate moisture or hydrogen in the oxide semiconductor films 405 and 406. Specifically, heat treatment may be performed at 350° C. to 850° C. (or the strain point of the glass substrate) inclusive, preferably 550° C. to 750° C. inclusive. For example, heat treatment may be performed at 600° C. for approximately three minutes to six minutes inclusive. Since dehydration or dehydrogenation can be performed in a short time with the RTA method, the heat treatment can be performed even at a temperature over the strain point of a glass substrate. Alternatively, heat treatment may be performed for approximately one hour in a state where substrate temperature is approximately 450° C.

In Embodiment 3, heat treatment is performed on the oxide semiconductor films 405 and 406 for six minutes with an electric furnace which is one of heat treatment apparatuses in a nitrogen atmosphere in a state where the substrate temperature is approximately 600° C. After the heat treatment, the oxide semiconductor films 405 and 406 are not exposed to the air in order to prevent reentrance of moisture or hydrogen.

Note that a heat treatment apparatus is not limited to an electrical furnace, and may include a device for heating an object to be processed by heat conduction or heat radiation from a heating element such as a resistance heating element. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which does not react with an object to be processed by heat treatment, such as nitrogen or a rare gas such as argon is used.

For example, the heat treatment can employ GRTA, in which the substrate is moved into an inert gas heated at a high temperature of 650° C. to 700° C., and heated for several minutes there, and then the substrate is moved out of the inert gas. With GRTA, high-temperature heat treatment for a short period of time can be achieved.

Note that it is preferable that in the heat treatment, moisture, hydrogen, or the like be not contained in nitrogen or a rare gas such as helium, neon, or argon. It is preferable that the purity of nitrogen or a rare gas such as helium, neon, or argon which is introduced into a heat treatment apparatus be 6N (99.9999%) or more, preferably 7N (99.99999%) or more (that is, the impurities concentration is 1 ppm or lower, preferably 0.1 ppm or lower).

Further, when an oxide semiconductor containing impurities such as moisture or hydrogen is subjected to a gate bias-temperature stress test (BT test) for 12 hours under conditions that the temperature is 85° C. and the voltage applied to the gate is $2 \times 10^6$ V/cm, a bond between the impurities and a main component of the oxide semiconductor is cleaved by a high electric field (B: bias) and a high temperature (T: temperature), and a generated dangling bond induces drift of threshold voltage ($V_{th}$). However, as described above, characteristics in an interface between a gate insulating film and an oxide semiconductor film are improved and impurities in the oxide semiconductor film, especially moisture, hydrogen, and the like is removed as much as possible so that a transistor which withstands a BT test can be obtained.

Through the above-described steps, the concentration of hydrogen in the oxide semiconductor film can be reduced and the oxide semiconductor film is highly purified. Thus, the oxide semiconductor film can be stabilized. In addition, heat treatment at a temperature of lower than or equal to the glass transition temperature makes it possible to form an oxide semiconductor film with a wide band gap in which carrier density is extremely low. Thus, transistors can be manufactured using a large-area substrate; thus, the mass productivity can be improved. In addition, by using the highly-purified oxide semiconductor film in which the hydrogen concentration is reduced, it is possible to manufacture a transistor with high withstand voltage, a reduced short-channel effect, and a high on-off ratio.

Note that when an oxide semiconductor film is heated, a plane-like crystal is formed in the upper surface though it depends on a material of the oxide semiconductor film and heating conditions. The plane-like crystal is preferably a single crystal which is c-axis-aligned in a direction perpendicular to a surface of the oxide semiconductor film. Further, it is preferable to use a polycrystal in which a-b planes correspond to each other in the channel formation region, or a polycrystal in which a axes or b axes correspond to each other in the channel formation region, and which are c-axis-orientated in a direction substantially perpendicular to the surface of the oxide semiconductor film. Note that when a base surface of the oxide semiconductor film is uneven, a plane-like crystal is a polycrystal.

Figure 10C:
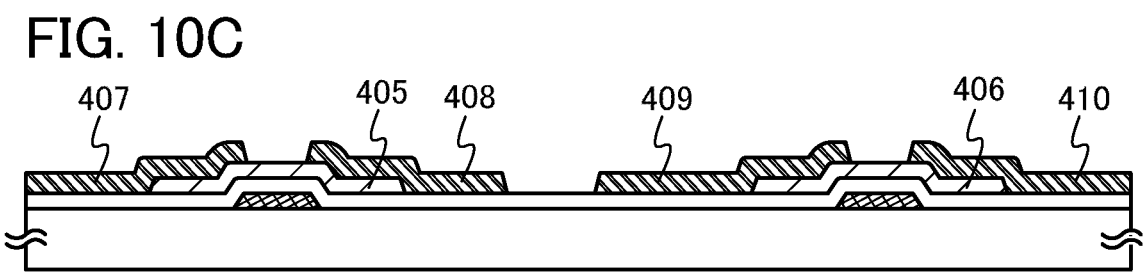

Then, as illustrated in FIG. 10C, a conductive film to be a source electrode and a drain electrode (including a wiring formed in the same layer as the source electrode and the drain electrode) is formed over the gate insulating film 403, the oxide semiconductor film 405, and the oxide semiconductor film 406, and then, the conductive film is patterned. Thus, the source electrode 407 and the drain electrode 408 are formed over the oxide semiconductor film 405, and the source electrode 409 and the drain electrode 410 are formed over the oxide semiconductor film 406. The conductive film may be formed by sputtering or a vacuum evaporation method. As a material of the conductive film to be the source electrode and the drain electrode (including a wiring formed in the same layer as the source electrode and the drain electrode), there are an element selected from Al, Cr, Cu, Ta, Ti, Mo, and W; an alloy including any of these elements as a component; an alloy film including any of these elements in combination; and the like. In addition, a structure in which a film of a refractory metal such as Cr, Ta, Ti, Mo, or W is stacked on a lower side or an upper side of a metal film of Al, Cu, or the like may be used. Furthermore, an Al material to which an element which prevents generation of hillocks or whisker in an Al film, such as Si, Ti, Ta, W, Mo, Cr, Nd, Sc, or Y is added may be used, which leads to improvement in heat resistance.

Further, the conductive film may have a single-layer structure or a stacked structure of two or more layers. For example, a single-layer structure of an aluminum film including silicon, a two-layer structure in which a titanium film is stacked over an aluminum film, a three-layer structure in which a titanium film, an aluminum film, and a titanium film are stacked in this order, and the like can be given.

Alternatively, the conductive film to be the source electrode and the drain electrode (including a wiring formed in the same layer as the source electrode and the drain electrode) may be formed using a conductive metal oxide. As a conductive metal oxide, indium oxide ($In_2O_3$), tin oxide ($SnO_2$), zinc oxide (ZnO), an alloy of indium oxide and tin oxide ($In_2O_3$—$SnO_2$, abbreviated to ITO), an alloy of indium oxide and zinc oxide ($In_2O_3$—ZnO), or the metal oxide material to which silicon or silicon oxide is added can be used.

In the case where heat treatment is performed after the formation of the conductive film, it is preferable that the conductive film have heat resistance high enough to withstand the heat treatment.

Then, a resist mask are formed over the conductive film. The source electrode 407, the drain electrode 408, the source electrode 409, and the drain electrode 410 are formed by selective etching. After that, the resist mask is removed.

Ultraviolet, a KrF laser beam, or an ArF laser beam is used for light exposure for forming the resist mask in the photolithography step. Each channel length L of transistors to be formed in a later step is determined by a distance between a lower end of the source electrode and a lower end of the drain electrode that are adjacent to each other over the oxide semiconductor films 405 and 406. In the case where the channel length L is shorter than 25 nm and light exposure for forming the resist mask in the photolithography step is performed, extreme ultraviolet rays having a wavelength as extremely short as several nanometers to several tens of nanometers are used. Light exposure with extreme ultraviolet leads to a high resolution and a large depth of focus. Thus, the channel length L of the transistor that is completed in a later step can be 10 nm to 1000 nm inclusive and the operation speed of a circuit can be increased and furthermore the value of off-state current is extremely small, so that low power consumption can be achieved.

Note that each material and etching conditions are adjusted as appropriate so that the oxide semiconductor films 405 and 406 are not removed in etching of the conductive film as much as possible.

In Embodiment 3, a titanium film is used as the conduction film, and wet etching is performed on the conductive film by the use of a solution (ammonia peroxide mixture) including ammonia and oxygenated water, so that the source electrode 407, the drain electrode 408, the source electrode 409, and the drain electrode 410 are formed. As the solution including the ammonia peroxide mixture, specifically, a solution in which oxygenated water (31 wt % hydrogen peroxide), ammonia water (28 wt % ammonium), and water are mixed at a volume ratio of 5:2:2 is used. Alternatively, dry etching may be performed on the conductive film using a gas containing chlorine ($Cl_2$), boron chloride ($BCl_3$), or the like.

When the source electrode 407, the drain electrode 408, the source electrode 409, and the drain electrode 410 are formed through the above patterning, part of exposed portion in the island-shaped oxide semiconductor films 405 is etched, so that a groove (a recessed portion) is sometimes formed. The resist mask for forming the source electrode 407, the drain electrode 408, the source electrode 409, and the drain electrode 410 may be formed by an inkjet method. Formation of the resist mask by an inkjet method needs no photomask; thus, manufacturing cost can be reduced.

In addition, in order to reduce the number of photomasks and the number of steps for the photolithography step, etching may be performed by the use of a resist mask formed using a multi-tone mask through which light is transmitted to have a plurality of intensities. A resist mask formed by the use of a multi-tone mask has a plurality of thicknesses and further can be changed in shape by etching; therefore, the resist mask can be used in a plurality of etching steps for processing into different patterns. Therefore, a resist mask corresponding to at least two or more kinds of different patterns can be formed by one multi-tone mask. Thus, the number of light-exposure masks can be reduced and the number of corresponding photolithography steps can be also reduced, whereby simplification of a process can be realized.

Next, plasma treatment is performed, using a gas such as $N_2O$, $N_2$, or Ar. By the plasma treatment, water or the like which attaches to an exposed surface of the oxide semiconductor film is removed. Alternatively, the plasma treatment may be performed using a mixture gas of oxygen and argon as well.

Figure 10D:
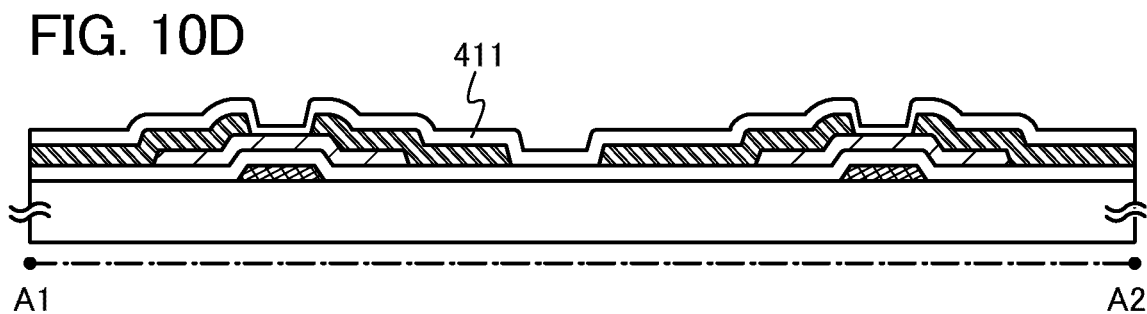

Note that after the plasma treatment is performed, as illustrated in FIG. 10D, the insulating film 411 is formed so as to cover the source electrode 407, the drain electrode 408, the source electrode 409, the drain electrode 410, the oxide semiconductor film 405, and the oxide semiconductor film 406. The insulating film 411 preferably includes impurities such as moisture or hydrogen as little as possible, and the insulating film 411 may be formed using a single-layer insulating film or a plurality of insulating films stacked. When hydrogen is included in the insulating film 411, entry of the hydrogen to the oxide semiconductor film or extraction of oxygen in the oxide semiconductor film by the hydrogen occurs, whereby a back channel portion of the oxide semiconductor film has lower resistance (n-type conductivity); thus, a parasitic channel might be formed. Therefore, it is preferable that a film formation method in which hydrogen is not used be employed in order to form the insulating film 411 containing hydrogen as little as possible. A material having a high barrier property is preferably used for the insulating film 411. For example, as an insulating film having a high barrier property, a silicon nitride film, a silicon nitride oxide film, an aluminum nitride film, an aluminum nitride oxide film, or the like can be used. When a plurality of insulating films stacked is used, an insulating film having lower proportion of nitrogen than the insulating film having a high barrier property, such as a silicon oxide film or a silicon oxynitride film, is formed on the side close to the oxide semiconductor films 405 and 406. Then, the insulating film having a high barrier property is formed so as to overlap with the source electrode 407, the drain electrode 408, the source electrode 409, the drain electrode 410, the oxide semiconductor film 405, and the oxide semiconductor film 406 with the insulating film having lower proportion of nitrogen between the insulating film having a barrier property and the source electrodes, the drain electrodes, and the oxide semiconductor films. With the insulating film having a high barrier property, the impurities such as moisture or hydrogen can be prevented from entering the oxide semiconductor film 405 and the oxide semiconductor film 406, the gate insulating film 403, or the interface between another insulating film and each of the oxide semiconductor film 405 and 406, and the vicinity thereof. In addition, the insulating film having lower proportion of nitrogen such as a silicon oxide film or a silicon oxynitride film is formed so as to be in contact with the oxide semiconductor films 405 and 406, so that the insulating film formed using a material having a high barrier property can be prevented from being in contact with the oxide semiconductor films 405 and 406 directly.

In Embodiment 3, the insulating film 411 having a structure in which a silicon nitride film having a thickness of 100 nm formed by sputtering is stacked over a silicon oxide film having a thickness of 200 nm formed by sputtering is formed. The substrate temperature in film formation may be in the range of room temperature to 300° C. inclusive, and in Embodiment 3, is 100° C.

Note that heat treatment may be performed after the insulating film 411 is formed. The heat treatment is performed in a nitrogen atmosphere, an oxygen atmosphere, an atmosphere of ultra-dry air (air in which the water content is less than or equal to 20 ppm, preferably less than or equal to 1 ppm, and more preferably less than or equal to 10 ppb), or a rare gas (e.g., argon and helium) atmosphere, at preferably 200° C. to 400° C. inclusive, for example, 250° C. to 350° C. inclusive. In Embodiment 3, heat treatment is performed in a nitrogen atmosphere at 250° C., for one hour. Alternatively, before the source electrode 407, the drain electrode 408, the source electrode 409, and the drain electrode 410 are formed, an RTA process which is heat treatment performed at high temperature and in a short time may be performed as when the oxide semiconductor film is subjected to the heat treatment. Heat treatment is performed after the insulating film 411 including oxygen is provided so as to be in contact with the exposure region of the oxide semiconductor film 405, which is formed between the source electrode 407 and the drain electrode 408, or after the insulating film 411 including oxygen is provided so as to be in contact with the exposure region of the oxide semiconductor film 406, which is formed between the source electrode 409 and the drain electrode 410; accordingly, oxygen is supplied to the oxide semiconductor film 405 and the oxide semiconductor film 406 even when the heat treatment performed on the oxide semiconductor film makes oxygen deficiency occur in the oxide semiconductor films 405 and 406. Oxygen is supplied to part of the oxide semiconductor films 405 and 406 which is in contact with the insulating film 411 to reduce oxygen deficiency serving as a donor, so that a structure which satisfies the stoichiometric composition ratio can be realized. As a result, an oxide semiconductor films 405 and 406 can be made to be an intrinsic semiconductor film or a substantially intrinsic semiconductor film. Accordingly, electric characteristics of the transistor can be improved and variation in the electric characteristics thereof can be reduced. There is no particular limitation on timing for this heat treatment as long as it is performed after formation of the insulating film 411. When this heat treatment also serves as heat treatment in another step, for example, heat treatment in formation of a resin film or heat treatment for reducing resistance of a transparent conductive film, the oxide semiconductor films 405 and 406 can be intrinsic (i-type) or substantially intrinsic without increase of the number of steps.

Figure 11A:
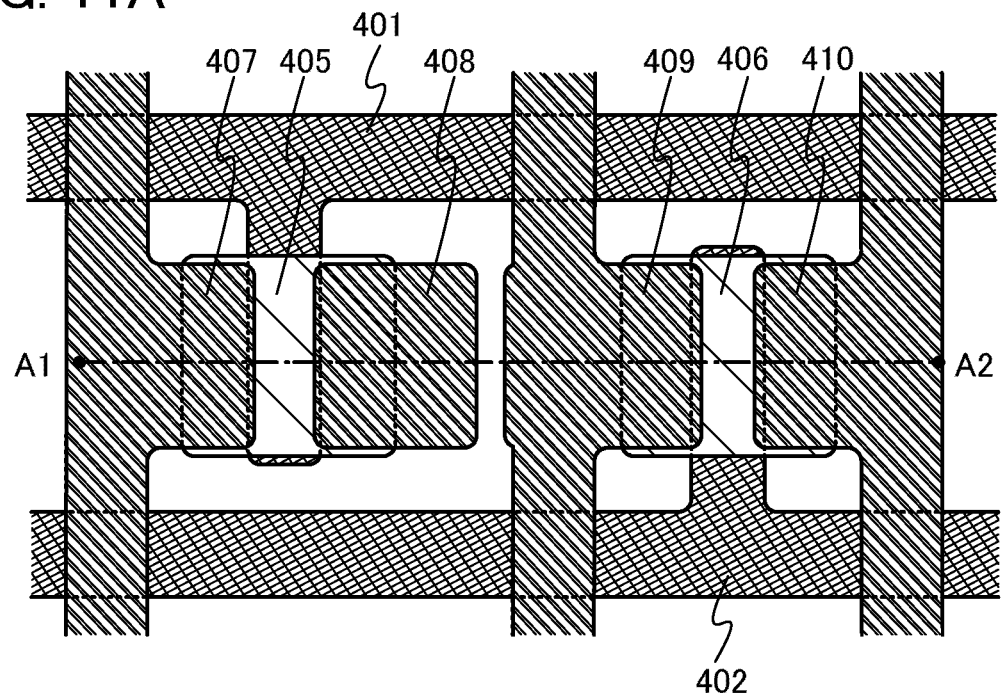
FIGS. 11A and 11B are top views of a memory cell.

FIG. 11A illustrates a top view of the memory device after the steps to FIG. 10D are finished. Note that a cross-sectional view taken along dashed line A1-A2 in FIG. 11A corresponds to FIG. 10D.

Figure 10E:
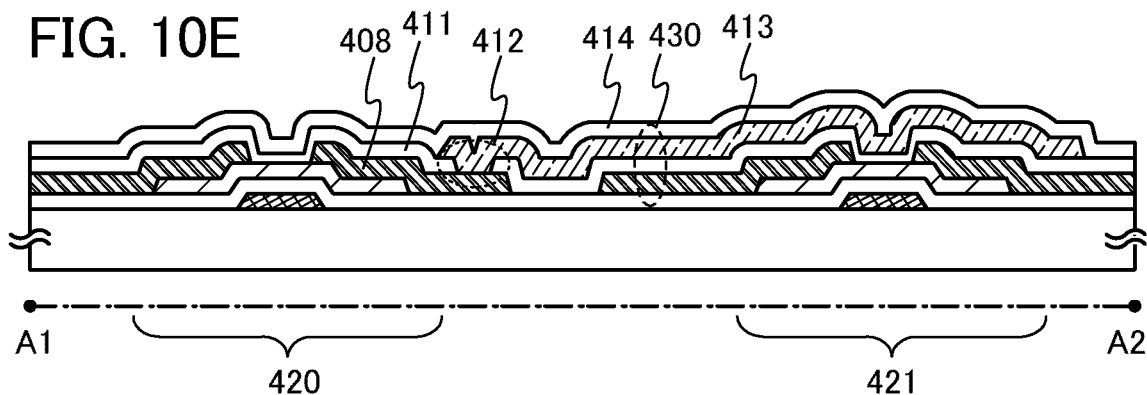

Then, a contact hole 412 is formed in the insulating film 411 by etching or the like to expose part of the drain electrode 408. Next, as illustrated in FIG. 10E, after a back gate electrode 413 is formed by patterning a conductive film formed over the insulating film 411 so as to overlap with the oxide semiconductor film 406, an insulating film 414 is formed so as to cover the back gate electrode 413. The back gate electrode 413 is connected to the drain electrode 408 in the contact hole 412. The back gate electrode 413 can be formed using a material and a structure which are similar to the gate electrodes 401 and 402 or the source electrode 407, the drain electrode 408, the source electrode 409, and the drain electrode 410.

The thickness of the back gate electrode 413 is set to 10 nm to 400 nm, preferably 100 nm to 200 nm. In Embodiment 3, the back gate electrode 413 is formed in a such a manner that a conductive film in which a titanium film, an aluminum film, and a titanium film are stacked is formed, a resist mask is formed by a photolithography method or the like, and unnecessary portions are removed by etching so that the conductive film is processed (patterned) to a desired shape.

The insulating film 414 is preferably formed using a material with a high barrier property that can prevent moisture, hydrogen, oxygen, and the like in an atmosphere from affecting the characteristics of the transistor. For example, the insulating film 414 can be formed to have a single-layer structure or a stacked-layer structure of a silicon nitride film, a silicon nitride oxide film, an aluminum nitride film, an aluminum nitride oxide film, or the like, as an insulating film having a high barrier property, by plasma CVD, sputtering, or the like. In order to obtain an effect of a barrier property, the insulating film 414 is preferably formed to have a thickness of 15 nm to 400 nm, for example.

In Embodiment 3, an insulating film is formed to a thickness of 300 nm by plasma CVD. The insulating film is formed under the following conditions: the flow rate of a silane gas is 4 sccm; the flow rate of dinitrogen monoxide ($N_2O$) is 800 sccm; and the substrate temperature is 400° C.

Figure 11B:
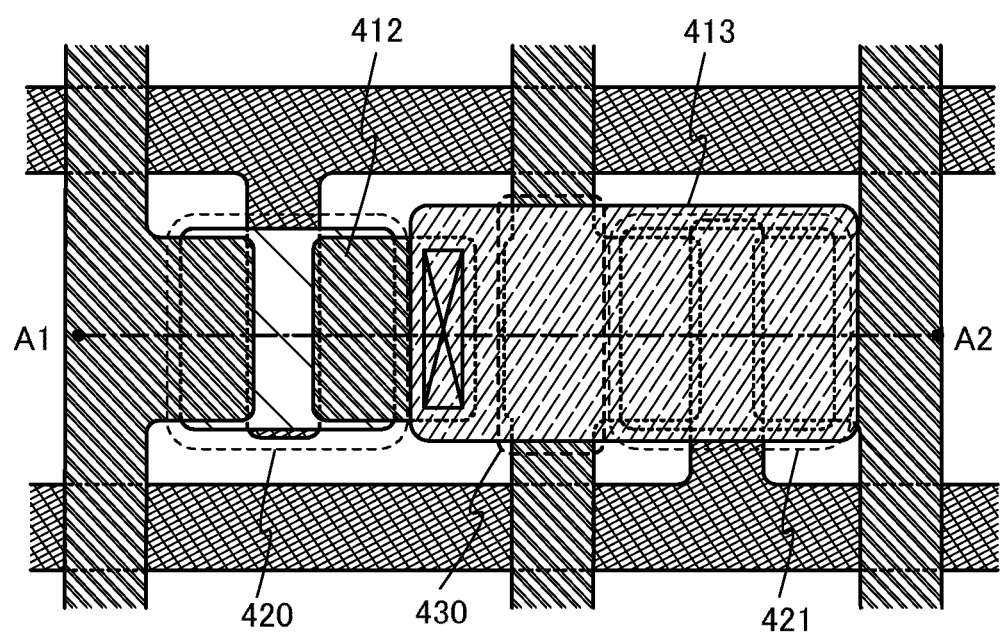

Through the above steps, a transistor 420 which functions as a switching element, a transistor 421 which functions as a memory element, and a capacitor 430 are formed. FIG. 11B illustrates a top view of the memory cell illustrated in FIG. 10E. FIG. 10E corresponds to a cross-sectional view taken along dashed line A1-A2 in FIG. 11B.

The transistor 420 includes the gate electrode 401 formed over the substrate 400 having an insulating surface, the gate insulating film 403 over the gate electrode 401, the oxide semiconductor film 405 which overlaps with the gate electrode 401 and which is over the gate insulating film 403, and a pair of the source electrode 407 and the drain electrode 408 formed over the oxide semiconductor film 405. The transistor 420 may include the insulating film 411 provided over the oxide semiconductor film 405, as its component. The transistor 420 illustrated in FIG. 10E has a channel-etched structure in which the oxide semiconductor film 405 is partly etched between the source electrode 407 and the drain electrode 408.

Note that although the transistor 420 is described as a single-gate transistor, a multi-gate transistor with a plurality of channel formation regions can be formed as necessary by having a plurality of the gate electrodes 401 electrically connected to each other.

Further, the transistor 421 includes the gate electrode 402 which is provided over the substrate 400 having an insulating surface; the gate insulating film 403 over the gate electrode 402; the oxide semiconductor film 406 which overlaps with the gate electrode 402 and which is over the gate insulating film 403; a pair of electrodes which are the source electrode 409 and the drain electrode 410 which are provided over the oxide semiconductor film 406; the insulating film 411 formed over the oxide semiconductor film 406, the source electrode 409, and the drain electrode 410; and the back gate electrode 413 which overlaps with the oxide semiconductor film 406 and the gate electrode 402 and which is over the insulating film 411. The insulating film 414 formed over the back gate electrode 413 may be included as a component of the transistor 421. The transistor 421 illustrated in FIG. 10E has a channel-etched structure in which the oxide semiconductor film 406 is partly etched between the source electrode 409 and the drain electrode 410.

Note that although the transistor 421 is described as a single-gate transistor, a multi-gate transistor with a plurality of channel formation regions can be formed as necessary by having a plurality of gate electrodes 402 electrically connected to each other.

The capacitor 430 is formed in a region in which the source electrode 409 of the transistor 421 and the back gate electrode 413 of the transistor 421 overlap with each other with the insulating film 411 provided therebetween.

The gate electrode 402 included in the transistor 421 functions as a first electrode which can select the operation of a memory element such as writing, reading, storing, and erasing by control of potential of the electrode 402. The back gate electrode 413 functions as a second electrode which can control the threshold voltage of the transistor 421 used as a memory element. Note that although in Embodiment 3, a memory cell where the transistor 421 functions as a memory element having the gate electrode 402 as the first electrode formed before the formation of the oxide semiconductor film 406, and the back gate electrode 413 as the second electrode formed after the formation of the oxide semiconductor film 406 is given as an example, the present invention is not limited to this structure. For example, a structure may also be employed in which the gate electrode 402 formed before the formation of the oxide semiconductor film 406 functions as the second electrode and the back gate electrode 413 formed after the formation of the oxide semiconductor 406 functions as the first electrode in the transistor 421. Note that in this case, the gate electrode 402 instead of the back gate electrode 413 is connected to the drain electrode 408 of the transistor 420.

In addition, in FIG. 11B, the case where the back gate electrode 413 overlaps the entire oxide semiconductor film 406 is illustrated as an example, the present invention is not limited to this structure. Any structure may be employed as long as the back gate electrode 413 overlaps at least part of the channel formation region included in the oxide semiconductor.

Note that the band gap of an oxide semiconductor, the band gap of silicon carbide, and the band gap of gallium nitride are 3.0 eV to 3.5 eV, 3.26 eV, and 3.39 eV, respectively: they are approximately three times as wide as the band gap of silicon. Compound semiconductors such as silicon carbide and gallium nitride are in common with an oxide semiconductor in that they are wide-gap semiconductors, the characteristics of which have advantages of improvement in withstand voltage of the transistor, reduction in loss of electric power, and the like.

Subsequently, as in Embodiment 3, how characteristics of the transistor are influenced by high purification of the oxide semiconductor film by removal of impurities such as moisture, hydrogen, or the like contained in the oxide semiconductor film as much as possible will be described.

Figure 12:
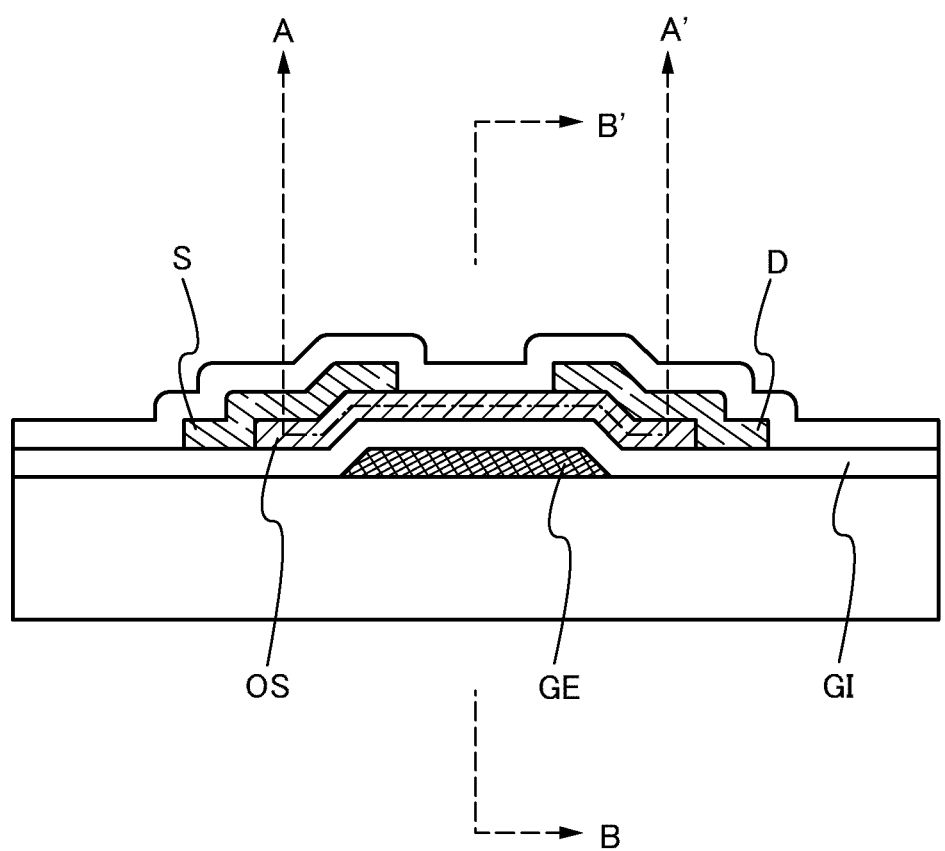
FIG. 12 is a longitudinal cross-sectional view of an inverted staggered transistor in which an oxide semiconductor is used.

FIG. 12 is a longitudinal cross-sectional view of an inverted staggered transistor including an oxide semiconductor. An oxide semiconductor film (OS) is provided over a gate electrode (GE) with a gate insulating film (GI) therebetween, a source electrode (S) and a drain electrode (D) are provided thereover, and an insulating film is provided so as to cover the source electrode (S) and the drain electrode (D).

Figure 13:
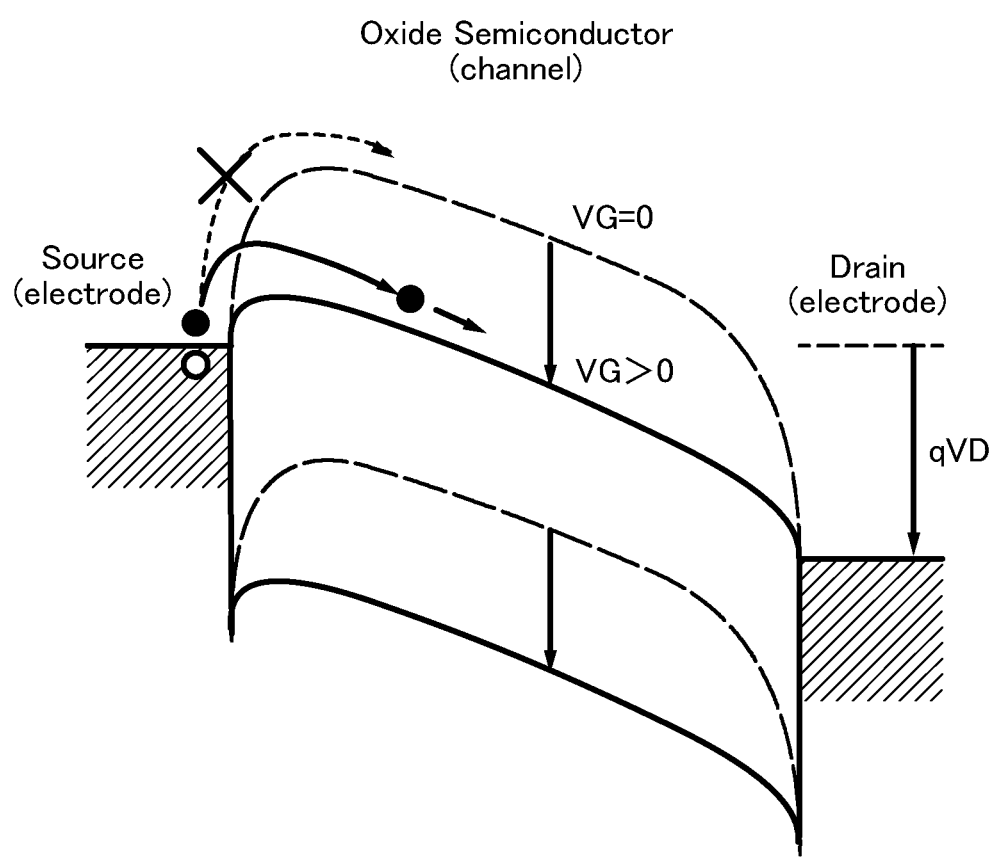
FIG. 13 is an energy band diagram (schematic diagram) along a section A-A' in FIG. 12.

FIG. 13 is an energy band diagram (schematic diagram) along a section A-A' illustrated in FIG. 12. In FIG. 13, a black circle (●) and a white circle (○) represent an electron and a hole and have electric charges −q and +q, respectively. With positive voltage ($V_D$>0) applied to the drain electrode (D), the dashed line shows the case where no voltage is applied to the gate electrode (GE) ($V_G$=0) and the solid line shows the case where positive voltage is applied to the gate electrode (GE) ($V_G$>0). In the case where voltage is not applied to the gate electrode (GE), carriers (electrons) are not injected from the source electrode (S) to the oxide semiconductor film (OS) side because of high potential barrier, so that no current flows, which means an off state. In contrast, when positive voltage is applied to the gate electrode (GE), the potential barrier is decreased, so that current flows, which means an on state.

Figure 14A:
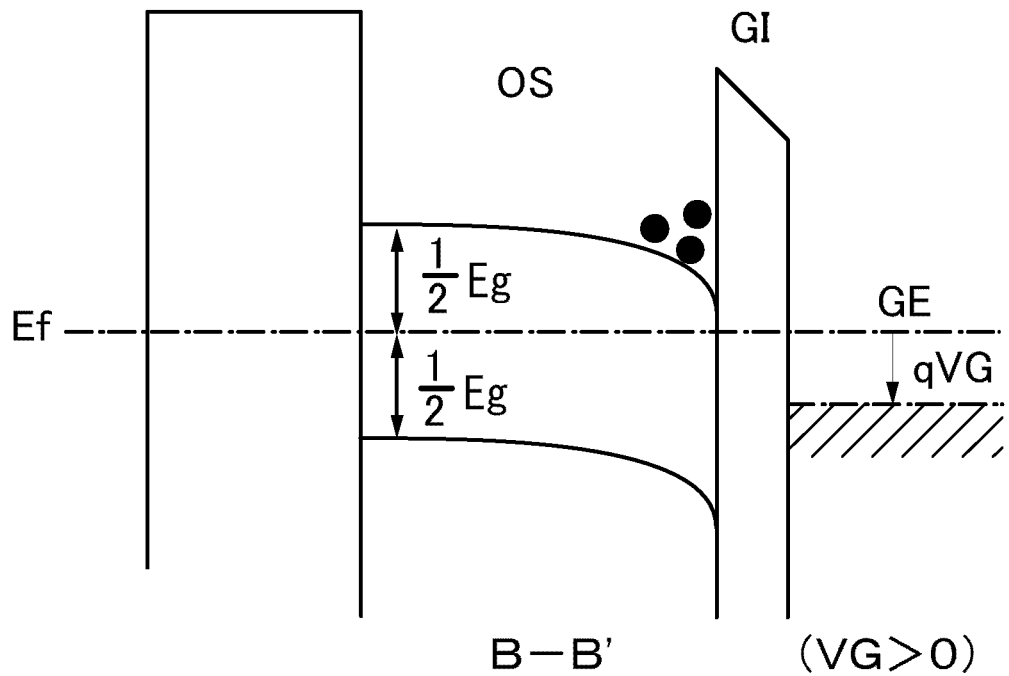
FIG. 14A illustrates a state where a positive potential (+VG) is applied to a gate electrode (GE) and FIG. 14B illustrates a state where a negative potential (−VG) is applied to the gate electrode (GE).
Figure 14B:
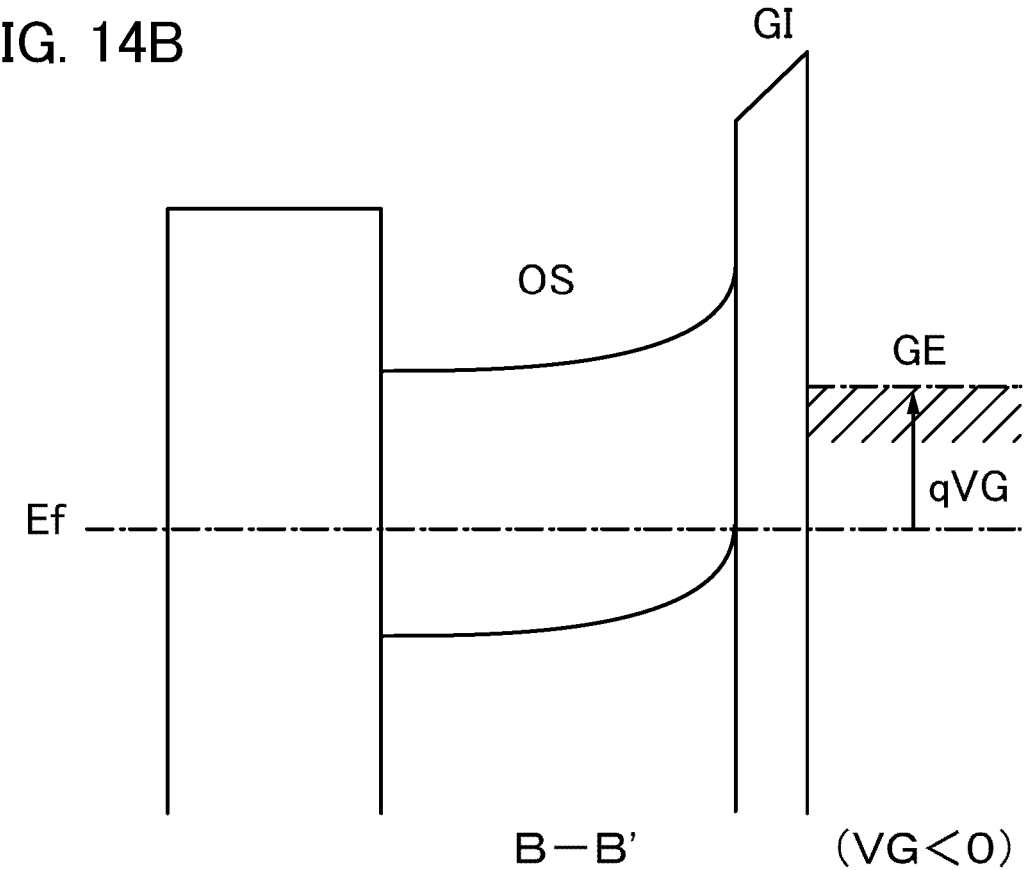

FIGS. 14A and 14B are energy band diagrams (schematic diagrams) along a section B-B' illustrated in FIG. 12. FIG. 14A illustrates a state where a positive potential ($V_G$>0) is applied to a gate electrode (GE) and an on state where carriers (electrons) flow between the source electrode (S) and the drain electrode (D). FIG. 14B illustrates a state where a negative potential ($V_G$<0) is applied to the gate electrode (GE) and an off state (minority carriers do not flow).

Figure 15:
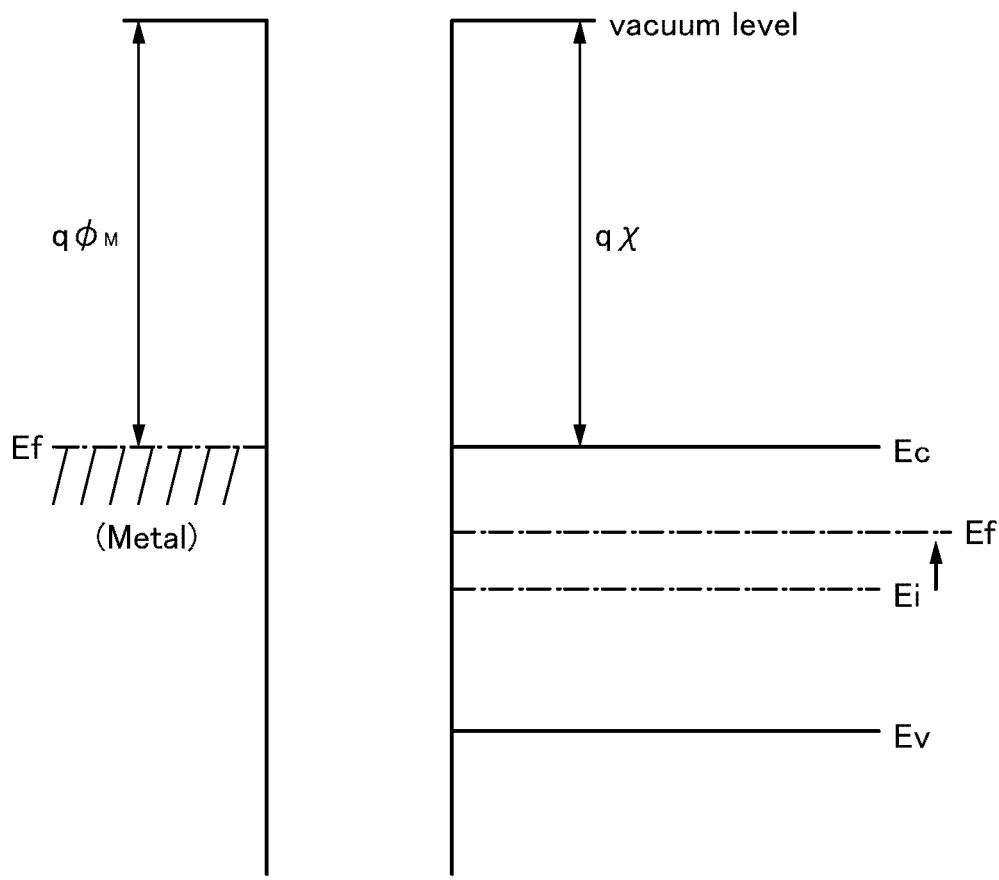
FIG. 15 illustrates relations between the vacuum level and the work function of a metal ($\phi_M$) and between the vacuum level and the electron affinity ($\chi$) of an oxide semiconductor.

FIG. 15 illustrates relations between the vacuum level and the work function of a metal ($\phi_M$) and between the vacuum level and the electron affinity ($\chi$) of an oxide semiconductor.

At normal temperature, electrons in the metal are degenerated and the Fermi level is located in the conduction band. On the other hand, in general, a conventional oxide semiconductor is an n-type semiconductor, and the Fermi level (Ef) thereof is located nearer the conduction band (Ec) and away from an intrinsic Fermi level (Ei) which is located in the center of the band gap. Note that it is known that part of hydrogen in the oxide semiconductor is a donor and one of factors that make the n-type oxide semiconductor. Further, oxygen deficiency is known as one of the causes to produce an n-type an oxide semiconductor.

In contrast, according to one embodiment of the present invention, oxygen deficiency is removed and hydrogen which is an n-type impurity, is removed from the oxide semiconductor so as to highly purify so that impurities other than the main components of the oxide semiconductor is not included as much as possible; accordingly, an oxide semiconductor is made to be extremely close to an intrinsic oxide semiconductor. That is, the oxide semiconductor is made to be extremely close to an intrinsic semiconductor not by addition of impurities but by removal of oxygen deficiency and impurities such as moisture or hydrogen as much as possible to have high purity, so that an oxide semiconductor which is an intrinsic (i-type) semiconductor or is a substantially intrinsic (i-type) semiconductor is obtained. With the above structure, the Fermi level (Ef) can be substantially close to the same level as the intrinsic Fermi level (Ei), as indicated by arrows.

In the case where the band gap (Eg) of an oxide semiconductor is 3.15 V, the electron affinity ($\chi$) is said to be 4.3 eV. The work function of titanium (Ti) included in the source electrode and the drain electrode is substantially equal to the electron affinity ($\chi$) of the oxide semiconductor. In that case, a Schottky barrier to electrons is not formed at an interface between the metal and the oxide semiconductor.

In this case, as illustrated in FIG. 14A, the electron moves along the lowest part of the oxide semiconductor, which is energetically stable, at an interface between the gate insulating film and the highly-purified oxide semiconductor.

In FIG. 14B, when a negative potential is applied to the gate electrode (GE), holes which are minority carriers are substantially zero; therefore, current is substantially close to zero.

Then, the intrinsic carrier density in an oxide semiconductor is calculated. The band gap of an In—Ga—Zn—O-based oxide semiconductor is 3.05 eV and the intrinsic carrier density is calculated based on this value. It is known that energy distribution f(E) of electrons in a solid obeys the Fermi-Dirac statistics represented by the following formula.

[FORMULA 1]

$$f(E) = \frac{1}{1 + \exp\left(\frac{E - E_F}{kT}\right)} \quad (1)$$

In the case of a normal semiconductor whose carrier density is not very high (which does not degenerate), the following relational expression is satisfied.

[FORMULA 2]

$$|E - E_F| > kT \quad (2)$$

Therefore, the Fermi-Dirac distribution of the Formula 1 is approximated by the formula of Boltzmann distribution expressed by the following formula.

[FORMULA 3]

$$f(E) = \exp\left[-\frac{E - E_F}{kT}\right] \quad (3)$$

When intrinsic carrier density ($n_i$) of the semiconductor is calculated using the Formula 3, the following formula can be obtained.

[FORMULA 4]

$$n_i = \sqrt{N_C N_V} \exp\left(-\frac{E_g}{2kT}\right) \quad (4)$$

Then, the values of effective density of states (Nc and Nv) and a band gap (Eg) of Si and an In—Ga—Zn—O-based oxide semiconductor were substituted into the Formula 4 and intrinsic carrier density was calculated. The results are shown in Table 1.

TABLE 1

|  | Si | IGZO |
| --- | --- | --- |
| Nc (300K) [cm$^{-3}$] | 2.8 × 10$^{19}$ | 5.0 × 10$^{18}$ |
| Nv (300K) [cm$^{-3}$] | 1.04 × 10$^{19}$ | 5.0 × 10$^{18}$ |
| Eg (300K) [eV] | 1.08 | 3.05 |
| $n_i$ (300K) [cm$^{-3}$] | 1.45 × 10$^{10}$ | 1.2 × 10$^{-7}$ |

It is found that an In—Ga—Zn—O-based oxide semiconductor has extremely low intrinsic carrier density as compared to Si. In the case where the value of 3.05 eV is selected as a band gap of an In—Ga—Zn—O-based oxide semiconductor, it can be said that the carrier density of Si is approximately 10$^{17}$ times as large as that of an In—Ga—Zn—O-based oxide semiconductor, assuming that the Fermi-Dirac distribution law is applicable to the intrinsic carrier density.

Then, the method of measuring the off-state current of a transistor including a highly-purified oxide semiconductor film and the result thereof will be described.

Figure 18:
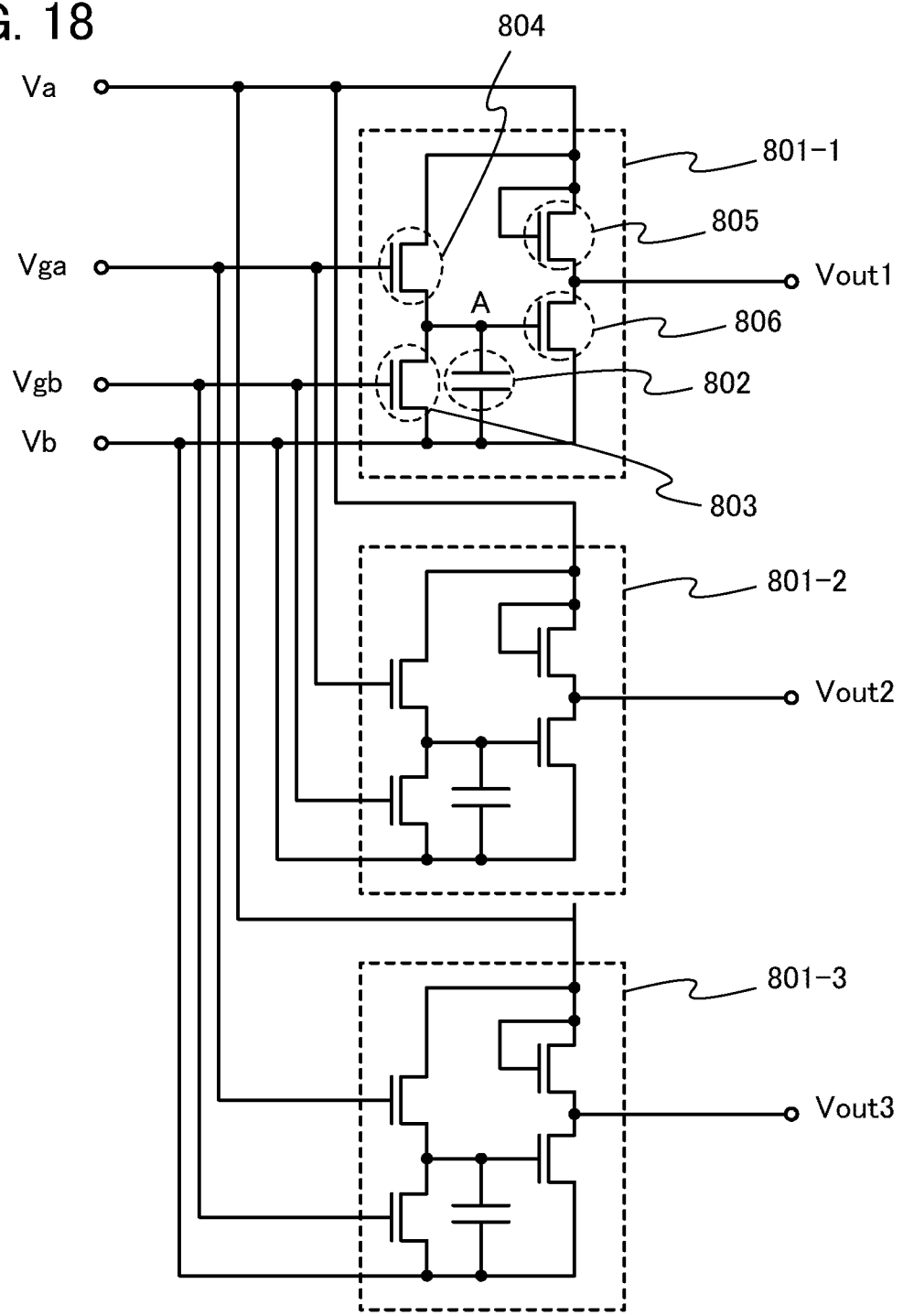
FIG. 18 illustrates a structure of a circuit for measurement.

FIG. 18 illustrates the structure of a measurement circuit which was used in measuring. The measurement circuit in FIG. 18 includes a transistor having a highly-purified oxide semiconductor film as a switching element for holding electric charge in a storage capacitor. With the measurement circuit, the off-state current of the transistor was measured by the change of the amount of electric charge in the storage capacitor per unit hour.

Specifically, the measurement circuit in FIG. 18 has a structure in which measuring systems 801-1 to 801-3 for measuring off-state current are connected in parallel. The measuring systems 801-1 to 801-3 each include a capacitor 802 and a transistor 803 to be measured. The measuring systems 801-1 to 801-3 each include transistors 804 to 806.

In each measuring system, a gate electrode of the transistor 803 is connected to a node supplied with a potential Vgb. A source electrode of the transistor 803 is connected to a node supplied with a potential Vb and a drain electrode of the transistor 803 is connected to a node A. A gate electrode of the transistor 804 is connected to a node supplied with a potential Vga. A source electrode of the transistor 804 is connected to the node A and a drain electrode of the transistor 804 is connected to a node supplied with a potential Va. A gate electrode and a drain electrode of the transistor 805 are connected to the node supplied with the potential Va. A gate electrode of the transistor 806 is connected to the node A and a source electrode of the transistor 806 is connected to the node supplied with the potential Vb. A source electrode of the transistor 805 and a drain electrode of the transistor 806 are connected to each other and potentials of these two electrodes are output from each measuring system as a potential Vout1, a potential Vout2, or a potential Vout3. One of a pair of electrodes of the capacitor 802 is connected to the node A and the other is connected to the node supplied with the potential Vb.

In addition, in Embodiment 3, the transistor 803 to be measured includes a highly-purified 30-nm-thick oxide semiconductor film and a 100-nm-thick gate insulating film. The channel formation region of the transistor 803 had a channel length L of 10 µm and a channel width W of 50 µm. In addition, the capacitances of the capacitors 802 included in the measuring systems were 100 fF, 1 pF, and 3 pF, respectively.

Initialization is performed before measurement. First, the potential Vgb has a level high enough to turn the transistor 803 on. Thus, the transistor 803 is turned on, and the node A is supplied with the potential Vb, that is, a low-level potential VSS. After that, the potential Vgb is made to have a level low enough to turn the transistor 803 off. Next, the potential Vga is made to have a level high enough to turn the transistor 804 on. Thus, the node A is supplied with the potential Va, that is, the high-level potential VDD, and the potential difference between the low-level potential VSS and the high-level potential VDD is applied between the pair of electrodes of the capacitor 802. After that, the potential Vga is made to have a level low enough to turn the transistor 804 off, so that the transistor 804 is turned off and the node A goes into a floating state.

Next, measuring operation is performed. When measurement is performed, the potential Va and the potential Vb are each made to have a level with which electric charge flows to and from the node A. In Embodiment 3, the potential Va and the potential Vb were the low-level potential VSS. Note that although the potential Va was temporarily the high-level potential VDD in timing of measuring the potential Vout, the potential Va and the potential Vb were kept at the low-level potential VSS except at the above timing.

Since the slight off-state current flow through the transistor 803, the amount of electric charge held in the node A is changed over time. In addition, since the potential of the node A is changed depending on the change of the amount of electric charge held in the node A, the levels of the potentials Vout1 to Vout3 were changed in accordance with the value of the off-state current of the transistor 803.

Specifically, in the measurement, the potential VDD was 5 V and the potential VSS was 0 V. The potentials Vout1 to Vout3 were measured as follows: the potential Va was basically the potential VSS and was changed to be the potential VDD for 100 msec at intervals of 10 sec to 300 sec.

Figure 19:
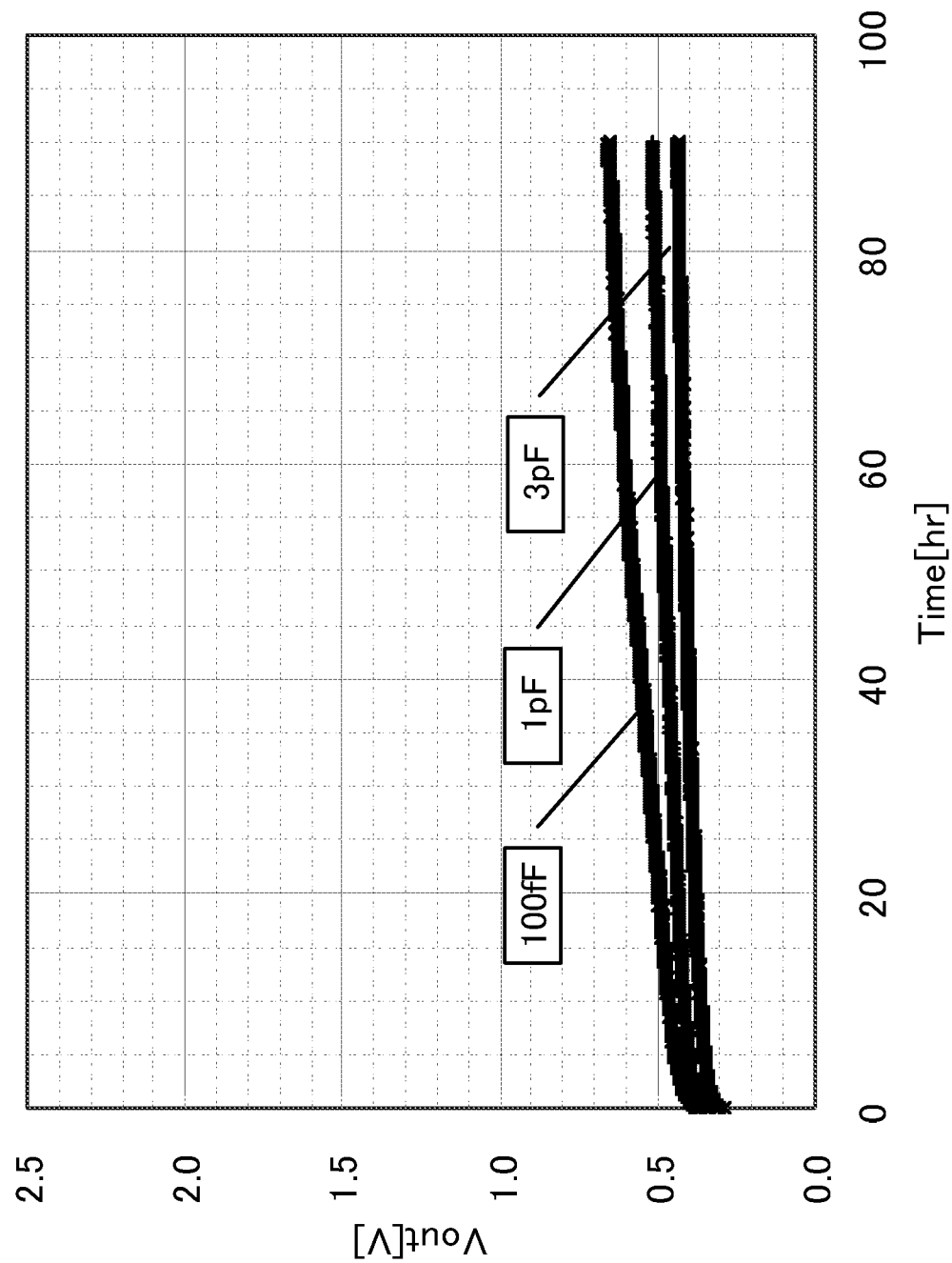
FIG. 19 shows a measurement result (a relation between passing time Time and an output potential Vout).

FIG. 19 illustrates the relation between elapsed time Time in measuring the current and the output potential Vout. The potential is changed after about 90 hours.

The relation between the potential $V_A$ of the node A and the output potential Vout is obtained in advance, whereby the potential $V_A$ of the node A can be obtained using the output potential Vout. In general, the potential $V_A$ of the node A can be expressed as a function of the output potential Vout by the following equation.

[FORMULA 5]

$$V_A = F(Vout)$$

Electric charge $Q_A$ of the node A can be expressed by the following equation by the use of the potential $V_A$ of the node A, capacitance $C_A$ connected to the node A, and a constant (const). Here, the capacitance $C_A$ connected to the node A is the sum of the capacitance of the capacitor 802 and other capacitances (e.g., the input capacitance of a circuit including the transistor 805 and the transistor 806).

[FORMULA 6]

$$Q_A = C_A V_A + \text{const}$$

Since a current $I_A$ of the node A is obtained by differentiating electric charge flowing to the node A (or electric charge flowing from the node A) with respect to time, the current $I_A$ of the node A is expressed by the following equation.

[FORMULA 7]

$$I \equiv \frac{\Delta Q_A}{\Delta t} = \frac{C_A \Delta F(Vout)}{\Delta t}$$

In this manner, the current $I_A$ of the node A can be obtained from the capacitance $C_A$ connected to the node A and the potentials Vout1 to Vout 3.

Figure 20:
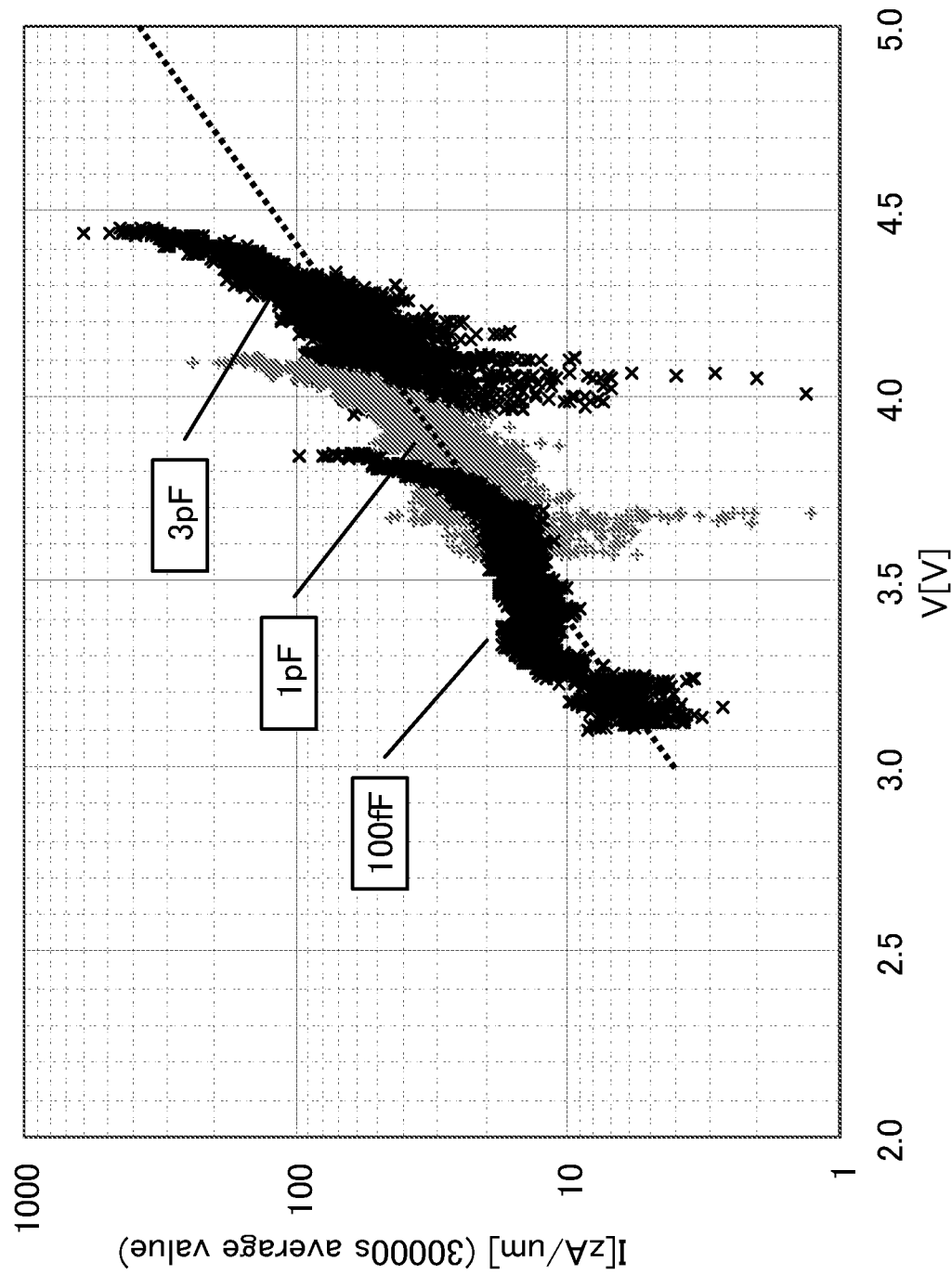
FIG. 20 shows a measurement result (a relation between source-drain voltage V and off-state current I).

FIG. 20 illustrates the off-state current which is calculated in the above measurement of the current. Further, At used when the current I flowing through the transistor 803 is about 30,000 seconds. Note that FIG. 20 illustrates the relation between off-state current I and voltage V between a source electrode and a drain electrode. According to FIG. 20, it is found that an off-state current is about 40 zA/μm, where voltage between the source electrode and the drain electrode is 4 V.

In this manner, the oxide semiconductor film is highly purified so that impurities such as moisture or hydrogen except a main component of the oxide semiconductor are contained as little as possible, whereby the operation of the transistor can be favorable.

This embodiment can be implemented by being combined as appropriate with any of the above-described embodiments.

Embodiment 4

In Embodiment 4, an example of a mobile memory medium which is one of semiconductor devices using memory devices according to one embodiment of the present invention will be described.

Figure 16A:
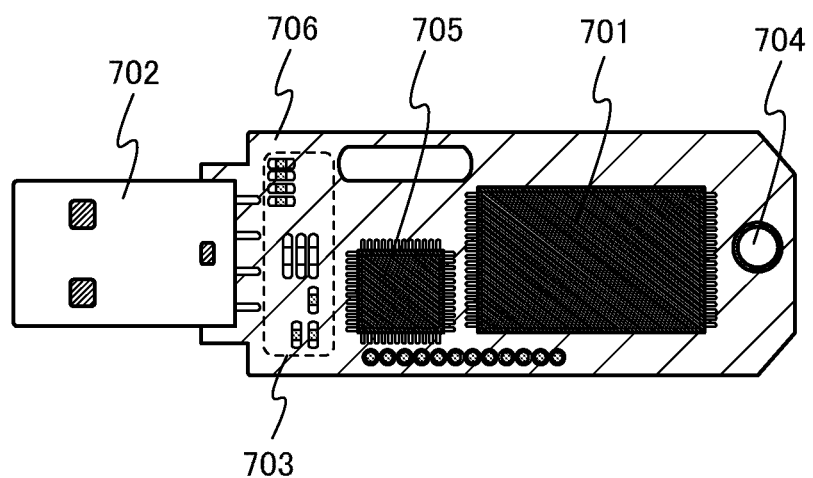
FIGS. 16A and 16B illustrate a structure of a memory medium.

FIG. 16A illustrates a structure of a memory medium according to one embodiment of the present invention, as an example. In the memory medium in FIG. 16A, the following components are mounted on a printed wiring board 706: a memory device 701 according to one embodiment of the present invention; a connector 702 which performs electrical connection between a driver circuit and the memory medium; an interface 703 which performs a signal process on each signal input or output through the connector 702 in accordance with the various signals; a light-emitting diode 704 which lights in accordance with operation of the memory medium or the like; and a controller 705 which controls operation of circuits and semiconductor elements in the memory medium such as the memory device 701, the interface 703, and the light-emitting diode 704. Further, a quartz oscillator which is used for generating a clock signal for controlling the operation of the controller 705, a regulator for controlling the level of the power supply voltage in the memory medium, or the like may additionally be provided.

Figure 16B:
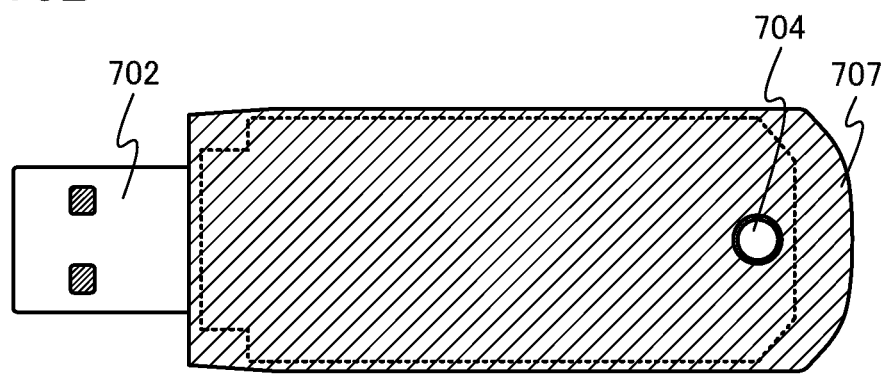

As illustrated in FIG. 16B, the printed wiring board 706 in FIG. 16A may be protected by being covered with a cover material 707 using resin or the like so as to expose part of the connector 702 and part of the light-emitting diode 704.

Since in the memory device 701 according to one embodiment of the present invention, power consumption in operation can be suppressed, reduction in power consumption of the memory medium using the memory device 701, and further, reduction in power consumption of a driving device connected to the memory medium can be realized. Further, since in the memory device 701 according to one embodiment of the present invention, data can be stored for a long time and the number of rewriting times can be increased, the reliability of the memory medium can be enhanced. Moreover, since data can be stored for a long time and the number of rewriting times can be increased, operation condition of the memory medium is eased; thus, the versatility of the memory medium can be improved.

This embodiment can be implemented by being combined as appropriate with any of the above-described embodiments.

EXAMPLE 1

By the use of a semiconductor device according to one embodiment of the present invention, a highly-reliable electronic device, an electronic device with low power consumption, and an electronic device with high-speed driving can be provided. In particular, in the case where a portable electronic device which has difficulty in continuously receiving power, an advantage in increasing the continuous duty period can be obtained when a semiconductor device with low power consumption according to one embodiment of the present invention is added as a component of the device.

Moreover, with the semiconductor device of the present invention, the heat treatment temperature in the manufacturing process can be suppressed; therefore, a highly reliable thin film transistor with excellent characteristics can be formed even when the thin film transistor is formed over a substrate formed using a flexible synthetic resin heat resistance of which is lower than that of glass, such as plastic. Accordingly, by the use of the manufacturing method according to one embodiment of the present invention, a highly reliable, lightweight, and flexible semiconductor device can be provided. Examples of a plastic substrate include polyester typified by polyethylene terephthalate (PET), polyethersulfone (PES), polyethylene naphthalate (PEN), polycarbonate (PC), polyetheretherketone (PEEK), polysulfone (PSF), polyetherimide (PEI), polyarylate (PAR), polybutylene terephthalate (PBT), polyimide, acrylonitrile-butadiene-styrene resin, polyvinyl chloride, polypropylene, polyvinyl acetate, acrylic resin, and the like.

The semiconductor device according to one embodiment of the present invention can be used for display devices, laptops, or image reproducing devices provided with recording media (typically, devices which reproduce the content of recording media such as digital versatile discs (DVDs) and have displays for displaying the reproduced images). Other than the above, as an electronic device which can use the semiconductor device according to one embodiment of the present invention, mobile phones, portable game machines, portable information terminals, e-book readers, video cameras, digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given. Specific examples of these electronic devices are illustrated in FIGS. 17A to 17C.

Figure 17A:
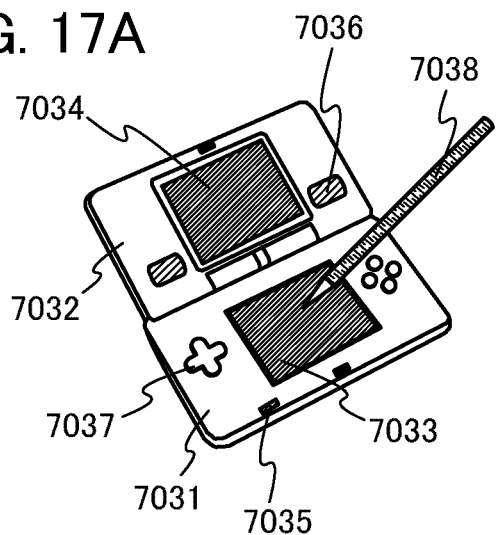
FIGS. 17A to 17C each illustrate a structure of an electronic device.

FIG. 17A illustrates a portable game machine including a housing 7031, a housing 7032, a display portion 7033, a display portion 7034, a microphone 7035, speakers 7036, an operation key 7037, a stylus 7038, and the like. The semiconductor device according to one embodiment of the present invention can also be used for an integrated circuit for controlling the driving of the portable game machine. The semiconductor device according to one embodiment of the present invention can be used for an integrated circuit for controlling driving of the portable game machine, so that a highly reliable portable game machine, a portable game machine with low power consumption, and a higher-performance portable game machine can be provided. Note that although the portable game machine illustrated in FIG. 17A includes two display portions 7033 and 7034, the number of display portions included in the portable game machine is not limited to two.

Figure 17B:
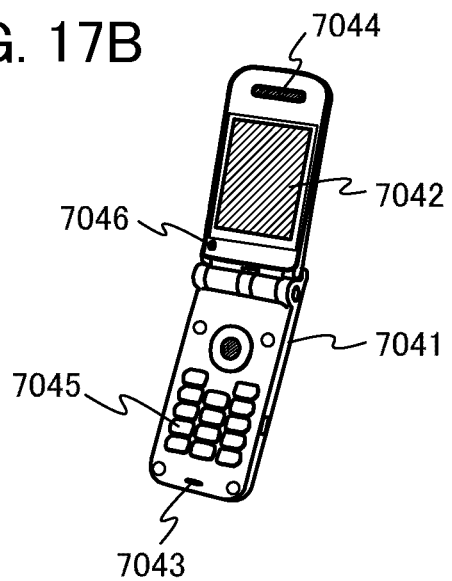

FIG. 17B illustrates a mobile phone including a housing 7041, a display portion 7042, an audio-input portion 7043, an audio-output portion 7044, operation keys 7045, a light-receiving portion 7046, and the like. Light received in the light-receiving portion 7046 is converted into electrical signals, whereby external images can be loaded. The semiconductor device according to one embodiment of the present invention can also be used for an integrated circuit for controlling the driving of the mobile phone. The semiconductor device according to one embodiment of the present invention can be used for an integrated circuit for controlling driving of the mobile phone, so that a highly reliable mobile phone, a mobile phone with low power consumption, and a higher-performance mobile phone can be provided.

Figure 17C:
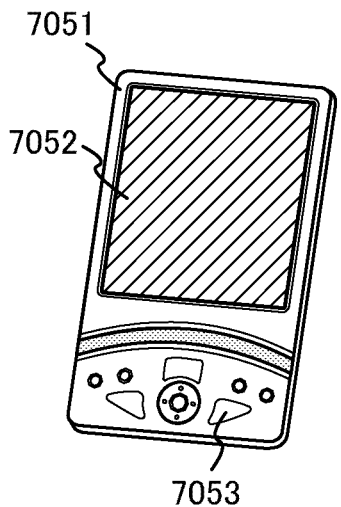

FIG. 17C illustrates a portable information terminal including a housing 7051, a display portion 7052, operation keys 7053, and the like. A modem may be incorporated in the housing 7051 of the portable information terminal illustrated in FIG. 17C. The semiconductor device according to one embodiment of the present invention can also be used for an integrated circuit for controlling the driving of the portable information terminal. The semiconductor device according to one embodiment of the present invention can be used for an integrated circuit for controlling driving of the portable information terminal, so that a highly reliable portable information terminal, a portable information terminal with low power consumption, and a higher-performance portable information terminal can be provided.

This embodiment can be implemented by being combined as appropriate with any of the above-described embodiments.

This application is based on Japanese Patent Application serial no. 2009-297140 filed with the Japan Patent Office on Dec. 28, 2009, the entire contents of which are hereby incorporated by reference.

The invention claimed is:

1. A manufacturing method of a semiconductor device, comprising:
    forming a gate electrode;
    forming a gate insulating film over the gate electrode;
    forming an oxide semiconductor film over the gate insulating film, the oxide semiconductor film comprising indium, gallium, and zinc;
    performing a first heat treatment after the oxide semiconductor film is formed at a temperature higher than or equal to 350° C. and lower than or equal to 850° C.;
    forming a source electrode and a drain electrode over the oxide semiconductor film;
    forming a first insulating film which comprises oxygen over the oxide semiconductor film, the source electrode, and the drain electrode; and
    performing a second heat treatment after the first insulating film is formed at a temperature higher than or equal to 200° C. and lower than or equal to 400° C.,
    wherein the oxide semiconductor film comprises a crystal whose c-axis is aligned perpendicular to an upper surface of the oxide semiconductor film.

2. The manufacturing method of the semiconductor device according to claim 1, wherein moisture or hydrogen in the oxide semiconductor film is reduced by the first heat treatment.

3. The manufacturing method of the semiconductor device according to claim 1, wherein oxygen is supplied to the oxide semiconductor film by the second heat treatment.

4. The manufacturing method of the semiconductor device according to claim 1, wherein the oxide semiconductor film is an intrinsic type (i-type) oxide semiconductor film or substantially i-type oxide semiconductor film after the second heat treatment is performed.

* * * * *